United States Patent
Pang et al.

(10) Patent No.: US 7,774,199 B2
(45) Date of Patent: Aug. 10, 2010

(54) SIGNAL PROCESSING USING PILOT BASED CODING

(75) Inventors: Hee Suk Pang, Seoul (KR); Hyen-O Oh, Goyang-si (KR); Dong Soo Kim, Seoul (KR); Jae Hyun Lim, Seoul (KR); Yang-Won Jung, Seoul (KR); Hyo Jin Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 30 days.

(21) Appl. No.: 12/089,091

(22) PCT Filed: Oct. 9, 2006

(86) PCT No.: PCT/KR2006/004031

§ 371 (c)(1),
(2), (4) Date: Apr. 3, 2008

(87) PCT Pub. No.: WO2007/040371

PCT Pub. Date: Apr. 12, 2007

(65) Prior Publication Data

US 2008/0262852 A1    Oct. 23, 2008

Related U.S. Application Data

(60) Provisional application No. 60/723,631, filed on Oct. 5, 2005, provisional application No. 60/725,654, filed on Oct. 13, 2005, provisional application No. 60/726,228, filed on Oct. 14, 2005, provisional application No. 60/729,713, filed on Oct. 25, 2005, provisional application No. 60/730,394, filed on Oct. 27, 2005, provisional application No. 60/730,393, filed on Oct. 27, 2005, provisional application No. 60/737,760, filed on Nov. 18, 2005, provisional application No. 60/752,911, filed on Dec. 23, 2005, provisional application No. 60/753,408, filed on Dec. 27, 2005, provisional application No. 60/758,238, filed on Jan. 12, 2006, provisional application No. 60/758,231, filed on Jan. 12, 2006.

(30) Foreign Application Priority Data

| Jan. 13, 2006 | (KR) | 10-2006-0004049 |
| Jan. 13, 2006 | (KR) | 10-2006-0004050 |
| Apr. 4, 2006 | (KR) | 10-2006-0030651 |
| Aug. 23, 2006 | (KR) | 10-2006-0079836 |
| Aug. 23, 2006 | (KR) | 10-2006-0079837 |
| Aug. 23, 2006 | (KR) | 10-2006-0079838 |

(51) Int. Cl.
*G10L 11/04* (2006.01)

(52) U.S. Cl. .................................... 704/206

(58) Field of Classification Search ............... 704/206, 704/500–504

See application file for complete search history.

(56) References Cited

U.S. PATENT DOCUMENTS 4,621,862 A    11/1986    Kramer (Continued)

FOREIGN PATENT DOCUMENTS

AU    2006297950 B2    10/2009

(Continued)

OTHER PUBLICATIONS

Breebaart, J., et al., AES Convention Paper, "MPEG Spatial Audio Coding/MPEG Surround: Overview and Current Status", 2005, 17 pages.

(Continued)

*Primary Examiner*—Michael N Opsasnick
(74) *Attorney, Agent, or Firm*—Fish & Richardson P.C.

(57) ABSTRACT

An apparatus for processing a signal and method thereof are disclosed. Data coding and entropy coding are performed with interconnection, and grouping is used to enhance coding efficiency. The present invention includes the steps of obtaining a difference value and index information and entropy-decoding the index information and identifying an entropy table corresponding to the entropy-decoded index information and entropy-decoding the difference value using the identified entropy table and obtaining data using a reference value corresponding to a plurality of data and the decoded difference value.

14 Claims, 24 Drawing Sheets

U.S. PATENT DOCUMENTS

| | | | |
|---|---|---|---|
| 4,661,862 A | 4/1987 | Thompson | |
| 4,677,671 A | 6/1987 | Galand et al. | |
| 4,725,885 A | 2/1988 | Gonzales et al. | |
| 4,907,081 A | 3/1990 | Okamura et al. | |
| 5,231,485 A | 7/1993 | Israelsen et al. | |
| 5,243,686 A | 9/1993 | Tokuda | |
| 5,481,643 A | 1/1996 | Ten Kate et al. | |
| 5,515,296 A * | 5/1996 | Agarwal | 709/204 |
| 5,528,628 A | 6/1996 | Park | |
| 5,530,750 A * | 6/1996 | Akagiri | 704/500 |
| 5,563,661 A | 10/1996 | Takahashi et al. | |
| 5,579,430 A * | 11/1996 | Grill et al. | 704/203 |
| 5,606,618 A | 2/1997 | Lokhoff et al. | |
| 5,621,856 A | 4/1997 | Akagiri | |
| 5,640,159 A | 6/1997 | Furlan et al. | |
| 5,682,461 A | 10/1997 | Silzle et al. | |
| 5,687,157 A * | 11/1997 | Imai et al. | 369/59.16 |
| 5,890,125 A | 3/1999 | Davis et al. | |
| 5,912,636 A | 6/1999 | Gormish et al. | |
| 5,945,930 A | 8/1999 | Kajiwara | |
| 5,966,688 A | 10/1999 | Nandkumar | |
| 5,974,380 A | 10/1999 | Smyth et al. | |
| 6,021,386 A | 2/2000 | Davis et al. | |
| 6,121,904 A | 9/2000 | Levine | |
| 6,125,398 A * | 9/2000 | Mirashrafi et al. | 709/236 |
| 6,134,518 A | 10/2000 | Cohen et al. | |
| 6,148,283 A | 11/2000 | Das | |
| 6,208,276 B1 | 3/2001 | Snyder | |
| 6,295,319 B1 | 9/2001 | Sueyoshi et al. | |
| 6,309,424 B1 | 10/2001 | Fallon | |
| 6,384,759 B2 | 5/2002 | Snyder | |
| 6,399,760 B1 | 6/2002 | Gimeno | |
| 6,421,467 B1 | 7/2002 | Mitra | |
| 6,442,110 B1 | 8/2002 | Yamamoto | |
| 6,453,120 B1 | 9/2002 | Takahashi et al. | |
| 6,456,966 B1 | 9/2002 | Iwabuchi | |
| 6,556,685 B1 | 4/2003 | Urry et al. | |
| 6,560,404 B1 | 5/2003 | Okada | |
| 6,611,212 B1 | 8/2003 | Craven et al. | |
| 6,625,574 B1 | 9/2003 | Taniguchi et al. | |
| 6,631,352 B1 | 10/2003 | Fujita et al. | |
| 6,636,830 B1 * | 10/2003 | Princen et al. | 704/204 |
| 7,376,555 B2 | 5/2008 | Schuijers | |
| 7,392,176 B2 | 6/2008 | Nishio et al. | |
| 7,394,903 B2 | 7/2008 | Herre | |
| 7,519,538 B2 | 4/2009 | Villemoes et al. | |
| 7,539,612 B2 | 5/2009 | Thumpudi et al. | |
| 2001/0055302 A1 | 12/2001 | Taylor | |
| 2002/0049586 A1 | 4/2002 | Nishio | |
| 2002/0106019 A1 | 8/2002 | Chaddha | |
| 2003/0009325 A1 | 1/2003 | Kirchherr et al. | |
| 2003/0016876 A1 | 1/2003 | Chai et al. | |
| 2003/0138157 A1 | 7/2003 | Schwartz | |
| 2003/0195742 A1 | 10/2003 | Tsushima | |
| 2003/0236583 A1 | 12/2003 | Baumgarte et al. | |
| 2004/0049379 A1 * | 3/2004 | Thumpudi et al. | 704/205 |
| 2004/0057523 A1 | 3/2004 | Koto | |
| 2004/0138895 A1 | 7/2004 | Lokhoff et al. | |
| 2004/0186735 A1 | 9/2004 | Ferris et al. | |
| 2004/0199276 A1 | 10/2004 | Poon | |
| 2004/0247035 A1 | 12/2004 | Schroder | |
| 2005/0058304 A1 | 3/2005 | Baumgarte et al. | |
| 2005/0074127 A1 | 4/2005 | Herre et al. | |
| 2005/0074135 A1 | 4/2005 | Kushibe | |
| 2005/0091051 A1 | 4/2005 | Moriya et al. | |
| 2005/0114126 A1 | 5/2005 | Geiger et al. | |
| 2005/0137729 A1 | 6/2005 | Sakurai et al. | |
| 2005/0157883 A1 | 7/2005 | Herre | |
| 2005/0174269 A1 | 8/2005 | Sherigar et al. | |
| 2005/0216262 A1 | 9/2005 | Fejzo | |
| 2006/0023577 A1 | 2/2006 | Shinoda | |
| 2006/0085200 A1 | 4/2006 | Allamanche | |
| 2006/0190247 A1 | 8/2006 | Lindblom | |
| 2006/0215918 A1 | 9/2006 | Kimura | |
| 2007/0038439 A1 | 2/2007 | Schuijers | |
| 2007/0150267 A1 | 6/2007 | Honma | |
| 2009/0185751 A1 | 7/2009 | Kudo | |

FOREIGN PATENT DOCUMENTS

| | | |
|---|---|---|
| CN | 1198613 C | 4/2005 |
| CN | 1655651 | 8/2005 |
| DE | 697 12 383 T2 | 1/2003 |
| EP | 372601 | 6/1990 |
| EP | 599825 | 6/1994 |
| EP | 0 610 975 | 8/1994 |
| EP | 0 610 975 A2 | 8/1994 |
| EP | 827312 | 3/1998 |
| EP | 948141 | 10/1999 |
| EP | 957639 | 11/1999 |
| EP | 1 001 549 | 5/2000 |
| EP | 1 047 198 A2 | 10/2000 |
| EP | 893791 B1 | 7/2002 |
| EP | 1376538 | 1/2004 |
| EP | 1396843 | 3/2004 |
| EP | 1530200 | 5/2005 |
| EP | 1 869 774 A0 | 12/2007 |
| EP | 1 905 005 A0 | 4/2008 |
| GB | 2238445 | 5/1991 |
| GB | 2340351 | 2/2002 |
| JP | 60-096079 | 5/1985 |
| JP | 62-094090 | 4/1987 |
| JP | 09-275544 | 10/1997 |
| JP | 11-205153 | 7/1999 |
| JP | 2001-188578 | 7/2001 |
| JP | 2001-53617 | 9/2002 |
| JP | 2002-328699 | 11/2002 |
| JP | 2002-335230 | 11/2002 |
| JP | 2003-005797 | 1/2003 |
| JP | 2003-233395 | 8/2003 |
| JP | 2003-233395 A | 8/2003 |
| JP | 2004-170610 | 6/2004 |
| JP | 2004-220743 | 8/2004 |
| JP | 2004-535145 | 11/2004 |
| JP | 2005-63655 | 3/2005 |
| JP | 2005-332449 | 12/2005 |
| JP | 2006-120247 | 5/2006 |
| KR | 1997-0014387 | 3/1997 |
| KR | 2001-0001991 | 5/2001 |
| KR | 2003-0043620 | 6/2003 |
| KR | 2003-0043622 | 6/2003 |
| RU | 2158970 | 11/2000 |
| RU | 2 214 048 C2 | 10/2003 |
| RU | 2221329 | 1/2004 |
| RU | 2005103637 | 7/2005 |
| TW | 204406 | 4/1993 |
| TW | 289885 | 11/1996 |
| TW | 317064 | 10/1997 |
| TW | 360860 | 6/1999 |
| TW | 378478 | 1/2000 |
| TW | 384618 | 3/2000 |
| TW | 405328 | 9/2000 |
| TW | 550541 | 9/2003 |
| TW | 567466 | 12/2003 |
| TW | 569550 | 1/2004 |
| TW | 200404222 | 3/2004 |
| TW | 200405673 | 4/2004 |
| TW | M257575 | 2/2005 |
| TW | 1230530 | 4/2005 |
| WO | WO 93/15502 | 8/1993 |
| WO | WO 95/27337 | 10/1995 |
| WO | WO 97/15983 | 5/1997 |
| WO | 97/40630 | 10/1997 |
| WO | WO 99/18569 A1 | 4/1999 |

| | | |
|---|---|---|
| WO | 99/52326 | 10/1999 |
| WO | WO 99/56470 | 11/1999 |
| WO | 00/02357 | 1/2000 |
| WO | 00/60746 | 10/2000 |
| WO | WO 00/79520 | 12/2000 |
| WO | WO 01/65544 | 9/2001 |
| WO | 03/007656 | 1/2003 |
| WO | WO 03/046889 | 6/2003 |
| WO | 03/090028 | 10/2003 |
| WO | 03/090206 | 10/2003 |
| WO | 03/090207 | 10/2003 |
| WO | WO 03-088212 | 10/2003 |
| WO | WO 03/088212 A1 | 10/2003 |
| WO | 2004/008806 | 1/2004 |
| WO | 2004/028142 | 4/2004 |
| WO | WO 2004/072956 | 8/2004 |
| WO | 2004/080125 | 9/2004 |
| WO | WO 2004/093495 | 10/2004 |
| WO | WO2004090864 B1 | 10/2004 |
| WO | WO 2005/043511 | 5/2005 |
| WO | 2005/059899 | 6/2005 |
| WO | WO 2006/048226 | 5/2006 |
| WO | WO 2006/108464 | 10/2006 |
| WO | WO 2007/011115 | 1/2007 |
| WO | 2007/040354 | 4/2007 |

OTHER PUBLICATIONS

Bessette B, et al.: Universal Speech/Audio Coding Using Hybrid ACELP/TCX Techniques, 2005, 4 pages ; p. 301-304.
Boltze Th. et al.; "Audio services and applications." In: Digital Audio Broadcasting. Edited by Hoeg, W. and Lauferback, Th. ISBN 0-470-85013-2. John Wiley & Sons Ltd., 2003. pp. 75-83.
Breebaart, J., AES Convention Paper 'MPEG Spatial audio coding/ MPEG surround: Overview and Current Status', 119th Convention, Oct. 7-10, 2005, New York, New York, 17 pages, p. 1-17.
Chou, J. et al.: Audio Data Hiding with Application to Surround Sound, 2003, 4 pages, p. 337-341.
Faller C., et al.: Binaural Cue Coding—Part II: Schemes and Applications, 2003 12 pages, IEEE Transactions on Speech and Audio Processing, vol. 11, No. 6, p. 520-531.
Faller C.: Parametric Coding of Spatial Audio. Doctoral thesis No. 3062, 2004, 6 pages, p. 151-156.
Faller, C: "Coding of Spatial Audio Compatible with Different Playback Formats", Audio Engineering Society Convention Paper, 2004, 12 pages, San Francisco, CA., p. 1-12.
Hamdy K.N., et al.: Low Bit Rate High Quality Audio Coding with Combined Harmonic and Wavelet Representations, 1996, 4 pages, p. 1045-1048.
Heping, D.,: Wideband Audio Over Narrowband Low-Resolution Media, 2004, 4 pages, p. 489-492.
Herre, J. et al.: MP3 Surround: Efficient and Compatible Coding of Multi-channel Audio, 2004, 14 pages, p. 1-14.
Herre, J. et al: The Reference Model Architecture for MPEG Spatial Audio Coding, 2005, 13 pages, Audio Engineering Society Convention Paper, p. 1-13.
Hosoi S., et al.: Audio Coding Using the Best Level Wavelet Packet Transform and Auditory Masking, 1998, 4 pages, p. 1138-1141.
International Search Report corresponding to International Application No. PCT/KR2006/002018 dated Oct. 16, 2006, 1 page.
International Search Report corresponding to International Application No. PCT/KR2006/002019 dated Oct. 16, 2006, 1 page.
International Search Report corresponding to International Application No. PCT/KR2006/002020 dated Oct. 16, 2006, 2 pages.
International Search Report corresponding to International Application No. PCT/KR2006/002021 dated Oct. 16, 2006, 1 page.
International Search Report corresponding to International Application No. PCT/KR2006/002575, dated Jan. 12, 2007, 2 pages.
International Search Report corresponding to International Application No. PCT/KR2006/002578, dated Jan. 12, 2007, 2 pages.
International Search Report corresponding to International Application No. PCT/KR2006/002579, dated Nov. 24, 2006, 1 page.
International Search Report corresponding to International Application No. PCT/KR2006/002581, dated Nov. 24, 2006, 2 pages.
International Search Report corresponding to International Application No. PCT/KR2006/002583, dated Nov. 24, 2006, 2 pages.
International Search Report corresponding to International Application No. PCT/KR2006/003420, dated Jan. 18, 2007, 2 pages.
International Search Report corresponding to International Application No. PCT/KR2006/003424, dated Jan. 31, 2007, 2 pages.
International Search Report corresponding to International Application No. PCT/KR2006/003426, dated Jan. 18, 2007, 2 pages.
International Search Report corresponding to International Application No. PCT/KR2006/003435, dated Dec. 13, 2006, 1 page.
International Search Report corresponding to International Application No. PCT/KR2006/003975, dated Mar. 13, 2007, 2 pages.
International Search Report corresponding to International Application No. PCT/KR2006/004014, dated Jan. 24, 2007, 1 page.
International Search Report corresponding to International Application No. PCT/KR2006/004017, dated Jan. 24, 2007, 1 page.
International Search Report corresponding to International Application No. PCT/KR2006/004020, dated Jan. 24, 2007, 1 page.
International Search Report corresponding to International Application No. PCT/KR2006/004024, dated Jan. 29, 2007, 1 page.
International Search Report corresponding to International Application No. PCT/KR2006/004025, dated Jan. 29, 2007, 1 page.
International Search Report corresponding to International Application No. PCT/KR2006/004027, dated Jan. 29, 2007, 1 page.
International Search Report corresponding to International Application No. PCT/KR2006/004032, dated Jan. 24, 2007, 1 page.
International Search Report in corresponding International Application No. PCT/KR2006/004023, dated Jan. 23, 2007, 1 page.
ISO/IEC 13818-2, Generic Coding of Moving Pictures and Associated Audio, Nov. 1993,Seoul, Korea.
ISO/IEC 14496-3 Information Technology—Coding of Audio-Visual Objects—Part 3: Audio, Second Edition (ISO/IEC), 2001.
Jibra A., et al.: Multi-layer Scalable LPC Audio Format; ISACS 2000, 4 pages, IEEE International Symposium on Circuits and Systems, p. 219-222.
Jin C, et al.: Individualization in Spatial-Audio Coding, 2003, 4 pages, IEEE Workshop on Applications of Signal Processing to Audio and Acoustics, pp. 213-216.
Kostantinides K: An introduction to Super Audio CD and DVD-Audio, 2003, 12 pages, IEEE Signal Processing Magazine, p. 71-82.
Liebchem, T.; Reznik, Y.A.: MPEG-4: an Emerging Standard for Lossless Audio Coding, 2004, 10 pages, Proceedings of the Data Compression Conference.
Ming, L.: A novel random access approach for MPEG-1 multicast applications, 2001, 5 pages.
Moon, Han-gil, et al.: A Multi-Channel Audio Compression Method with Virtual Source Location Information for MPEG-4 SAC, IEEE 2005, 7 pages.
Moriya T., et al.,: A Design of Lossless Compression for High-Quality Audio Signals, 2004, 4 pages.
Notice of Allowance dated Aug. 25, 2008 by the Korean Patent Office for counterpart Korean Appln. Nos. 2008-7005851, 7005852; and 7005858.
Notice of Allowance dated Dec. 26, 2008 by the Korean Patent Office for counterpart Korean Appln. Nos. 2008-7005836, 7005838, 7005839, and 7005840.
Notice of Allowance dated Jan. 13, 2009 by the Korean Patent Office for a counterpart Korean Appln. No. 2008-7005992.
Office Action dated Jul. 21, 2008 issued by the Taiwan Patent Office, 16 pages.
Oh, E., et al.: Proposed changes in MPEG-4 BSAC multi channel audio coding, 2004, 7 pages, International Organisation for Standardisation.
Pang, H., et al., "Extended Pilot-Based Codling for Lossless Bit Rate Reduction of MPEG Surround", ETRI Journal, vol. 29, No. 1, Feb. 2007.
Puri, A., et al.: MPEG-4: An object-based multimedia coding standard supporting mobile applications, 1998, 28 pages, Baltzer Science Publishers BV.

Said, A.: On the Reduction of Entropy Coding Complexity via Symbol Grouping: I—Redundancy Analysis and Optimal Alphabet Partition, 2004, 42 pages, Hewlett-Packard Company.

Schroeder E F et al: DER MPEG-2Standard: Generische Codierung fur Bewegtbilder und zugehorige Audio-Information, 1994, 5 pages.

Schuijers, E. et al: Low Complexity Parametric Stereo Coding, 2004, 6 pages, Audio Engineering Society Convention Paper 6073.

Stoll, G.: MPEG audio Layer II: A Generic Coding Standard for Two and multichannel Sound for DVB, DAB and Computer Multimedia, 1995, 9 pages, International Broadcasting Convention, XP006528918.

Supplementary European Search Report corresponding to Application No. EP06747465, dated Oct. 10, 2008, 8 pages.

Supplementary European Search Report corresponding to Application No. EP06747467, dated Oct. 10, 2008, 8 pages.

Supplementary European Search Report corresponding to Application No. EP06757755, dated Aug. 1, 2008, 1 page.

Supplementary European Search Report corresponding to Application No. EP06843795, dated Aug. 7, 2008, 1 page.

Ten Kate W. R. Th., et al.: A New Surround-Stereo-Surround Coding Technique, 1992, 8 pages, J. Audio Engineering Society, XP002498277.

Voros P.: High-quality Sound Coding within 2x64 kbit/s Using Instantaneous Dynamic Bit-Allocation, 1988, 4 pages.

Webb J., et al.: Video and Audio Coding for Mobile Applications, 2002, 8 pages, The Application of Programmable DSPs in Mobile Communications.

Notice of Allowance, dated Feb. 27, 2009, issued in counterpart Korean Application Serial No. 08-7007453 (no English translation available).

"Text of second working draft for MPEG Surround", ISO/IEC JTC 1/SC 29/WG 11, No. N7387, No. N7387, Jul. 29, 2005, 140 pages.

Deputy Chief of the Electrical and Radio Engineering Department Makhotna, S.V., Russian Decision on Grant Patent for Russian Patent Application No. 2008112226 dated Jun. 5, 2009, and its translation, 15 pages.

European Examiner Chetry, Nicolas, Extended European search report for European Patent Application No. 06799105.9 dated Apr. 28, 2009, 11 pages.

European Examiner Ramos Sanchez, U., Supplementary European Search Report for European Patent Application No. 06799058 dated Jun. 16, 2009, 6 pages.

European Examiner Ramos Sanchez, U., Supplementary European Search Report for European Patent Application No. 06757751 dated Jun. 8, 2009, 5 pages.

Herre, J. et al., "Overview of MPEG-4 audio and its applications in mobile communication", Communication Technology Proceedings, 2000. WCC—ICCT 2000. International Confrence on Beijing, China held Aug. 21-25, 2000, Piscataway, NJ, USA, IEEE, US, vol. 1 (Aug. 21, 2008), pp. 604-613.

Oh, H-O et al., "Proposed core experiment on pilot-based coding of spatial parameters for MPEG surround", ISO/IEC JTC 1/SC 29/WG 11, No. M12549, Oct. 13, 2005, 18 pages.

Pang, H-S, "Clipping Prevention Scheme for MPEG Surround", ETRI Journal, vol. 30, No. 4 (Aug. 1, 2008), pp. 606-608.

Quackenbush, S. R. et al., "Noiseless coding of quantized spectral components in MPEG-2 Advanced Audio Coding", Application of Signal Processing to Audio and Acoustics, 1997. 1997 IEEE ASSP Workshop on New Paltz, NY, US held on Oct. 19-22, 1997, New York, NY, US, IEEE, US, (Oct. 19, 1997), 4 pages.

Russian Decision on Grant Patent for Russian Patent Application No. 2008103314 dated Apr. 27, 2009, and its translation, 11 pages.

USPTO Non-Final Office Action in U.S. Appl. No. 12/088,868, mailed Apr. 1, 2009, 11 pages.

USPTO Non-Final Office Action in U.S. Appl. No. 12/088,872, mailed Apr. 7, 2009, 9 pages.

USPTO Non-Final Office Action in U.S. Appl. No. 12/089,383, mailed Jun. 25, 2009, 5 pages.

USPTO Non-Final Office Action in U.S. Appl. No. 11/540,920, mailed Jun. 2, 2009, 8 pages.

USPTO Non-Final Office Action in U.S. Appl. No. 12/089,105, mailed Apr. 20, 2009, 5 pages.

USPTO Non-Final Office Action in U.S. Appl. No. 12/089,093, mailed Jun. 16, 2009, 10 pages.

Ehrer A., et al; "Audio Coding Technology of Exac"; Intelligent Multimedia, Video and Speech, Processing, proceedings of 2004, International Symposium on Hong Kong, China, Oct. 20-22, 2004, Piscataway, NJ, IEEE, Oct. 20, 2004, pp. 290-293, XP010801441.

European Search Report dated Jul. 10, 2009 for Application No. 06799111.7, 12 pages.

European Search Report dated Jul. 20, 2009 for Application No. 06799113.3, 10 pages.

Taiwan Office Action dated Jul. 14, 2009 for Application No. 095136564 (English Language Translation), 5 pages.

Taiwan Notice of Allowance dated Jul. 20, 2009 for Application No. 095124112 (English Language Translation), 8 pages.

Tewfik A. H., et al; "Enhanced Wavelet Base Audio Coder"; Signals, Systems And Computers, 1993, Conference Record of the 27$^{th}$ Asilomar Conference on Pacific Grove, Nov. 1-3, 1993, IEEE COMPUT. SOC, Nov. 1, 1993, pp. 896-900, XP010096271.

U.S. Office Action dated Aug. 3, 2009 for U.S. Appl. No. 11/513,834, 25 pages.

Taiwan Notice of the Allowance dated Apr. 13, 2009 for Application No. 095136566, 6 pages.

Taiwan Office Action dated Jul. 14, 2009 for Application No. 095136561, 7 pages.

US Notice of the Allowance dated Sep. 25, 2009 for U.S. Appl. No. 11/540,920, 7 pages.

Japanese Final Office Action dated Nov. 19, 2009 for Application. No. 2008-534446, 2 pages.

Indonesian Office Action dated Nov. 2, 2009 for Application No. W-00200801084, 2 pages.

Ehrer A et al, "Audio Coding Technology of ExAC", Oct. 20, 2004, pp. 290-293, XP010801441.

European Search Report dated Jul. 10, 2009 for Application No. 6799111.7, 12 pages.

European Search Report dated Jul. 20, 2009 for Application No. 6799113.3, 10 pages.

International Search Report dated Jan. 25, 2007 for Application No. PCT/KR2006/004332, 3 pages.

Korean Notice of Allowance dated Jan. 13, 2009 for Application No. 10-2008-7005993, 3 pages, (Non-English language).

Russian Notice of Allowance dated Sep. 11, 2009 for Application No. 2008112174, 13 pages.

Taiwan Office Action dated Jul. 21, 2008 for Application No. 95124113, 13 pages.

Taiwan Notice of Allowance Sep. 18, 2008 for Application No. 95124070, 7 pages.

Taiwanese Notice of Allowance dated Jul. 20, 2009 For Application No. 95124112, 5 pages.

Tewfik A H et al; "Enhanced Wavelet Based Audio Coder" Nov. 1, 1993, pp. 896-900, XP010096271.

European Search Report dated Aug. 24, 2009 Application No. 06799107.5, 6 pages.

European Search Report dated Aug. 24, 2009 Application No. 06799108.3, 7 pages.

Marina Bosi, et al., "ISO/IEC MPEG-2 Advanced Audio Coding", J. Audio Eng. Soc., vol. 45, No. 10, Oct. 1997, XP000730161, p. 789-812.

J. Herre, et al., "The Reference Model Architecture for MPEG Spatial Audio Coding", Audio Engineering Society Convention Paper 6447, May 28-31, 2005, XP009059973, 13 pages.

Gerald D. T. Schuller, et al., "Perceptual Audio Coding Using Adaptive Pre-and Post-Filters and Lossless Compression", IEEE Transactions on Speech and Audio Processing, vol. 10, No. 6, Sep. 2002, XP011079662, p. 379-390.

U.S. Notice of Allowance dated Sep. 8, 2009 for U.S. Appl. No. 12/089,098, 8 pages.

U.S. Office Action Office dated Sep. 9, 2009 for U.S. Appl. No. 11/514,302, 16 pages.

Supplementary European Search Report for Application No. 06799096.0 dated Dec. 15, 2009, 6 pages.

Supplementary European Search Report for Application No. 06799098.6 dated Dec. 15, 2009, 9 pages.
USPTO Final Office Action in U.S. Appl. No. 12/089,093, mailed Jan. 13, 2010, 19 pages.
European Search Report for Application No. 06799097.8, dated Feb. 15, 2010, 4 pages.
Chinese Office Action for Application No. 2006800372830 dated Feb. 5, 2010, 10 pages.
Office Action for U.S. Appl. No. 12/089,368 dated Apr. 26, 2010, 9 pages.

* cited by examiner

SIGNAL PROCESSING USING PILOT BASED CODING

TECHNICAL FIELD

The present invention relates to an apparatus for processing a signal and method thereof, and more particularly, to an apparatus for coding data and method thereof.

BACKGROUND ART

Generally, many techniques for signal compression and recovery have been introduced so far. And, applicable targets of the corresponding techniques are various data including audio data, video data and the like. Moreover, the signal compression or recovery techniques evolve in a direction to enhancing audio or video quality with high compression rates. Besides, many efforts have been made to raise transmission efficiency for adaptation to various communication environments.

However, it is still believed that there exists a margin for the enhancement of the transmission efficiency. So, many efforts need to be made to maximize transmission efficiency of signals in the very complicated communication environments through the development of new processing schemes for signals.

DISCLOSURE OF THE INVENTION

Accordingly, the present invention is directed to an apparatus for processing a signal and method thereof that substantially obviate one or more of the problems due to limitations and disadvantages of the related art.

An object of the present invention is to provide an apparatus for processing a signal and method thereof, by which transmission efficiency of signals can be optimized.

Another object of the present invention is to provide an apparatus for coding data and method thereof, by which data can be efficiently coded.

Another object of the present invention is to provide an apparatus for encoding/decoding data and method thereof, by which transmission efficiency of control data used for audio recovery can be maximized.

Another object of the present invention is to provide a medium including encoded data.

Another object of the present invention is to provide a data structure, by which encoded data can be efficiently transferred.

A further object of the present invention is to provide a system including the decoding apparatus.

To achieve these and other advantages and in accordance with the purpose of the present invention, as embodied and broadly described, a method of processing a signal according to one embodiment of the present invention includes the steps of obtaining a difference value and index information and entropy-decoding the index information and identifying an entropy table corresponding to the entropy-decoded index information and entropy-decoding the difference value using the identified entropy table and obtaining data using a reference value corresponding to a plurality of data and the decoded difference value. The reference value may be a pilot reference value or a difference reference value. The index information is entropy-decoded using an index dedicated entropy table. The entropy table is classified according to a type of each of a plurality of the data.

The data is a parameter and wherein the method further includes the step of reconstructing an audio signal using the parameter. In the step of entropy-decoding the difference value, a 2-dimensional entropy decoding is performed on the difference value using the entropy table.

The method further includes the steps of obtaining the reference value; and entropy-decoding the reference value using the entropy table dedicated to the reference value.

To achieve these and other advantages and in accordance with the purpose of the present invention, an apparatus for processing a signal includes an inputting part obtaining a difference value and index information and an index decoding part entropy-decoding the index information and a table identifying part identifying an entropy table corresponding to the entropy-decoded index information and a data decoding part entropy-decoding the difference value using the identified entropy table and a data obtaining part obtaining data using a reference value corresponding to a plurality of data and the decoded difference value.

To achieve these and other advantages and in accordance with the purpose of the present invention, a method of processing a signal includes the steps of generating a difference value using a reference value corresponding to a plurality of data and the data and entropy-encoding the difference value using an entropy table and generating index information to identify the entropy table and entropy-encoding the index information and transferring the entropy-encoded index information and the difference value.

To achieve these and other advantages and in accordance with the purpose of the present invention, an apparatus for processing a signal includes a value generating part generating a difference value using a reference value corresponding to a plurality of data and the data and a value encoding part entropy-encoding the difference value using an entropy table and an information generating part generating index information to identify the entropy table and an index encoding part entropy-encoding the index information and an information outputting part transferring the entropy-encoded index information and the difference value.

ADVANTAGEOUS EFFECTS

Accordingly, the present invention enables efficient data coding and entropy coding, thereby enabling data compression and recovery with high transmission efficiency.

BEST MODE FOR CARRYING OUT THE INVENTION

Reference will now be made in detail to the preferred embodiments of the present invention, examples of which are illustrated in the accompanying drawings.

General terminologies used currently and globally are selected as terminologies used in the present invention. And, there are terminologies arbitrarily selected by the applicant for special cases, for which detailed meanings are explained in detail in the description of the preferred embodiments of the present invention. Hence, the present invention should be understood not with the names of the terminologies but with the meanings of the terminologies.

In the present invention, a meaning of 'coding' includes an encoding process and a decoding process. Yet, it is apparent to those skilled in the art that a specific coding process is applicable to an encoding or decoding process only, which will be discriminated in the following description of a corresponding part. And, the 'coding' can be named 'codec' as well.

In the present invention, steps of coding a signal shall be explained by being divided into data coding and entropy coding. Yet, correlation exits between the data coding and the entropy coding, which shall be explained in detail later.

In the present invention, various methods of grouping data to efficiently perform data coding and entropy coding shall be explained. A grouping method has independently effective technical idea regardless of specific data or entropy coding schemes.

In the present invention, an audio coding scheme (e.g., 'ISO/IEC 23003, MPEG Surround') having spatial information will be explained as a detailed example that adopts data coding and entropy coding.

Figure 1:
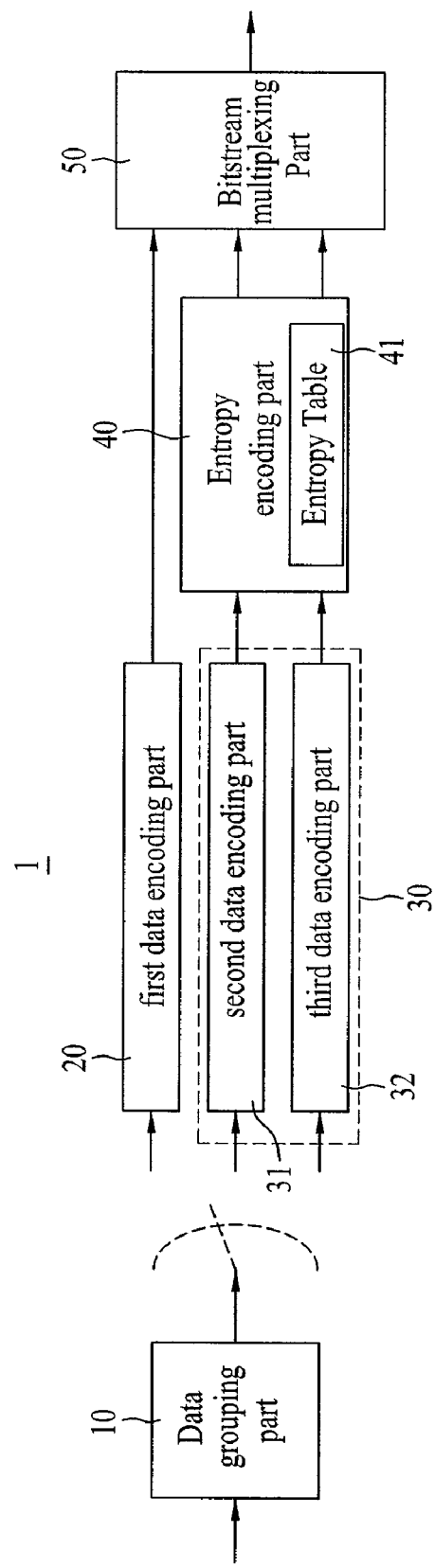
FIGS. 1 and 2 are block diagrams of a system according to the present invention.
Figure 2:
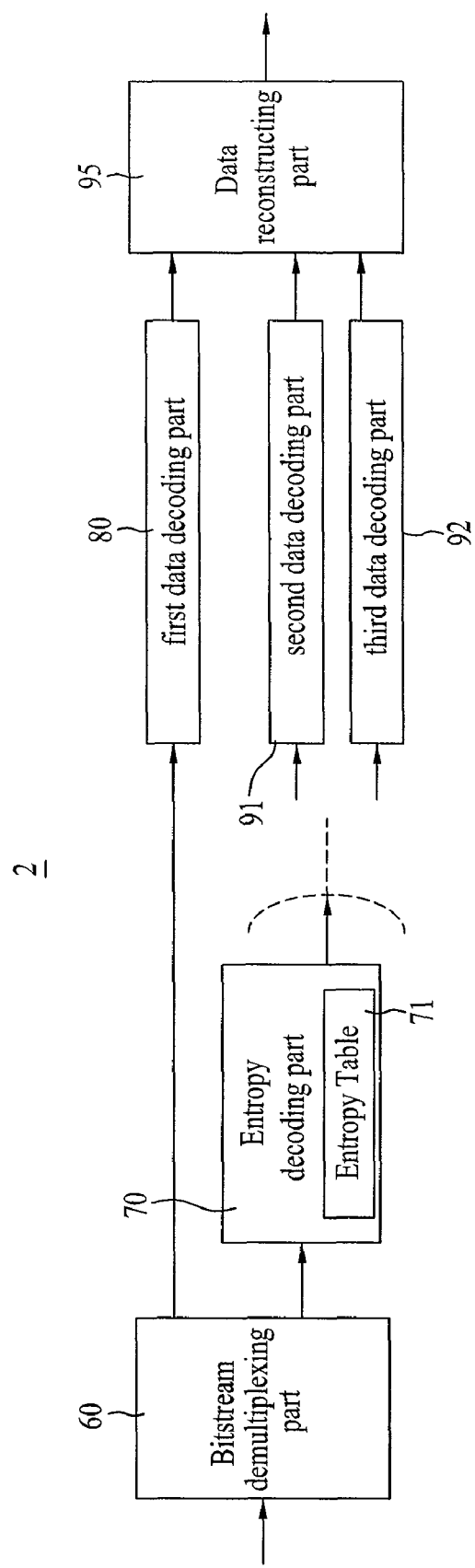

FIGS. 1 and 2 are diagrams of a system according to the present invention. FIG. 1 shows an encoding apparatus 1 and FIG. 2 shows a decoding apparatus 2.

Referring to FIG. 1, an encoding apparatus 1 according to the present invention includes at least one of a data grouping part 10, a first data encoding part 20, a second data encoding part 31, a third data encoding part 32, an entropy encoding part 40 and a bitstream multiplexing part 50.

Optionally, the second and third data encoding parts 31 and 32 can be integrated into one data encoding part 30. For instance, variable length encoding is performed on data encoded by the second and third data encoding parts 31 and 32 by the entropy encoding part 40. The above elements are explained in detail as follows.

The data grouping part 10 binds input signals by a prescribed unit to enhance data processing efficiency.

For instance, the data grouping part 10 discriminates data according to data types. And, the discriminated data is encoded by one of the data encoding parts 20, 31 and 32. The data grouping part 10 discriminates some of data into at least one group for the data processing efficiency. And, the grouped data is encoded by one of the data encoding parts 20, 31 and 32. Besides, a grouping method according to the present invention, in which operations of the data grouping part 10 are included, shall be explained in detail with reference to FIGS. 13 to 17 later.

Each of the data encoding parts 20, 31 and 32 encodes input data according to a corresponding encoding scheme. Each of the data encoding parts 20, 31 and 32 adopts at least one of a PCM (pulse code modulation) scheme and a differential coding scheme. In particular, the first data encoding part 20 adopts the PCM scheme, the second data encoding part 31 adopts a first differential coding scheme using a pilot reference value, and the third data encoding part 32 adopts a second differential coding scheme using a difference from neighbor data, for example.

Hereinafter, for convenience of explanation, the first differential coding scheme is named 'pilot based coding (PBC)' and the second differential coding scheme is named 'differential coding (DIFF)'. And, operations of the data encoding parts 20, 31 and 32 shall be explained in detail with reference to FIGS. 3 to 8 later.

Meanwhile, the entropy encoding part 40 performs variable length encoding according to statistical characteristics of data with reference to an entropy table 41. And, operations of the entropy encoding part 40 shall be explained in detail with reference to FIGS. 18 to 22 later.

The bitstream multiplexing part 50 arranges and/or coverts the coded data to correspond to a transfer specification and then transfers the arranged/converted data in a bitstream form. Yet, if a specific system employing the present invention does not use the bitstream multiplexing part 50, it is apparent to those skilled in the art that the system can be configured without the bitstream multiplexing part 50.

Meanwhile, the decoding apparatus 2 is configured to correspond to the above-explained encoding apparatus 1.

For instance, referring to FIG. 2, a bitstream demultiplexing part 60 receives an inputted bitstream and interprets and classifies various information included in the received bitstream according to a preset format.

An entropy decoding part 70 recovers the data into the original data before entropy encoding using an entropy table 71. In this case, it is apparent that the entropy table 71 is identically configured with the former entropy table 41 of the encoding apparatus 1 shown in FIG. 1.

A first data decoding part 80, a second data decoding part 91 and a third data decoding part 92 perform decoding to correspond to the aforesaid first to third data encoding parts 20, 31 and 32, respectively.

In particular, in case that the second and third data decoding parts 91 and 92 perform differential decoding, it is able to integrate overlapped decoding processes to be handled within one decoding process.

A data reconstructing part 95 recovers or reconstructs data decoded by the data decoding parts 80, 91 and 92 into original data prior to data encoding. Occasionally, the decoded data can be recovered into data resulting from converting or modifying the original data.

By the way, the present invention uses at least two coding schemes together for the efficient execution of data coding and intends to provide an efficient coding scheme using correlation between coding schemes.

And, the present invention intends to provide various kinds of data grouping schemes for the efficient execution of data coding.

Moreover, the present invention intends to provide a data structure including the features of the present invention.

In applying the technical idea of the present invention to various systems, it is apparent to those skilled in the art that various additional configurations should be used as well as the elements shown in FIG. 1 and FIG. 2. For example, data quantization needs to be executed or a controller is needed to control the above process.

Data Coding

PCM (pulse code modulation), PBC (pilot based coding) and DIFF (differential coding) applicable as data coding schemes of the present invention are explained in detail as follows. Besides, efficient selection and correlation of the data coding schemes shall be subsequently explained as well.

1. PCM (Pulse Code Modulation)

PCM is a coding scheme that converts an analog signal to a digital signal. The PCM samples analog signals with a preset interval and then quantizes a corresponding result. PCM may be disadvantageous in coding efficiency but can be effectively utilized for data unsuitable for PBC or DIFF coding scheme that will be explained later.

In the present invention, the PCM is used together with the PBC or DIFF coding scheme in performing data coding, which shall be explained with reference to FIGS. 9 to 12 later.

2. PBC (Pilot Based Coding)

2-1. Concept of PBC

PBC is a coding scheme that determines a specific reference within a discriminated data group and uses the relation between data as a coding target and the determined reference.

A value becoming a reference to apply the PBC can be defined as 'reference value', 'pilot', 'pilot reference value' or 'pilot value'. Hereinafter, for convenience of explanation, it is named 'pilot reference value'.

And, a difference value between the pilot reference value and data within a group can be defined as 'difference' or 'pilot difference'.

Moreover, a data group as a unit to apply the PBC indicates a final group having a specific grouping scheme applied by the aforesaid data grouping part 10. Data grouping can be executed in various ways, which shall be explained in detail later.

In the present invention, data grouped in the above manner to have a specific meaning is defined as 'parameter' to explain. This is just for convenience of explanation and can be replaced by a different terminology.

The PBC process according to the present invention includes at least two steps as follows.

First of all, a pilot reference value corresponding to a plurality of parameters is selected. In this case, the pilot reference value is decided with reference to a parameter becoming a PBC target.

For instance, a pilot reference value is set to a value selected from an average value of parameters becoming PBC targets, an approximate value of the average value of the parameters becoming the targets, an intermediate value corresponding to an intermediate level of parameters becoming targets and a most frequently used value among parameters becoming targets. And, a pilot reference value can be set to a preset default value as well. Moreover, a pilot value can be decided by a selection within a preset table.

Alternatively, in the present invention, temporary pilot reference values are set to pilot reference values selected by at least two of the various pilot reference value selecting methods, coding efficiency is calculated for each case, the temporary pilot reference value corresponding to a case having best coding efficiency is then selected as a final pilot reference value.

The approximate value of the average is Ceil[P] or Floor[P] when the average is P. In this case, Ceil[x] is a maximum integer not exceeding 'x' and Floor[x] is a minimum integer exceeding 'x'.

Yet, it is also possible to select an arbitrary fixed default value without referring to parameters becoming PBC targets.

For another instance, as mentioned in the foregoing description, after several values selectable as pilots have been randomly and plurally selected, a value showing the best coding efficiency can be selected as an optimal pilot.

Secondly, a difference value between the selected pilot and a parameter within a group is found. For instance, a difference value is calculated by subtracting a pilot reference value from a parameter value becoming a PBC target. This is explained with reference to FIGS. 2 and 4 as follows.

Figure 3:
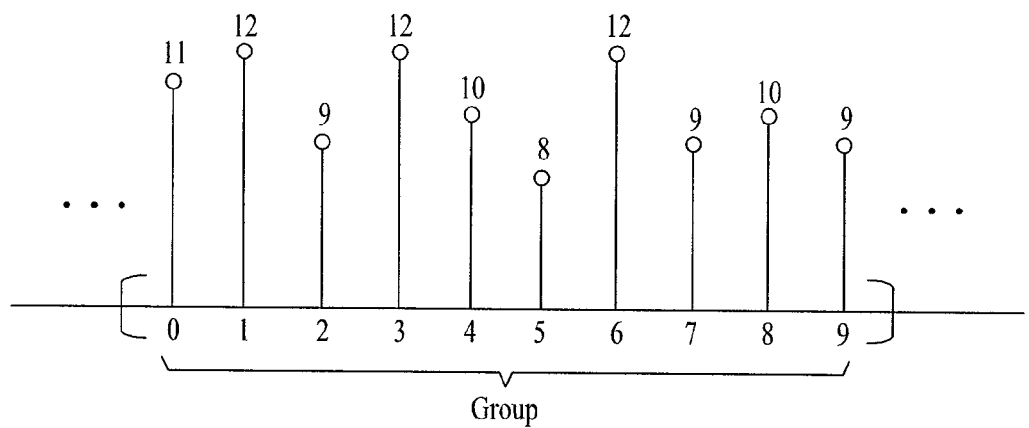
FIGS. 3 and 4 are diagrams to explain PBC coding according to the present invention.
Figure 4:
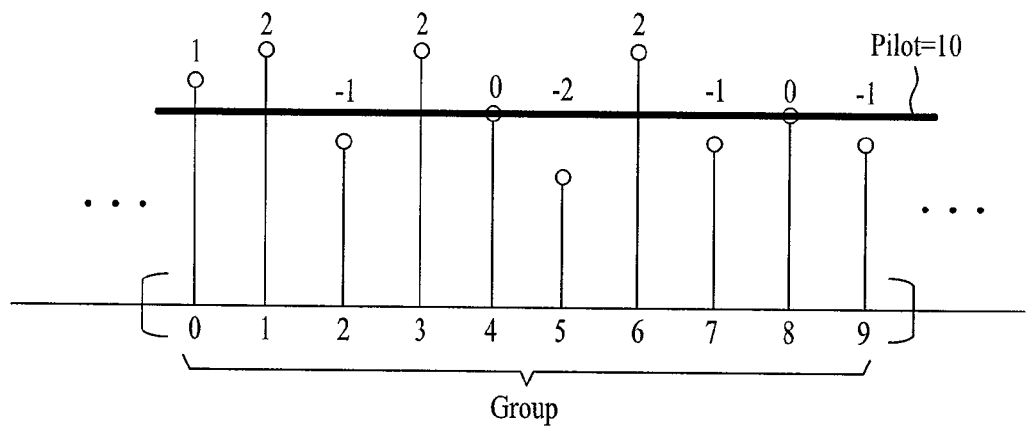

FIGS. 3 and 4 are diagrams to explain PBC coding according to the present invention.

For instance, it is assumed that a plurality of parameters (e.g., 10 parameters) exist within one group to have the following parameter values, $X[n]=\{11, 12, 9, 12, 10, 8, 12, 9, 10, 9\}$, respectively.

If a PBC scheme is selected to encode the parameters within the group, a pilot reference value should be selected in the first place. In this example, it can be seen that the pilot reference value is set to '10' in FIG. 4.

As mentioned in the foregoing description, it is able to select the pilot reference value by the various methods of selecting a pilot reference value.

Difference values by PBC are calculated according to Formula 1.

$$d[n]=x[n]-P, \text{ where } n=0, 1, \ldots, 9. \qquad [\text{Formula 1}]$$

In this case, 'P' indicates a pilot reference value (=10) and x[n] is a target parameter of data coding.

A result of PBC according to Formula 1 corresponds to $d[n]=\{1, 2, -1, 2, 0, -2, 2, -1, 0, -1\}$. Namely, the result of PBC coding includes the selected pilot reference value and the calculated d[n]. And, these values become targets of entropy coding that will be explained later. Besides, the PBC is more effective in case that deviation of target parameter values is small overall.

2-2. PBC Objects

A target of PBC coding is not specified into one. It is possible to code digital data of various signals by PBC. For instance, it is applicable to audio coding that will be explained later. In the present invention, additional control data processed together with audio data is explained in detail as a target of PBC coding.

The control data is transferred in addition to a downmixed signal of audio and is then used to reconstruct the audio. In the following description, the control data is defined as 'spatial information or spatial parameter'.

The spatial information includes various kinds of spatial parameters such as a channel level difference (hereinafter abbreviated CLD), an inter-channel coherence (hereinafter abbreviated ICC), a channel prediction coefficient (hereinafter abbreviated CPC) and the like.

In particular, the CLD is a parameter that indicates an energy difference between two different channels. For instance, the CLD has a value ranging between −15 and +15. The ICC is a parameter that indicates a correlation between two different channels. For instance, the ICC has a value ranging between 0 and 7. And, the CPC is a parameter that indicates a prediction coefficient used to generate three channels from two channels. For instance, the CPC has a value ranging between −20 and 30.

As a target of PBC coding, a gain value used to adjust a gain of signal, e.g., ADG (arbitrary downmix gain) can be included.

And, ATD (arbitrary tree data) applied to an arbitrary channel conversion box of a downmixed audio signal can become a PBC coding target. In particular, the ADG is a parameter that is discriminated from the CLD, ICC or CPC. Namely, the ADG corresponds to a parameter to adjust a gain of audio to differ from the spatial information such as CLD, ICC CPC and the like extracted from a channel of an audio signal. Yet, for example of use, it is able to process the ADG or ATD in the same manner of the aforesaid CLD to raise efficiency of audio coding.

As another target of PBC coding, a partial parameter can be taken into consideration. In the present invention, 'partial parameter' means a portion of parameter.

For instance, assuming that a specific parameter is represented as n bits, the n bits are divided into at least two parts. And, it is able to define the two parts as first and second partial parameters, respectively. In case of attempting to perform PBC coding, it is able to find a difference value between a first partial parameter value and a pilot reference value. Yet, the second partial parameter excluded in the difference calculation should be transferred as a separate value.

In more particular, for instance, in case of n bits indicating a parameter value, a least significant bit (LSB) is defined as the second partial parameter and a parameter value constructed with the rest (n−1) upper bits can be defined as the first partial parameter. In this case, it is able to perform PBC on the first partial parameter only. This is because coding efficiency can be enhanced due to small deviations between the first partial parameter values constructed with the (n−1) upper bits.

The second partial parameter excluded in the difference calculation is separately transferred, and is then taken into consideration in reconstructing a final parameter by a decoding part. Alternatively, it is also possible to obtain a second partial parameter by a predetermined scheme instead of transferring the second partial parameter separately.

PBC coding using characteristics of the partial parameters is restrictively utilized according to a characteristic of a target parameter.

For instance, as mentioned in the foregoing description, deviations between the first partial parameters should be small. If the deviation is big, it is unnecessary to utilize the partial parameters. It may even degrade coding efficiency.

According to an experimental result, the CPC parameter of the aforesaid spatial information is suitable for the application of the PBC scheme. Yet, it is not preferable to apply the CPC parameter to coarse quantization scheme. In case that a quantization scheme is coarse, a deviation between first partial parameters increases.

Besides, the data coding using partial parameters is applicable to DIFF scheme as well as PBC scheme.

In case of applying the partial parameter concept to the CPC parameter, a signal processing method and apparatus for reconstruction are explained as follows.

For instance, a method of processing a signal using partial parameters according to the present invention includes the steps of obtaining a first partial parameter using a reference value corresponding to the first partial parameter and a difference value corresponding to the reference value and deciding a parameter using the first partial parameter and a second partial parameter.

In this case, the reference value is either a pilot reference value or a difference reference value. And, the first partial parameter includes partial bits of the parameter and the second partial parameter includes the rest bits of the parameter. Moreover, the second partial parameter includes a least significant bit of the parameter.

The signal processing method further includes the step of reconstructing an audio signal using the decided parameter.

The parameter is spatial information including at least one of CLD, ICC, CPC and ADG.

If the parameter is the CPC and if a quantization scale of the parameter is not coarse, it is able to obtain the second partial parameter.

And, a final parameter is decided by twice multiplying the partial parameter and adding the multiplication result to the second partial parameter.

An apparatus for processing a signal using partial parameters according to the present invention includes a first parameter obtaining part obtaining a first partial parameter using a reference value corresponding to the first partial parameter and a difference value corresponding to the reference value and a parameter deciding part deciding a parameter using the first partial parameter and a second partial parameter.

The signal processing apparatus further includes a second parameter obtaining part obtaining the second partial parameter by receiving the second partial parameter.

And, the first parameter obtaining part, the parameter deciding part and the second partial parameter obtaining part are included within the aforesaid data decoding part 91 or 92.

A method of processing a signal using partial parameters according to the present invention includes the steps of dividing a parameter into a first partial parameter and a second partial parameter and generating a difference value using a reference value corresponding to the first partial parameter and the first partial parameter.

And, the signal processing method further includes the step of transferring the difference value and the second partial parameter.

An apparatus for processing a signal using partial parameters according to the present invention includes a parameter dividing part dividing a parameter into a first partial parameter and a second partial parameter and a difference value generating part generating a difference value using a reference value corresponding to the first partial parameter and the first partial parameter.

And, the signal processing apparatus further includes a parameter outputting part transferring the difference value and the second partial parameter.

Moreover, the parameter diving part and the difference value generating part are included within the aforesaid data encoding part 31 or 32.

2-3. PBC Conditions

In aspect that PBC coding of the present invention selects a separate pilot reference value and then has the selected pilot reference value included in a bitstream, it is probable that transmission efficiency of the PBC coding becomes lower than that of a DIFF coding scheme that will be explained later.

So, the present invention intends to provide an optimal condition to perform PBC coding.

If the number of data experimentally becoming targets of data coding within a group is at least three or higher, PBC coding is applicable. This corresponds to a result in considering efficiency of data coding. It means that DIFF or PCM coding is more efficient than PBC coding if two data exist within a group only.

Although PBC coding is applicable to at least three or more data, it is preferable that PBC coding is applied to a case that at least five data exist within a group. In other words, a case that PBC coding is most efficiently applicable is a case that there are at least five data becoming targets of data coding and that deviations between the at least five data are small. And, a minimum number of data suitable for the execution of PBC coding will be decided according to a system and coding environment.

Data becoming a target of data coding is given for each data band. This will be explained through a grouping process that will be described later. So, for example, the present invention proposes that at least five data bands are required for the application of PBC coding in MPEG audio surround coding that will be explained later.

Hereinafter, a signal processing method and apparatus using the conditions for the execution of PBC are explained as follows.

In a signal processing method according to one embodiment of the present invention, if the number of data corresponding to a pilot reference value is obtained and if the number of data bands meets a preset condition, the pilot reference value and a pilot difference value corresponding to the pilot reference value are obtained. Subsequently, the data are obtained using the pilot reference value and the pilot difference value. In particular, the number of the data is obtained using the number of the data bands in which the data are included.

In a signal processing method according to another embodiment of the present invention, one of a plurality of data coding schemes is decided using the number of data and the data are decoded according to the decided data coding scheme. A plurality of the data coding schemes include a pilot coding scheme at least. If the number of the data meets a preset condition, the data coding scheme is decided as the pilot coding scheme.

And, the data decoding process includes the steps of obtaining a pilot reference value corresponding to a plurality of the data and a pilot difference value corresponding to the pilot reference value and obtaining the data using the pilot reference value and the pilot difference value.

Moreover, in the signal processing method, the data are parameters. And, an audio signal is recovered using the parameters. In the signal processing method, identification information corresponding to the number of the parameters is received and the number of the parameters is generated using the received identification information. By considering the number of the data, identification information indicating a plurality of the data coding schemes is hierarchically extracted.

In the step of extracting the identification information, a first identification information indicating a first data coding scheme is extracted and a second identification information indicating a second data coding scheme is then extracted using the first identification information and the number of the data. In this case, the first identification information indicates whether it is a DIFF coding scheme. And, the second identification information indicates whether it is a pilot coding scheme or a PCM grouping scheme.

In a signal processing method according to another embodiment of the present invention, if the number of a plurality of data meets a preset condition, a pilot difference value is generated using a pilot reference value corresponding to a plurality of the data and the data. The generated pilot difference value is then transferred. In the signal processing method, the pilot reference value is transferred.

In a signal processing method according to a further embodiment of the present invention, data coding schemes are decided according to the number of a plurality of data. The data are then encoded according to the decided data coding schemes. In this case, a plurality of the data coding schemes include a pilot coding scheme at least. If the number of the data meets a preset condition, the data coding scheme is decided as the pilot coding scheme.

An apparatus for processing a signal according to one embodiment of the present invention includes a number obtaining part obtaining a number of data corresponding to a pilot reference value, a value obtaining part obtaining the pilot reference value and a pilot difference value corresponding to the pilot reference value if the number of the data meets a preset condition, and a data obtaining part obtaining the data using the pilot reference value and the pilot difference value. In this case, the number obtaining part, the value obtaining part and the data obtaining part are included in the aforesaid data decoding part 91 or 92.

An apparatus for processing a signal according to another embodiment of the present invention includes a scheme deciding part deciding one of a plurality of data coding schemes according to a number of a plurality of data and a decoding part decoding the data according to the decided data coding scheme. In this case, a plurality of the data coding schemes include a pilot coding scheme at least.

An apparatus for processing a signal according to a further embodiment of the present invention includes a value generating part generating a pilot difference value using a pilot reference value corresponding to a plurality of data and the data if a number of a plurality of the data meets a preset condition and an output part transferring the generated pilot difference value. In this case, the value generating part is included in the aforesaid data encoding part 31 or 32.

An apparatus for processing a signal according to another further embodiment of the present invention includes a scheme deciding part deciding a data coding scheme according to a number of a plurality of data and an encoding part encoding the data according to the decided data coding scheme. In this case, a plurality of the data coding schemes include a pilot coding scheme at least.

2-4. PBC Signal Processing Method

A signal processing method and apparatus using PBC coding features according to the present invention are explained as follows.

In a signal processing method according to one embodiment of the present invention, a pilot reference value corresponding to a plurality of data and a pilot difference value corresponding to the pilot reference value are obtained. Subsequently, the data are obtained using the pilot reference value and the pilot difference value. And, the method may further include a step of decoding at least one of the pilot difference value and the pilot reference value. In this case, the PBC applied data are parameters. And, the method may further include the step of reconstructing an audio signal using the obtained parameters.

An apparatus for processing a signal according to one embodiment of the present invention includes a pilot reference value corresponding to a plurality of data and a pilot difference value corresponding to the pilot reference value and a data obtaining part obtaining the data using the pilot reference value and the pilot difference value. In this case, the value obtaining part and the data obtaining part are included in the aforesaid data coding part 91 or 92.

A method of processing a signal according to another embodiment of the present invention includes the steps of generating a pilot difference value using a pilot reference value corresponding to a plurality of data and the data and outputting the generated pilot difference value.

An apparatus for processing a signal according to another embodiment of the present invention includes a value generating part generating a pilot difference value using a pilot reference value corresponding to a plurality of data and the data and an output part outputting the generated pilot difference value.

A method of processing a signal according to a further embodiment of the present invention includes the steps of obtaining a pilot reference value corresponding to a plurality of gains and a pilot difference value corresponding to the pilot reference value and obtaining the gain using the pilot reference value and the pilot difference value. And, the method may further include the step of decoding at least one of the pilot difference value and the pilot reference value. Moreover, the method may further include the step of reconstructing an audio signal using the obtained gain.

In this case, the pilot reference value may be an average of a plurality of the gains, an averaged intermediate value of a plurality of the gains, a most frequently used value of a plurality of the gains, a value set to a default or one value extracted from a table. And, the method may further include the step of selecting the gain having highest encoding efficiency as a final pilot reference value after the pilot reference value has been set to each of a plurality of the gains.

An apparatus for processing a signal according to a further embodiment of the present invention includes a value obtaining part obtaining a pilot reference value corresponding to a plurality of gains and a pilot difference value corresponding to the pilot reference value and a gain obtaining part obtaining the gain using the pilot reference value and the pilot difference value.

A method of processing a signal according to another further embodiment of the present invention includes the steps of generating a pilot difference value using a pilot reference value corresponding to a plurality of gains and the gains and outputting the generated pilot difference value.

And, an apparatus for processing a signal according to another further embodiment of the present invention includes a value calculating part generating a pilot difference value using a pilot reference value corresponding to a plurality of gains and the gains and an outputting part outputting the generated pilot difference value.

3. DIFF (Differential Coding)

DIFF coding is a coding scheme that uses relations between a plurality of data existing within a discriminated data group, which may be called 'differential coding'. In this case, a data group, which is a unit in applying the DIFF, means a final group to which a specific grouping scheme is applied by the aforesaid data grouping part 10. In the present invention, data having a specific meaning as grouped in the above manner is defined as 'parameter' to be explained. And, this is the same as explained for the PBC.

In particular, the DIFF coding scheme is a coding scheme that uses difference values between parameters existing within a same group, and more particularly, difference values between neighbor parameters.

Types and detailed application examples of the DIFF coding schemes are explained in detail with reference to FIGS. 5 to 8 as follows.

3-1. DIFF Types

Figure 5:
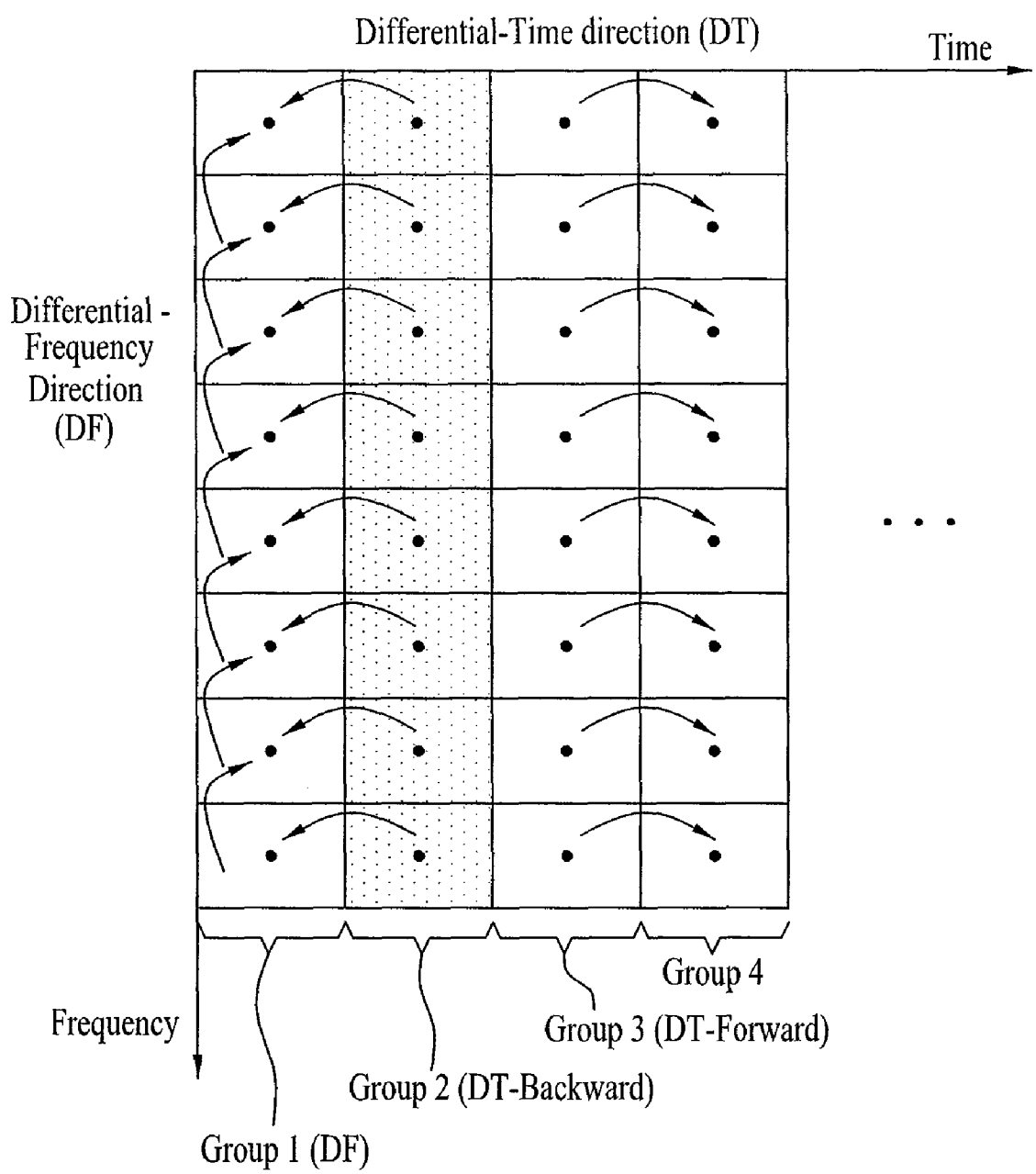
FIG. 5 is a diagram to explain types of DIFF coding according to the present invention.

FIG. 5 is a diagram to explain types of DIFF coding according to the present invention. DIFF coding is discriminated according to a direction in finding a difference value from a neighbor parameter.

For instance, DIFF coding types can be classified into DIFF in frequency direction (hereinafter abbreviated 'DIFF_FREQ' or 'DF') and DIFF in time direction (hereinafter abbreviated 'DIFF_TIME' or 'DT').

Referring to FIG. 5, Group-1 indicates DIFF(DF) calculating a difference value in a frequency axis, while Group-2 or Group-3 calculates a difference value in a time axis.

As can be seen in FIG. 5, the DIFF(DT), which calculates a difference value in a time axis, is re-discriminated according to a direction of the time axis to find a difference value.

For instance, the DIFF(DT) applied to the Group-2 corresponds to a scheme that finds a difference value between a parameter value at a current time and a parameter value at a previous time (e.g., Group-1). This is called backward time DIFF(DT) (hereinafter abbreviated 'DT-BACKWARD').

For instance, the DIFF(DT) applied to the Group-3 corresponds to a scheme that finds a difference value between a parameter value at a current time and a parameter value at a next time (e.g., Group-4). This is called forward time DIFF (DT) (hereinafter abbreviated 'DT-FORWARD').

Hence, as shown in FIG. 5, the Group-1 is a DIFF(DF) coding scheme, the Group-2 is a DIFF(DT-BACKWARD) coding scheme, and the Group-3 is a DIFF(DT-FORWARD) coding scheme. Yet, a coding scheme of the Group-4 is not decided.

In the present invention, although DIFF in frequency axis is defined as one coding scheme (e.g., DIFF(DF)) only, definitions can be made by discriminating it into 'DIFF(DF-TOP)' and 'DIFF(DF-BOTTOM)' as well.

3-2. Examples of DIFF Applications

Figure 6:
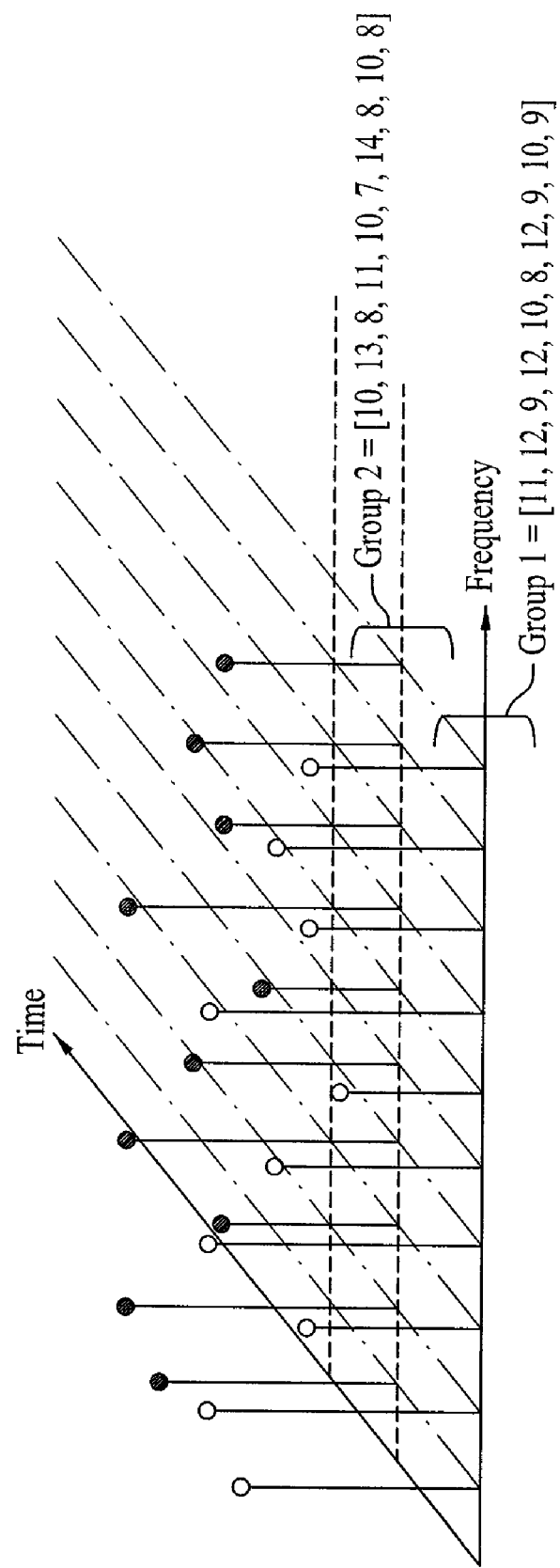
FIGS. 6 to 8 are diagrams of examples to which DIFF coding scheme is applied.
Figure 7:
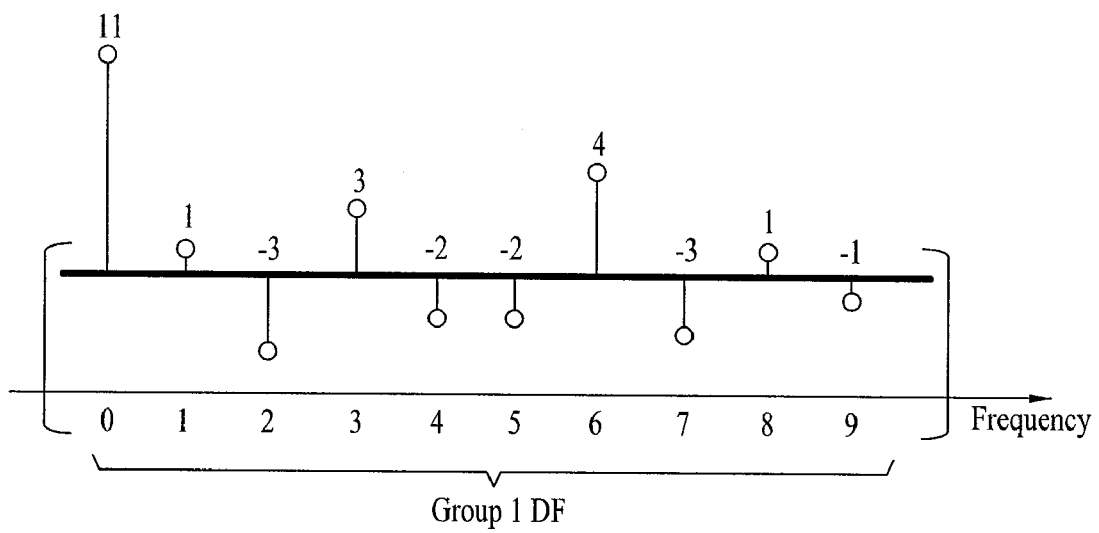
Figure 8:
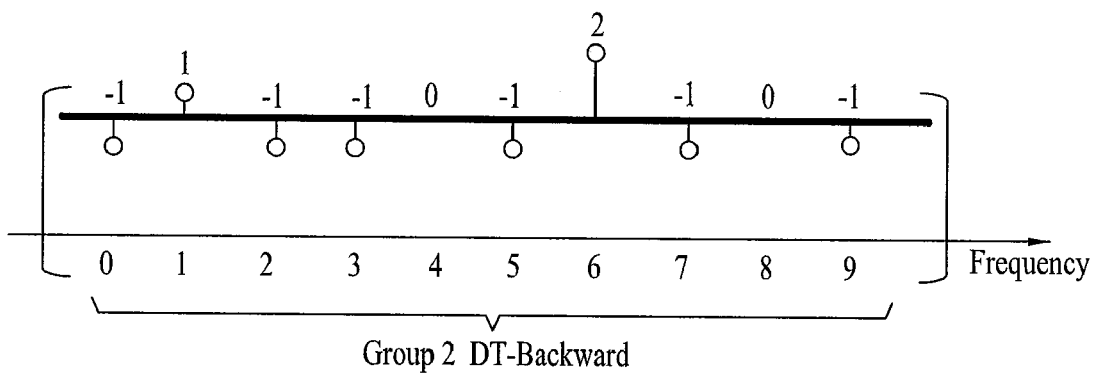

FIGS. 6 to 8 are diagrams of examples to which DIFF coding scheme is applied.

In FIG. 6, the Group-1 and the Group-2 shown in FIG. 5 are taken as examples for the convenience of explanation. The Group-1 follows DIFF(DF) coding scheme and its parameter value is x[n]={11, 12, 9, 12, 10, 8, 12, 9, 10, 9}. The Group-2 follows DIFF(DF-BACKWARD) coding scheme and its parameter value is y[n]={10, 13, 8, 11, 10, 7, 14, 8, 10, 8}.

FIG. 7 shows results from calculating difference values of the Group-1. Since the Group-1 is coded by the DIFF(DF) coding scheme, difference values are calculated by Formula 2. Formula 2 means that a difference value from a previous parameter is found on a frequency axis.

$$d[0]=x[0]$$

$$d[n]=x[n]-x[n-1], \text{ where } n=1, 2, \ldots, 9. \quad \text{[Formula 2]}$$

In particular, the DIFF(DF) result of the Group-1 by Formula 2 is d[n]={-11, 1, -3, 3, -2, -2, 4, -3, 1, -1}.

FIG. 8 shows results from calculating difference values of the Group-2. Since the Group-2 is coded by the DIFF(DF-BACKWARD) coding scheme, difference values are calculated by Formula 3. Formula 3 means that a difference value from a previous parameter is found on a time axis.

$$d[n]=y[n]-x[n], \text{ where } n=1, 2, \ldots, 9. \quad \text{[Formula 3]}$$

In particular, the DIFF(DF-BACKWARD) result of the Group-2 by Formula 3 is d[n]={-1, 1, -1, -1, 0, 01, 2, -1, 0, -1}.

4. Selection for Data Coding Scheme

The present invention is characterized in compressing or reconstructing data by mixing various data coding schemes. So, in coding a specific group, it is necessary to select one coding scheme from at least three or more data coding schemes. And, identification information for the selected coding scheme should be delivered to a decoding part via bitstream.

A method of selecting a data coding scheme and a coding method and apparatus using the same according to the present invention are explained as follows.

A method of processing a signal according to one embodiment of the present invention includes the steps of obtaining data coding identification information and data-decoding data according to a data coding scheme indicated by the data coding identification information.

In this case, the data coding scheme includes a PBC coding scheme at least. And, the PBC coding scheme decodes the data using a pilot reference value corresponding to a plurality of data and a pilot difference value. And, the pilot difference value is generated using the data and the pilot reference value.

The data coding scheme further includes a DIFF coding scheme. The DIFF coding scheme corresponds to one of DIFF-DF scheme and DIFF-DT scheme. And, the DIFF-DT scheme corresponds to one of forward time DIFF-DT(FORWARD) scheme and backward time DIFF-DT(BACKWARD).

The signal processing method further includes the steps of obtaining entropy coding identification information and entropy-decoding the data using an entropy coding scheme indicated by the entropy coding identification information.

In the data decoding step, the entropy-decoded data is data-decoded by the data coding scheme.

And, the signal processing method further includes the step of decoding an audio signal using the data as parameters.

An apparatus for processing a signal according to one embodiment of the present invention includes An identification information obtaining part obtaining data coding identification information and a decoding part data-decoding data according to a data coding scheme indicated by the data coding identification information.

In this case, the data coding scheme includes a PBC coding scheme at least. And, the PBC coding scheme decodes the data using a pilot reference value corresponding to a plurality of data and a pilot difference value. And, the pilot difference value is generated using the data and the pilot reference value.

A method of processing a signal according to another embodiment of the present invention includes the steps of data-encoding data according to a data coding scheme and generating to transfer data coding identification information indicating the data coding scheme.

In this case, the data coding scheme includes a PBC coding scheme at least. The PBC coding scheme encodes the data using a pilot reference value corresponding to a plurality of data and a pilot difference value. And, the pilot difference value is generated using the data and the pilot reference value.

An apparatus for processing a signal according to another embodiment of the present invention includes an encoding part data-encoding data according to a data coding scheme and an outputting part generating to transfer data coding identification information indicating the data coding scheme.

In this case, the data coding scheme includes a PBC coding scheme at least. The PBC coding scheme encodes the data using a pilot reference value corresponding to a plurality of data and a pilot difference value. And, the pilot difference value is generated using the data and the pilot reference value.

A method of selecting a data coding scheme and a method of transferring coding selection identification information by optimal transmission efficiency according to the present invention are explained as follows.

4-1. Data Coding Identifying Method Considering Frequency of Use

Figure 9:
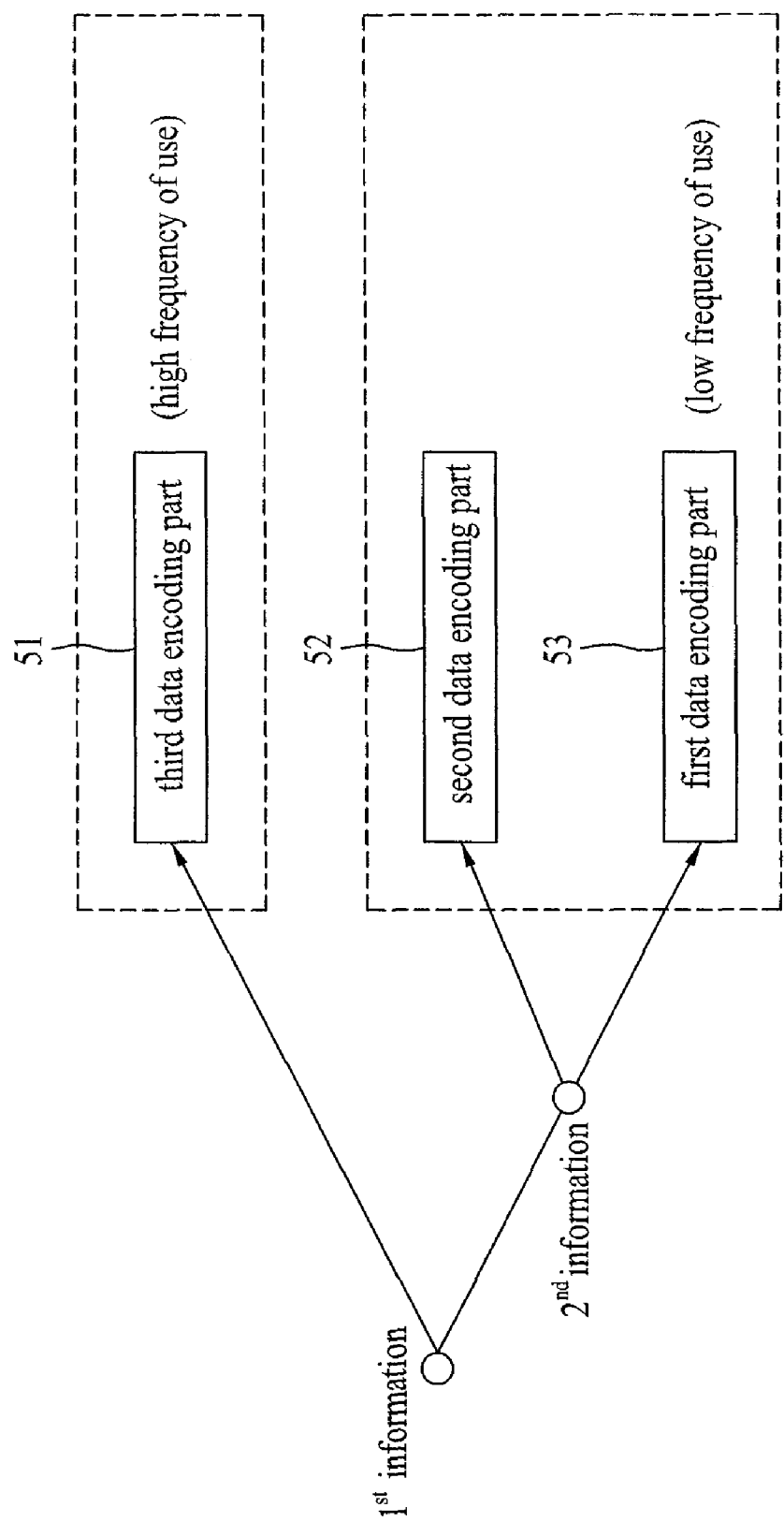
FIG. 9 is a block diagram to explain a relation in selecting one of at least three coding schemes according to the present invention.

FIG. 9 is a block diagram to explain a relation in selecting one of at least three coding schemes according to the present invention.

Referring to FIG. 9, it is assumed that there exist first to third data encoding parts 53, 52 and 51, that frequency of use of the first data encoding part 53 is lowest, and that frequency of use of the third data encoding part 51 is highest.

For convenience of explanation, with reference to total '100', it is assumed that frequency of use of the first data encoding part 53 is '10', that frequency of use of the second data encoding part 52 is '30', and that frequency of use of the third data encoding part 51 is '60'. In particular, for 100 data groups, it can be regarded PCM scheme is applied 10 times, PBC scheme is applied 30 times, and DIFF scheme is applied 60 times.

On the above assumptions, a number of bits necessary for identification information to identify three kinds of coding schemes is calculated in a following manner.

For example, according to FIG. 9, since 1-bit first information is used, 100 bits are used as the first information to identify coding schemes of total 100 groups. Since the third data encoding part 51 having the highest frequency of use is identified through the 100 bits, the rest of 1-bit second information is able to discriminate the first data encoding part 53 and the second data encoding part 52 using 40 bits only.

Hence, identification information to select the per-group coding type for total 100 data groups needs total 140 bits resulting from 'first information (100 bits)+second information (40 bits)'.

Figure 10:
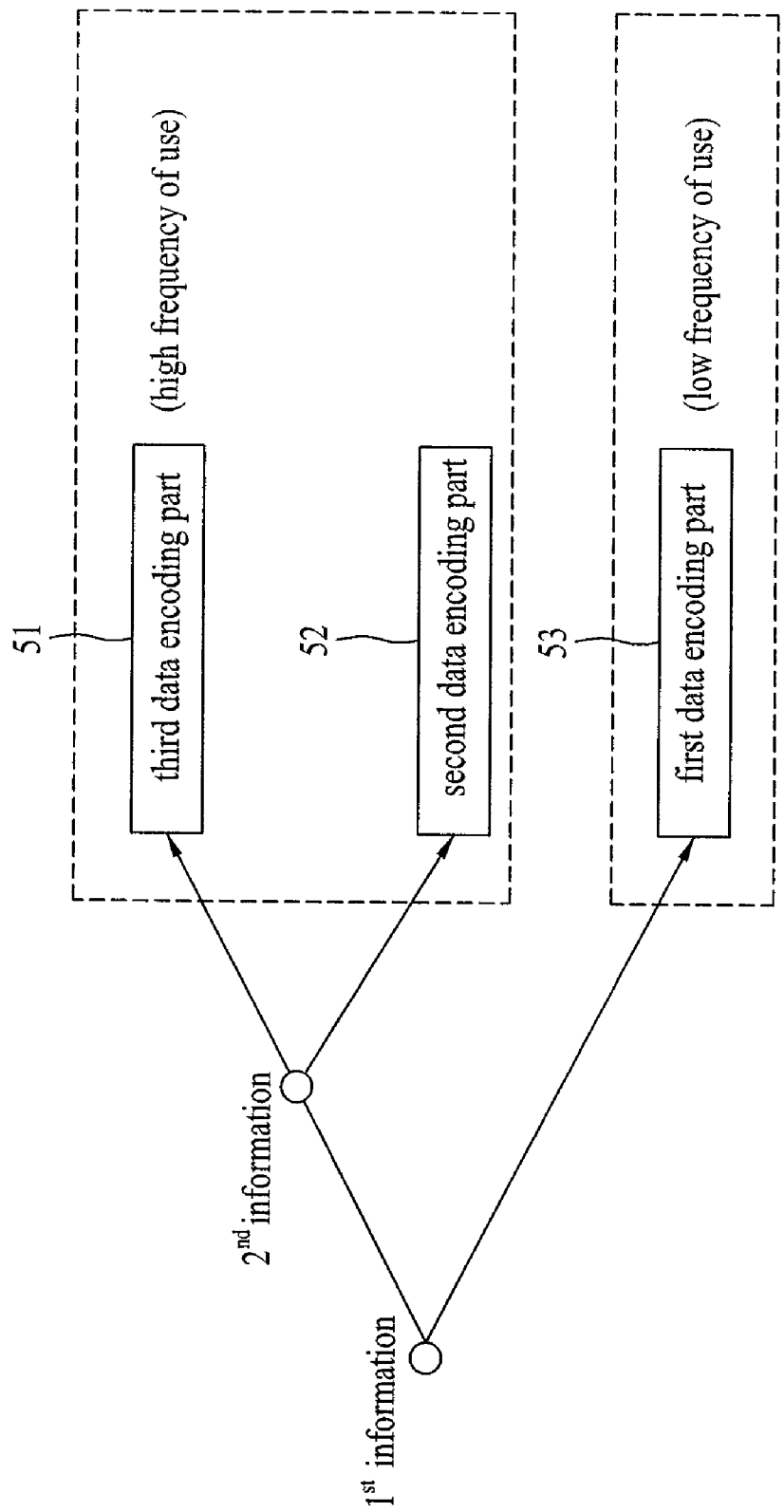
FIG. 10 is a block diagram to explain a relation in selecting one of at least three coding schemes according to a related art.

FIG. 10 is a block diagram to explain a relation in selecting one of at least three coding schemes according to a related art.

Like FIG. 9, for convenience of explanation, with reference to total '100', it is assumed that frequency of use of the first data encoding part 53 is '10', that frequency of use of the second data encoding part 52 is '30', and that frequency of use of the third data encoding part 51 is '60'.

In FIG. 10, a number of bits necessary for identification information to identify three coding scheme types is calculated in a following manner.

First of all, according to FIG. 10, since 1-bit first information is used, 100 bits are used as the first information to identify coding schemes of total 100 groups.

The first data encoding part 53 having the lowest frequency of use is preferentially identified through the 100 bits. So, the rest of 1-bit second information needs total 90 bits more to discriminate the second data encoding part 52 and the third data encoding part 51.

Hence, identification information to select the per-group coding type for total 100 data groups needs total 190 bits resulting from 'first information (100 bits)+second information (90 bits)'.

Comparing the case shown in FIG. 9 and the case shown in FIG. 10, it can be seen that the data coding selection identification information shown in FIG. 9 is more advantageous in transmission efficiency.

Namely, in case that there exist at least three or more data coding schemes, the present invention is characterized in utilizing different identification information instead of discriminating two coding scheme types similar to each other in frequency of use by the same identification information.

For instance, in case that the first data encoding part 51 and the second data encoding part 52, as shown in FIG. 10, are classified as the same identification information, data transmission bits increase to lower transmission efficiency.

In case that there exist at least three data coding types, the present invention is characterized in discriminating a data coding scheme having highest frequency of use by first information. So, by second information, the rest of the two coding schemes having low frequency of use each are discriminated.

Figure 11:
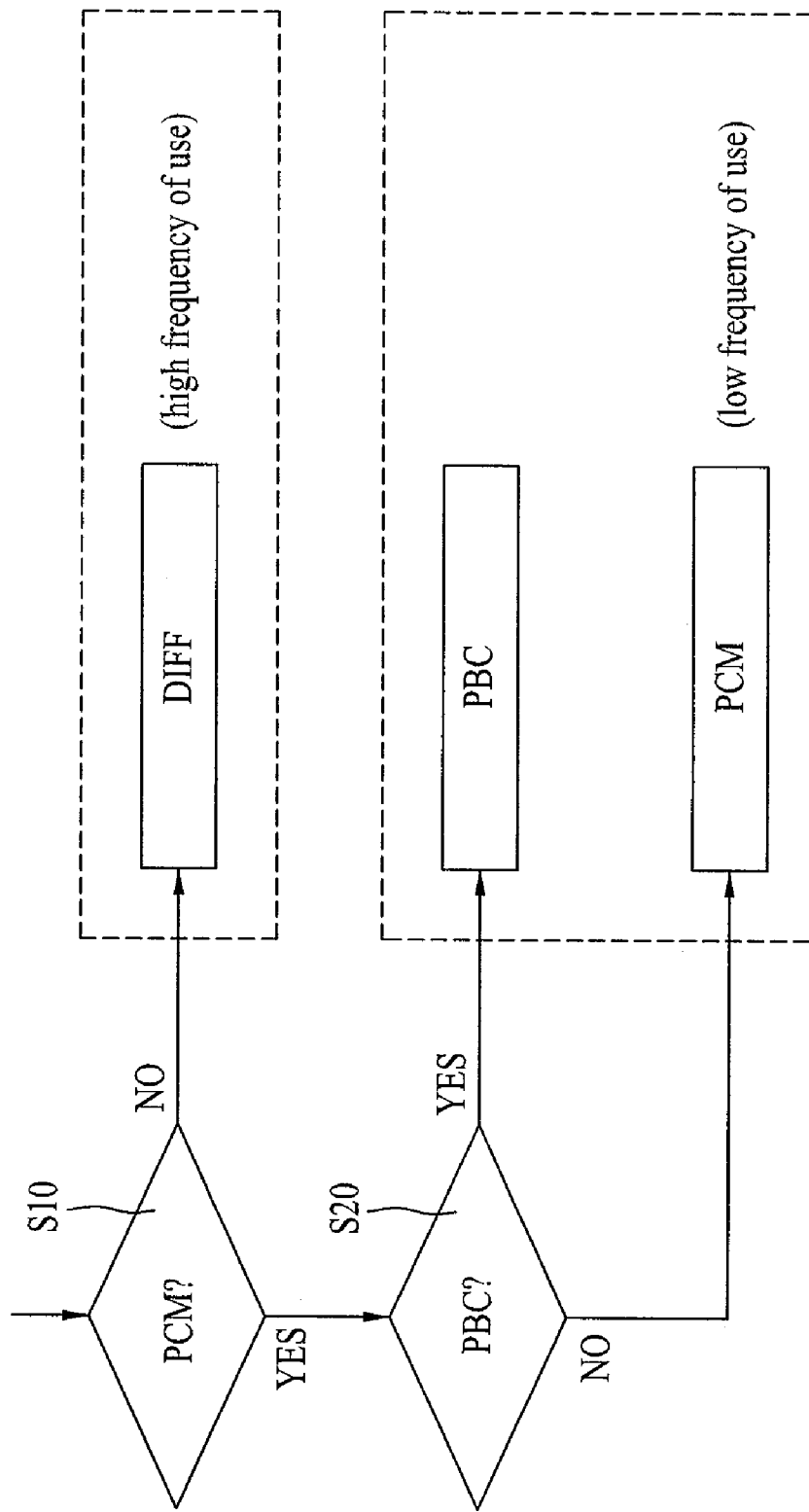
FIGS. 11 and 12 are flowcharts for the data coding selecting scheme according to the present invention, respectively.
Figure 12:
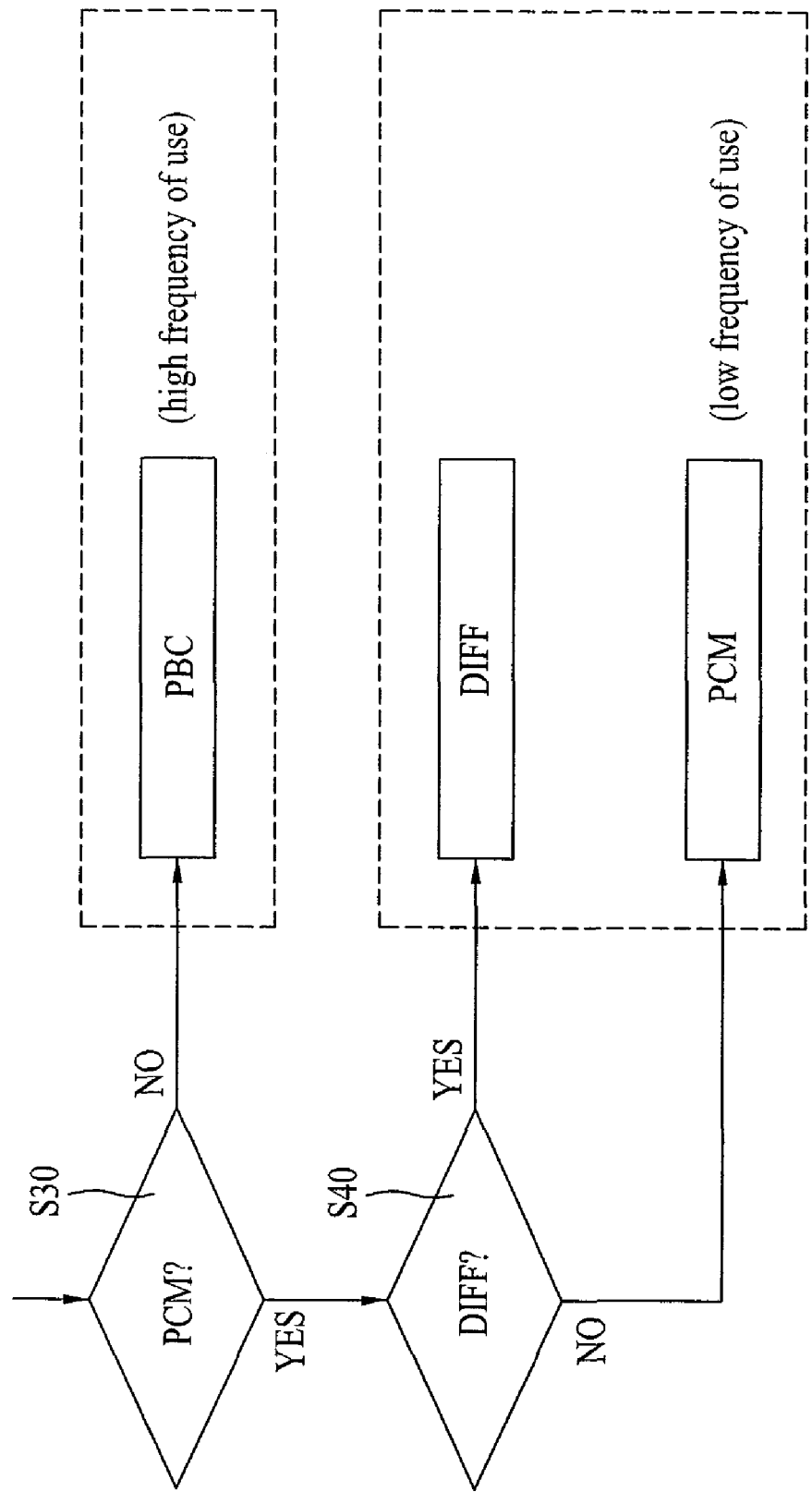

FIGS. 11 and 12 are flowcharts for the data coding selecting scheme according to the present invention, respectively.

In FIG. 11, it is assumed that DIFF coding is a data coding scheme having highest frequency of use. In FIG. 12, it is assumed that PBC coding is a data coding scheme having highest frequency of use.

Referring to FIG. 11, a presence or non-presence of PCM coding having lowest frequency of use is checked (S10). As mentioned in the foregoing description, the check is performed by first information for identification.

As a result of the check, if it is the PCM coding, it is checked whether it is PBC coding (S20). This is performed by second information for identification.

In case that frequency of use of DIFF coding is 60 times among total 100 times, identification information for a per-group coding type selection for the same 100 data groups needs total 140 bits of 'first information (100 bits)+second information (40 bits)'.

Referring to FIG. 12, like FIG. 11, a presence or non-presence of PCM coding having lowest frequency of use is checked (S30). As mentioned in the foregoing description, the check is performed by first information for identification.

As a result of the check, if it is the PCM coding, it is checked whether it is DIFF coding (S40). This is performed by second information for identification.

In case that frequency of use of DIFF coding is 80 times among total 100 times, identification information for a per-group coding type selection for the same 100 data groups needs total 120 bits of 'first information (100 bits)+second information (20 bits)'.

A method of identifying a plurality of data coding schemes and a signal processing method and apparatus using the same according to the present invention are explained as follows.

A method of processing a signal according to one embodiment of the present invention includes the steps of extracting identification information indicating a plurality of data coding schemes hierarchically and decoding data according to the data coding scheme corresponding to the identification information.

In this case, the identification information indicating a PBC coding scheme and a DIFF coding scheme included in a plurality of the data coding schemes is extracted from different layers.

In the decoding step, the data are obtained according to the data coding scheme using a reference value corresponding to a plurality of data and a difference value generated using the data. In this case, the reference value is a pilot reference value or a difference reference value.

A method of processing a signal according to another embodiment of the present invention includes the steps of extracting identification information indicating at least three or more data coding schemes hierarchically. In this case, the identification information indicating two coding schemes having high frequency of use of the identification information is extracted from different layers.

A method of processing a signal according to a further embodiment of the present invention includes the steps of extracting identification information hierarchically according to frequency of use of the identification information indicating a data coding scheme and decoding data according to the data decoding scheme corresponding to the identification information.

In this case, the identification information is extracted in a manner of extracting first identification information and second identification information hierarchically. The first identification information indicates whether it is a first data coding scheme and the second identification information indicates whether it is a second data coding scheme.

The first identification information indicates whether it is a DIFF coding scheme. And, the second identification information indicates whether it is a pilot coding scheme or a PCM grouping scheme.

The first data coding scheme can be a PCM coding scheme. And, the second data coding scheme can be a PBC coding scheme or a DIFF coding scheme.

The data are parameters, and the signal processing method further includes the step of reconstructing an audio signal using the parameters.

An apparatus for processing a signal according to one embodiment of the present invention includes an identifier extracting part (e.g., '710' in FIG. 13) hierarchically extracting identification information discriminating a plurality of data coding schemes and a decoding part decoding data according to the data coding scheme corresponding to the identification information.

A method of processing a signal according to another further embodiment of the present invention includes the steps of encoding data according to a data coding scheme and generating identification information discriminating data coding schemes differing from each other in frequency of use used in encoding the data.

In this case, the identification information discriminates a PCM coding scheme and a PBC coding scheme from each other. In particular, the identification information discriminates a PCM coding scheme and a DIFF coding scheme.

And, an apparatus for processing a signal according to another further embodiment of the present invention includes an encoding part encoding data according to a data coding scheme and an identification information generating part (e.g., '400' in FIG. 11) generating identification information discriminating data coding schemes differing from each other in frequency of use used in encoding the data.

4-2. Inter-Data-Coding Relations

First of all, there exist mutually independent and/or dependent relations between PCM, PBC and DIFF of the present invention. For instance, it is able to freely select one of the three coding types for each group becoming a target of data coding. So, overall data coding brings a result of using the three coding scheme types in combination with each other. Yet, by considering frequency of use of the three coding scheme types, one of a DIFF coding scheme having optimal frequency of use and the rest of the two coding schemes (e.g., PCM and PBC) is primarily selected. Subsequently, one of the PCM and the PBC is secondarily selected. Yet, as mentioned in the foregoing description, this is to consider transmission efficiency of identification information but is not attributed to similarity of substantial coding schemes.

In aspect of similarity of coding schemes, the PBC and DIFF are similar to each other in calculating a difference value. So, coding processes of the PBC and the DIFF are considerably overlapped with each other. In particular, a step of reconstructing an original parameter from a difference value in decoding is defined as 'delta decoding' and can be designed to be handled in the same step.

In the course of executing PBC or DIFF coding, there may exist a parameter deviating from its range. In this case, it is necessary to code and transfer the corresponding parameter by separate PCM.

[Grouping]

1. Concept of Grouping

The present invention proposes 'grouping' that handles data by binding prescribed data together for efficiency in coding. In particular, in case of PBC coding, since a pilot reference value is selected by a group unit, a grouping process needs to be completed as a step prior to executing the PBC coding. The grouping is applied to DIFF coding in the same manner. And, some schemes of the grouping according to the present invention are applicable to entropy coding as well, which will be explained in a corresponding description part later.

Grouping types of the present invention can be classified into 'external grouping' and 'internal grouping' with reference to an executing method of grouping.

Alternatively, grouping types of the present invention can be classified into 'domain grouping', 'data grouping' and 'channel grouping' with reference to a grouping target.

Alternatively, grouping types of the present invention can be classified into 'first grouping', 'second grouping' and 'third grouping' with reference to a grouping execution sequence.

Alternatively, grouping types of the present invention can be classified into 'single grouping' and 'multiple grouping' with reference to a grouping execution count.

Yet, the above grouping classifications are made for convenience in transferring the concept of the present invention, which does not put limitation on its terminologies of use.

The grouping according to the present invention is completed in a manner that various grouping schemes are overlapped with each other in use or used in combination with each other.

In the following description, the grouping according to the present invention is explained by being discriminated into internal grouping and external grouping. Subsequently, multiple grouping, in which various grouping types coexist, will be explained. And, concepts of domain grouping and data grouping will be explained.

2. Internal Grouping

Internal grouping means that execution of grouping is internally carried out. If internal grouping is carried out in general, a previous group is internally re-grouped to generate a new group or divided groups.

Figure 13:
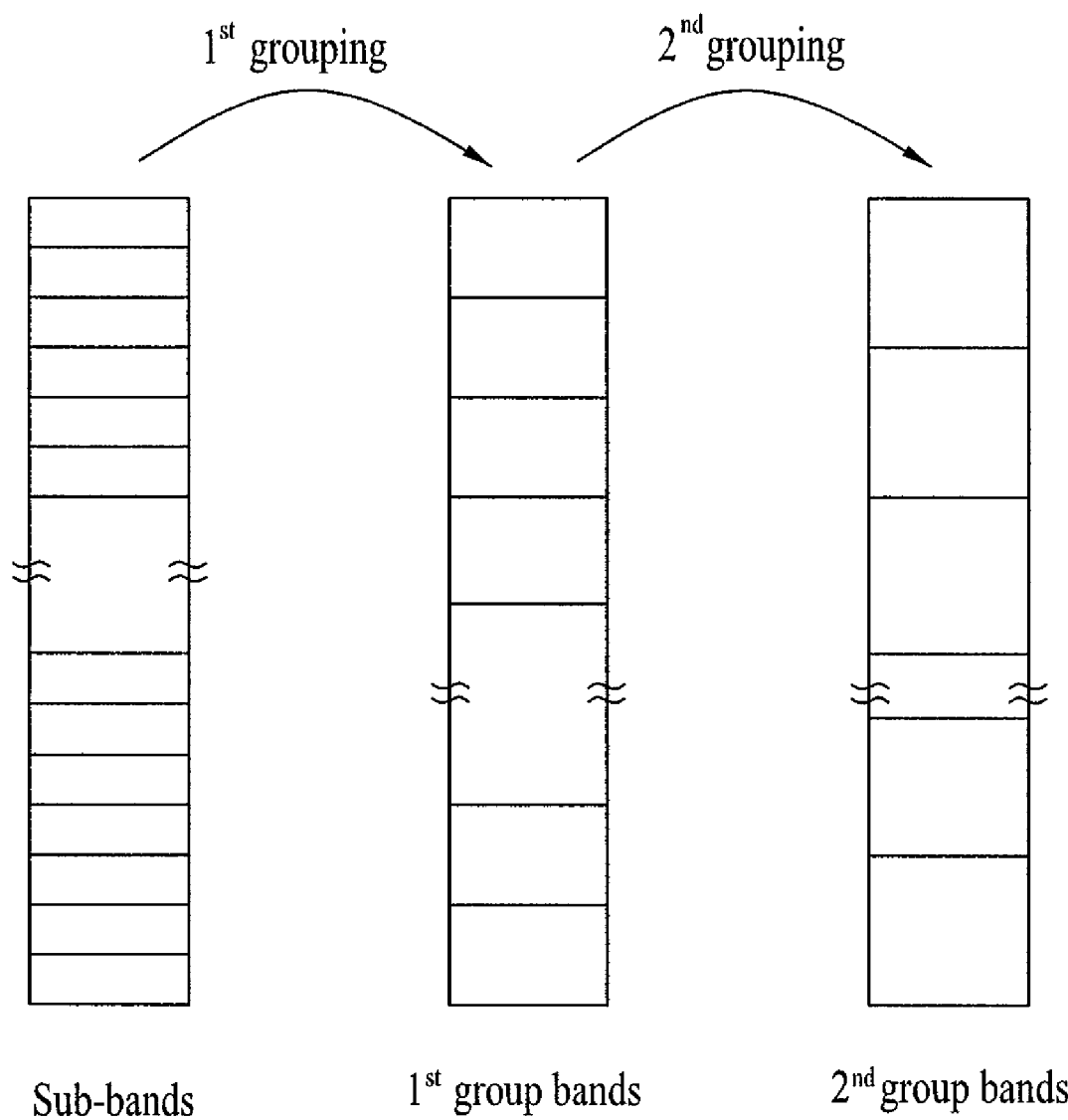
FIG. 13 is a diagram to explaining internal grouping according to the present invention.

FIG. 13 is a diagram to explaining internal grouping according to the present invention.

Referring to FIG. 13, internal grouping according to the present invention is carried out by frequency domain unit (hereinafter named 'band'), for example. So, an internal grouping scheme may correspond to a sort of domain grouping occasionally.

If sampling data passes through a specific filter, e.g., QMF (quadrature mirror filter), a plurality of sub-bands are generated. In the sub-band mode, first frequency grouping is performed to generate first group bands that can be called parameter bands. The first frequency grouping is able to generate parameter bands by binding sub-bands together irregularly. So, it is able to configure sizes of the parameter bands non-equivalently. Yet, according to a coding purpose, it is able to configure the parameter bands equivalently. And, the step of generating the sub-bands can be classified as a sort of grouping.

Subsequently, second frequency grouping is performed on the generated parameter bands to generate second group bands that may be called data bands. The second frequency grouping is able to generate data bands by unifying parameter bands with uniform number.

According to a purpose of the coding after completion of the grouping, it is able to execute coding by parameter band unit corresponding to the first group band or by data band unit corresponding to the second group band.

For instance, in applying the aforesaid PBC coding, it is able to select a pilot reference value (a sort of group reference value) by taking grouped parameter bands as one group or by taking grouped data bands as one group. The PBC is carried out using the selected pilot reference value and detailed operations of the PBC are the same as explained in the foregoing description.

For another instance, in applying the aforesaid DIFF coding, a group reference value is decided by taking grouped parameter bands as one group and a difference value is then calculated. Alternatively, it is also possible to decide a group reference value by taking grouped data bands as one group and to calculate a difference value. And, detailed operations of the DIFF are the same as explained in the foregoing description.

If the first and/or frequency grouping is applied to actual coding, it is necessary to transfer corresponding information, which will be explained with reference to FIG. 23 later.

3. External Grouping

External grouping means a case that execution of grouping is externally carried out. If external grouping is carried out in general, a previous group is externally re-grouped to generate a new group or combined groups.

Figure 14:
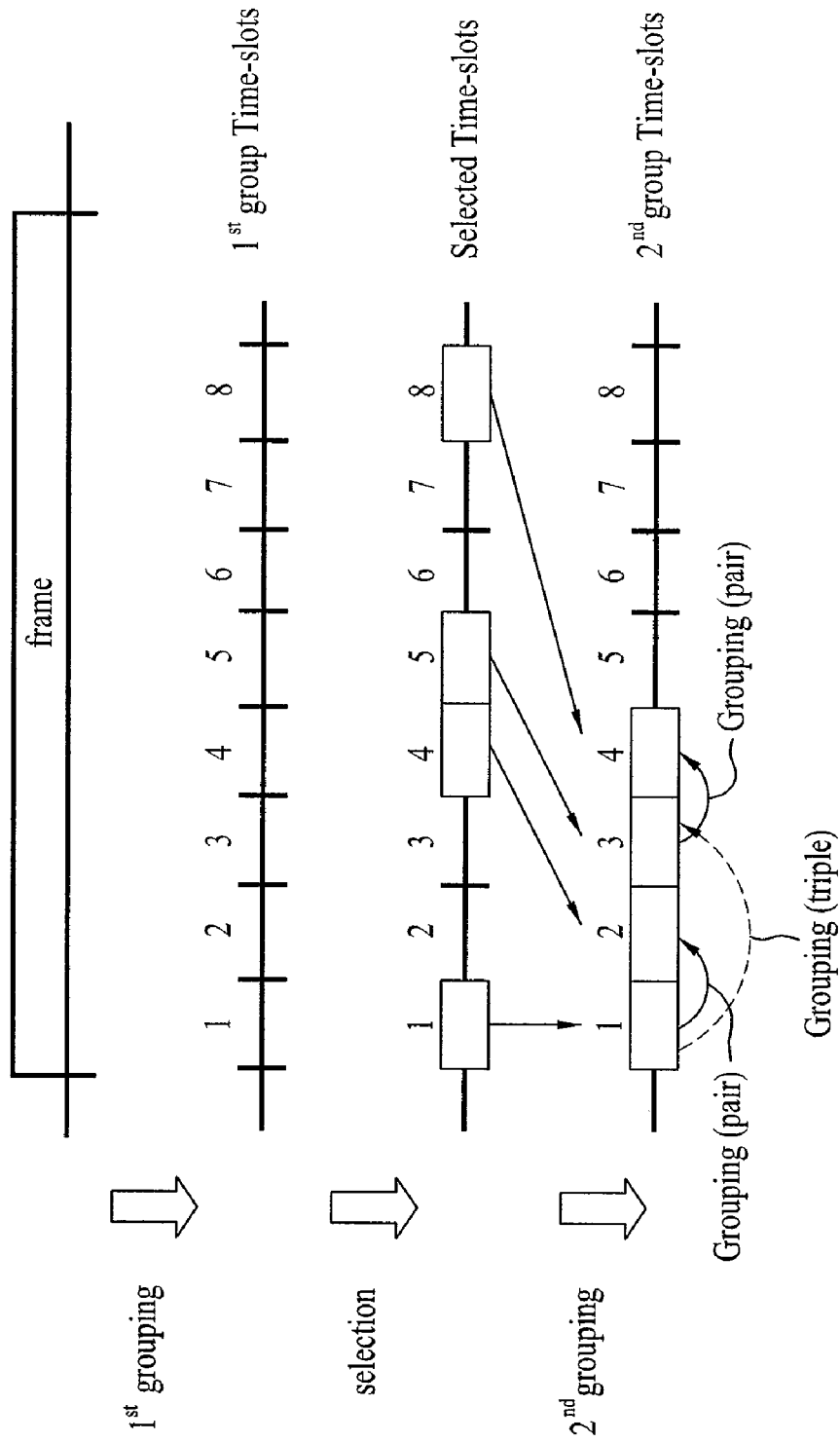
FIG. 14 is a diagram to explaining external grouping according to the present invention.

FIG. 14 is a diagram to explaining external grouping according to the present invention.

Referring to FIG. 14, external grouping according to the present invention is carried out by time domain unit (hereinafter named 'timeslot'), for example. So, an external grouping scheme may correspond to a sort of domain grouping occasionally.

First time grouping is performed on a frame including sampling data to generate first group timeslots. FIG. 14 exemplarily shows that eight timeslots are generated. The first time grouping has a meaning of dividing a frame into timeslots in equal size as well.

At least one of the timeslots generated by the first time grouping is selected. FIG. 14 shows a case that timeslots 1, 4, 5, and 8 are selected. According to a coding scheme, it is able to select the entire timeslots in the selecting step.

The selected timeslots 1, 4, 5, and 8 are then rearranged into timeslots 1, 2, 3 and 4. Yet, according to an object of coding, it is able to rearrange the selected timeslots 1, 4, 5, and 8 in part. In this case, since the timeslot(s) excluded from the rearrangement is excluded from final group formation, it is excluded from the PBC or DIFF coding targets.

Second time grouping is performed on the selected timeslots to configure a group handled together on a final time axis.

For instance, timeslots 1 and 2 or timeslots 3 and 4 can configure one group, which is called a timeslot pair. For another instance, timeslots 1, 2 and 3 can configure one group, which is called a timeslot triple. And, a single timeslot is able to exist not to configure a group with another timeslot(s).

In case that the first and second time groupings are applied to actual coding, it is necessary to transfer corresponding information, which will be explained with reference to FIG. 23 later.

4. Multiple Grouping

Multiple grouping means a grouping scheme that generates a final group by mixing the internal grouping, the external grouping and various kinds of other groupings together. As mentioned in the foregoing description, the individual grouping schemes according to the present invention can be applied by being overlapped with each other or in combination with each other. And, the multiple grouping is utilized as a scheme to raise efficiency of various coding schemes.

4-1. Mixing Internal Grouping and External Grouping

Figure 15:
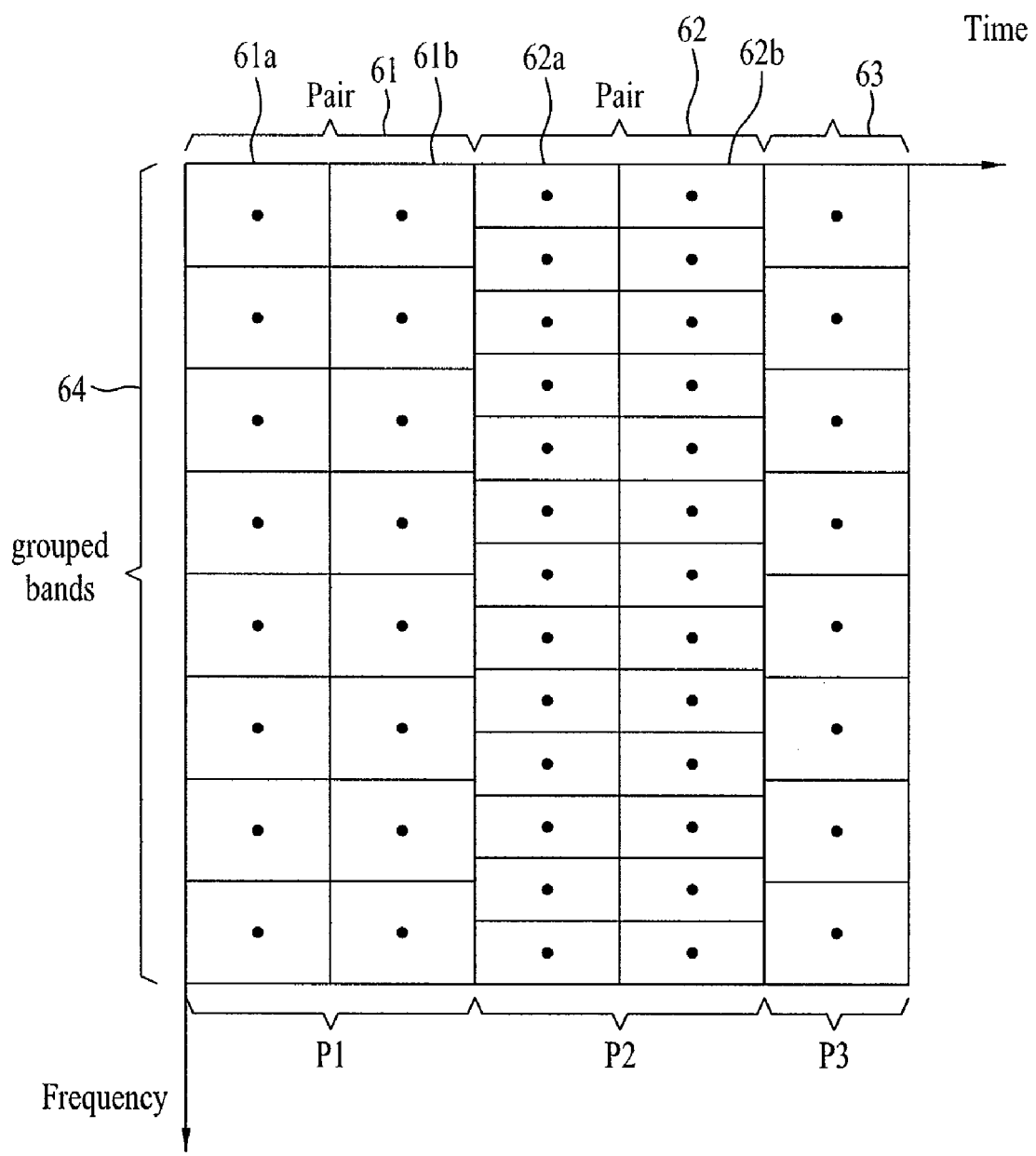
FIG. 15 is a diagram to explain multiple grouping according to the present invention.

FIG. 15 is a diagram to explain multiple grouping according to the present invention, in which internal grouping and external grouping are mixed.

Referring to FIG. 15, final grouped bands 64 are generated after internal grouping has been completed in frequency domain. And, final timeslots 61, 62 and 63 are generated after external grouping has been completed in time domain.

One individual timeslot after completion of grouping is named a data set. In FIG. 15, reference numbers 61*a*, 61*b*, 62*a*, 62*b* and 63 indicate data sets, respectively.

In particular two data sets 61*a* and 61*b* or another two data sets 62*a* and 62*b* are able to configure a pair by external grouping. The pair of the data sets is called 'data pair'.

After completion of the multiple grouping, PBC or DIFF coding application is executed.

For instance, in case of executing the PBC coding, a pilot reference value P1, P2 or P3 is selected for the finally completed data pair 61 or 62 or each data set 63 not configuring the data pair. The PBC coding is then executed using the selected pilot reference values.

For instance, in case of executing the DIFF coding, a DIFF coding type is decided for each of the data sets 61*a*, 61*b*, 62*a*, 62*b* and 63. As mentioned in the foregoing description, a DIFF direction should be decided for each of the data sets and is decided as one of 'DIFF-DF' and 'DIFF-DT'. A process for executing the DIFF coding according to the decided DIFF coding scheme is the same as mentioned in the foregoing description.

In order to configure a data pair by executing external grouping in multiple grouping, equivalent internal grouping should be performed on each of the data sets configuring the data pair.

For instance, each of the data sets 61*a* and 61*b* configuring a data pair has the same data band number. And, each of the data sets 62*a* and 62*b* configuring a data pair has the same data band number. Yet, there is no problem in that the data sets belonging to different data pairs, e.g., 61*a* and 62*a*, respectively may differ from each other in the data band number. This means that different internal grouping can be applied to each data pair.

In case of configuring a data pair, it is able to perform first grouping by internal grouping and second grouping by external grouping.

For instance, a data band number after second grouping corresponds to a prescribed multiplication of a data band number after first grouping. This is because each data set configuring a data pair has the same data band number.

4-2. Mixing Internal Grouping and Internal Grouping

Figure 16:
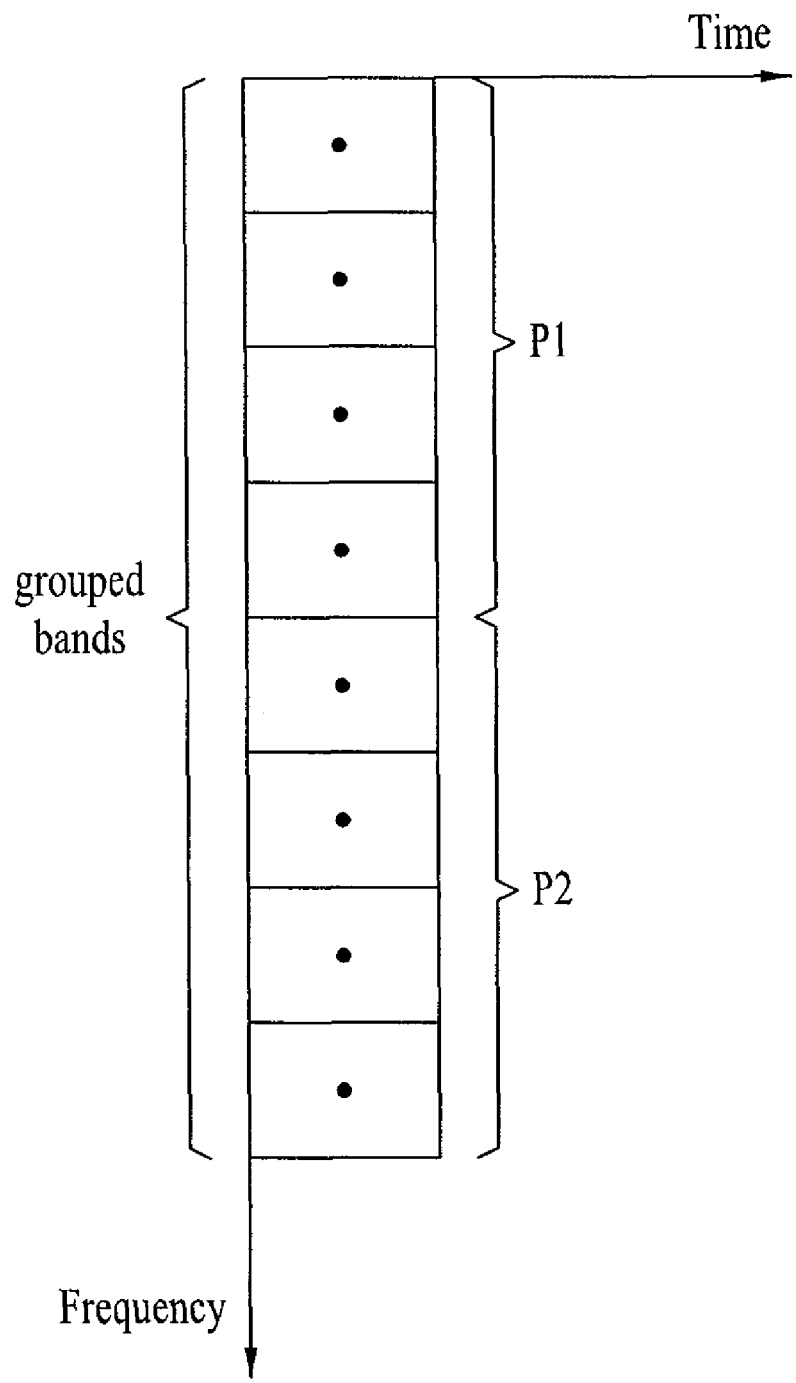
FIGS. 16 and 17 are diagrams to explain mixed grouping according to another embodiments of the present invention, respectively.
Figure 17:
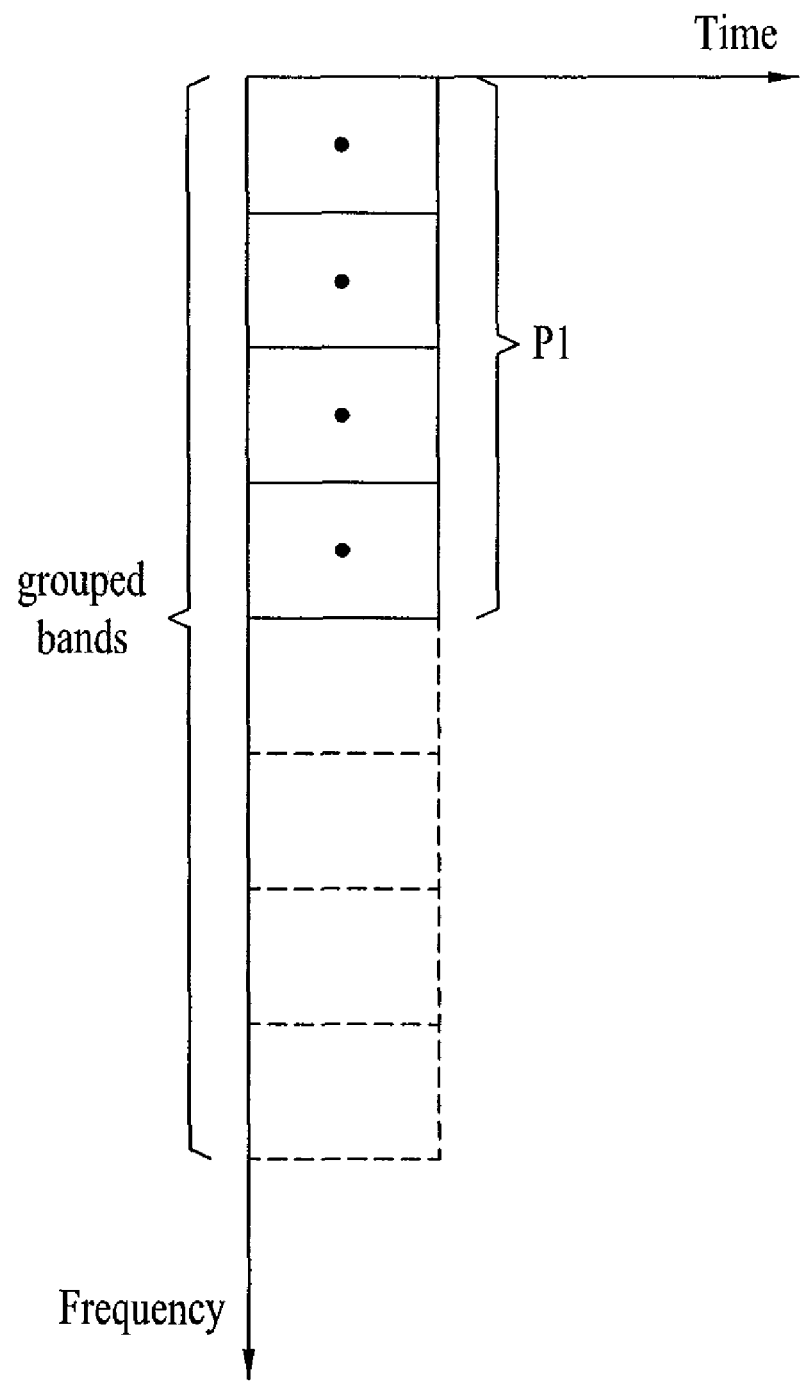

FIGS. 16 and 17 are diagrams to explain mixed grouping according to another embodiments of the present invention, respectively. In particular, FIGS. 16 and 17 intensively show mixing of internal groupings. So, it is apparent that external grouping is performed or can be performed in FIG. 16 or FIG. 17.

For instance, FIG. 16 shows a case that internal grouping is performed again on a case that data bands are generated after completion of the second frequency grouping. In particular, the data bands generated by the second frequency grouping are divided into low frequency band and high frequency band. In case of specific coding, it is necessary to utilize the low frequency band or the high frequency band separately. In particular, a case of separating the low frequency band and the high frequency band to utilize is called 'dual mode'.

So, in case of dual mode, data coding is performed by taking the finally generated low or high frequency band as one group. For instance, pilot reference values P1 and P2 are generated for low and high frequency bands, respectively and PBC coding is then performed within the corresponding frequency band.

The dual mode is applicable according to characteristics per channel. So, this is called 'channel grouping'. And, the dual mode is differently applicable according to a data type as well.

For instance, FIG. 17 shows a case that internal grouping is performed again on a case that data bands are generated after completion of the aforesaid second frequency grouping. Namely, the data bands generated by the second frequency grouping are divided into low frequency band and high frequency band. In case of specific coding, the low frequency band is utilized only but the high frequency band needs to be discarded. In particular, a case of grouping the low frequency band to utilize only is called 'low frequency channel (LFE) mode'.

In the low frequency channel (LFE) mode', data coding is performed by taking the finally generated low frequency band as one group.

For instance, a pilot reference value P1 is generated for a low frequency band and PBC coding is then performed within the corresponding low frequency band. Yet, it is possible to generate new data bands by performing internal grouping on a selected low frequency band. This is to intensively group the low frequency band to represent.

And, the low frequency channel (LFE) mode is applied according to a low frequency channel characteristic and can be called 'channel grouping'.

5. Domain Grouping and Data Grouping

Grouping can be classified into domain grouping and data grouping with reference to targets of the grouping.

The domain grouping means a scheme of grouping units of domains on a specific domain (e.g., frequency domain or time domain). And, the domain grouping can be executed through the aforesaid internal grouping and/or external grouping.

And, the data grouping means a scheme of grouping data itself. The data grouping can be executed through the aforesaid internal grouping and/or external grouping.

In a special case of data grouping, grouping can be performed to be usable in entropy coding. For instance, the data grouping is used in entropy coding real data in a finally completed grouping state shown in FIG. 15. Namely, data are processed in a manner that two data neighboring to each other in one of frequency direction and time direction are bound together.

Yet, in case that the data grouping is carried out in the above manner, data within a final group are re-grouped in part. So, PBC or DIFF coding is not applied to the data-grouped group (e.g., two data) only. Besides, an entropy coding scheme corresponding to the data grouping will be explained later.

6. Signal Processing Method Using Grouping

6-1. Signal Processing Method Using Internal Grouping at Least

A signal processing method and apparatus using the aforesaid grouping scheme according to the present invention are explained as follows.

A method of processing a signal according to one embodiment of the present invention includes the steps of obtaining a group reference value corresponding to a plurality of data included in one group and a difference value corresponding to the group reference value through first grouping and internal grouping for the first grouping and obtaining the data using the group reference value and the difference value.

The present invention is characterized in that a number of the data grouped by the first grouping is greater than a number of the data grouped by the internal grouping. In this case, the group reference value can be a pilot reference value or a difference reference value.

The method according to one embodiment of the present invention further includes the step of decoding at least one of the group reference value and the difference value. In this case, the pilot reference value is decided per the group.

And, numbers of the data included in internal groups through the internal grouping are set in advance, respectively. In this case, the numbers of the data included in the internal groups are different from each other.

The first grouping and the internal grouping are performed on the data on a frequency domain. In this case, the frequency domain may correspond to one of a hybrid domain, a parameter band domain, a data band domain and a channel domain.

And, the present invention is characterized in that a first group by the first grouping includes a plurality of internal groups by the internal grouping.

The frequency domain of the present invention is discriminated by a frequency band. The frequency band becomes sub-bands by the internal grouping. The sub-bands become parameter bands by the internal grouping. The parameter bands become data bands by the internal grouping. In this case, a number of the parameter bands can be limited to maximum 28. And, the parameter bands are grouped by 2, 5 or 10 into one data band.

An apparatus for processing a signal according to one embodiment of the present invention includes a value obtaining part obtaining a group reference value corresponding to a plurality of data included in one group and a difference value corresponding to the group reference value through first grouping and internal grouping for the first grouping and a data obtaining part obtaining the data using the group reference value and the difference value.

A method of processing a signal according to another embodiment of the present invention includes the steps of generating a difference value using a group reference value corresponding to a plurality of data included in one group through first grouping and internal grouping for the first grouping and the data and transferring the generated difference value.

And, an apparatus for processing a signal according to another embodiment of the present invention includes a value generating part generating a difference value using a group reference value corresponding to a plurality of data included in one group through first grouping and internal grouping for the first grouping and the data and an outputting part transferring the generated difference value.

6-2. Signal Processing Method Using Multiple Grouping

A signal processing method and apparatus using the aforesaid grouping scheme according to the present invention are explained as follows.

A method of processing a signal according to one embodiment of the present invention includes the steps of obtaining a group reference value corresponding to a plurality of data included in one group through grouping and a difference value corresponding to the group reference value and obtaining the data using the group reference value and the difference value.

In this case, the group reference value can be one of a pilot reference value and a difference reference value.

And, the grouping may correspond to one of external grouping and external grouping.

Moreover, the grouping may correspond to one of domain grouping and data grouping.

The data grouping is performed on a domain group. And, a time domain included in the domain grouping includes at least one of a timeslot domain, a parameter set domain and a data set domain.

A frequency domain included in the domain grouping may include at least one of a sample domain, a sub-band domain, a hybrid domain, a parameter band domain, a data band domain and a channel domain.

One difference reference value will be set from a plurality of the data included in the group. And, at least one of a grouping count, a grouping range and a presence or non-presence of the grouping is decided.

An apparatus for processing a signal according to one embodiment of the present invention includes a value obtaining part obtaining a group reference value corresponding to a plurality of data included in one group through grouping and a difference value corresponding to the group reference value and a data obtaining part obtaining the data using the group reference value and the difference value.

A method of processing a signal according to another embodiment of the present invention includes the steps of generating a difference value using a group reference value corresponding to a plurality of data included in one group through grouping and the data and transferring the generated difference value.

An apparatus for processing a signal according to another embodiment of the present invention includes a value generating part generating a difference value using a group reference value corresponding to a plurality of data included in one group through grouping and the data and an outputting part transferring the generated difference value.

A method of processing a signal according to another embodiment of the present invention includes the steps of obtaining a group reference value corresponding to a plurality of data included in one group through grouping including first grouping and second grouping and a first difference value corresponding to the group reference value and obtaining the data using the group reference value and the first difference value.

In this case, the group reference value may include a pilot reference value or a difference reference value.

The method further includes the step of decoding at least one of the group reference value and the first difference value. And, the first pilot reference value is decided per the group.

The method further includes the steps of obtaining a second pilot reference value corresponding to a plurality of the first pilot reference values and a second difference value corresponding to the second pilot reference value and obtaining the first pilot reference value using the second pilot reference value and the second difference value.

In this case, the second grouping may include external or internal grouping for the first grouping.

The grouping is performed on the data on at least one of a time domain and a frequency domain. In particular, the grouping is a domain grouping that groups at least one of the time domain and the frequency domain.

The time domain may include a timeslot domain, a parameter set domain or a data set domain.

The frequency domain may include a sample domain, a sub-band domain, a hybrid domain, a parameter band domain, a data band domain or a channel domain. And, the grouped data is an index or parameter.

The first difference value is entropy-decoded using an entropy table indicated by the index included in one group through the first grouping. And, the data is obtained using the group reference value and the entropy-decoded first difference value.

The first difference value and the group reference value are entropy-decoded using an entropy table indicated by the index included in one group through the first grouping. And, the data is obtained using the entropy-decoded group reference value and the entropy-decoded first difference value.

An apparatus for processing a signal according to another embodiment of the present invention includes a value obtaining part obtaining a group reference value corresponding to a plurality of data included in one group through grouping including first grouping and second grouping and a difference value corresponding to the group reference value and a data obtaining part obtaining the data using the group reference value and the difference value.

A method of processing a signal according to another embodiment of the present invention includes the steps of generating a difference value using a group reference value corresponding to a plurality of data included in one group through grouping including first grouping and second grouping and the data and transferring the generated difference value.

An apparatus for processing a signal according to another embodiment of the present invention includes a value generating part generating a difference value using a group reference value corresponding to a plurality of data included in one group through grouping including first grouping and second grouping and the data and an outputting part transferring the generated difference value.

A method of processing a signal according to another embodiment of the present invention includes the steps of obtaining a group reference value corresponding to a plurality of data included in one group through first grouping and external grouping for the first grouping and a difference value corresponding to the group reference value and obtaining the data using the group reference value and the difference value.

In this case, a first data number corresponding to a number of the data grouped by the first grouping is smaller than a second data number corresponding to a number of the data grouped by the external grouping. And, a multiplication relation exists between the first data number and the second data number.

The group reference value may include a pilot reference value or a difference reference value.

The method further includes the step of decoding at least one of the group reference value and the difference value.

The pilot reference value is decoded per the group.

The grouping is performed on the data on at least one of a time domain and a frequency domain. The time domain may include a timeslot domain, a parameter set domain or a data set domain. And, the frequency domain may include a sample domain, a sub-band domain, a hybrid domain, a parameter band domain, a data band domain or a channel domain.

The method further includes the step of reconstructing the audio signal using the obtained data as parameters. And, the external grouping may include paired parameters.

An apparatus for processing a signal according to another embodiment of the present invention includes a value obtaining part obtaining a group reference value corresponding to a plurality of data included in one group through first grouping and external grouping for the first grouping and a difference value corresponding to the group reference value and a data obtaining part obtaining the data using the group reference value and the difference value.

A method of processing a signal according to a further embodiment of the present invention includes the steps of generating a difference value using a group reference value corresponding to a plurality of data included in one group through first grouping and external grouping for the first grouping and the data and transferring the generated difference value.

And, an apparatus for processing a signal according to a further embodiment of the present invention includes a value generating part generating a difference value using a group reference value corresponding to a plurality of data included in one group through first grouping and external grouping for the first grouping and the data and an outputting part transferring the generated difference value.

6.3. Signal Processing Method Using Data Grouping at Least

A signal processing method and apparatus using the aforesaid grouping scheme according to the present invention are explained as follows.

A method of processing a signal according to one embodiment of the present invention includes the steps of obtaining a group reference value corresponding to a plurality of data included in one group through data grouping and internal grouping for the data grouping and a difference value corresponding to the group reference value and obtaining the data using the group reference value and the difference value.

In this case, a number of the data included in the internal grouping is smaller than a number of the data included in the data grouping. And, the data correspond to parameters.

The internal grouping is performed on a plurality of the data-grouped data entirely. In this case, the internal grouping can be performed per a parameter band.

The internal grouping can be performed on a plurality of the data-grouped data partially. In this case, the internal grouping can be performed per a channel of each of a plurality of the data-grouped data.

The group reference value can include a pilot reference value or a difference reference value.

The method may further include the step of decoding at least one of the group reference value and the difference value. In this case, the pilot reference value is decided per the group.

The data grouping and the internal grouping are performed on the data on a frequency domain.

The frequency domain may include one of a sample domain, a sub-band domain, a hybrid domain, a parameter band domain, a data band domain and a channel domain. In obtaining the data, grouping information for at least one of the data grouping and the internal grouping is used.

The grouping information includes at least one of a position of each group, a number of each group, a presence or non-presence of applying the group reference value per a group, a number of the group reference values, a codec scheme of the group reference value and a presence or non-presence of obtaining the group reference value.

An apparatus for processing a signal according to one embodiment of the present invention includes a value obtaining part obtaining a group reference value corresponding to a plurality of data included in one group through data grouping and internal grouping for the data grouping and a difference value corresponding to the group reference value and a data obtaining part obtaining the data using the group reference value and the difference value.

A method of processing a signal according to another embodiment of the present invention includes the steps of generating a difference value using a group reference value corresponding to a plurality of data included in one group through data grouping and internal grouping for the data grouping and the data and transferring the generated difference value.

And, an apparatus for processing a signal according to another embodiment of the present invention includes a value generating part generating a difference value using a group reference value corresponding to a plurality of data included in one group through data grouping and internal grouping for the data grouping and the data and an outputting part transferring the generated difference value.

Entropy Coding

1. Concept of Entropy Coding

Entropy coding according to the present invention means a process for performing variable length coding on a result of the data coding.

In general, entropy coding processes occurrence probability of specific data in a statistical way. For instance, transmission efficiency is raised overall in a manner of allocating less bits to data having high frequency of occurrence in probability and more bits to data having low frequency of occurrence in probability.

And, the present invention intends to propose an efficient entropy coding method, which is different from the general entropy coding, interconnected with the PBC coding and the DIFF coding.

1-1. Entropy Table

First of all, a predetermined entropy table is necessary for entropy coding. The entropy table is defined as a codebook. And, an encoding part and a decoding part use the same table.

The present invention proposes an entropy coding method and a unique entropy table to process various kinds of data coding results efficiently.

1-2. Entropy Coding Types (1D/2D)

Entropy coding of the present invention is classified into two types. One is to derive one index (index 1) through one entropy table, and the other is to derive two consecutive indexes (index 1 and index 2) through one entropy table. The former is named '1D (one-dimensional) entropy coding' and the latter is named '2D (two-dimensional) entropy coding'.

Figure 18:
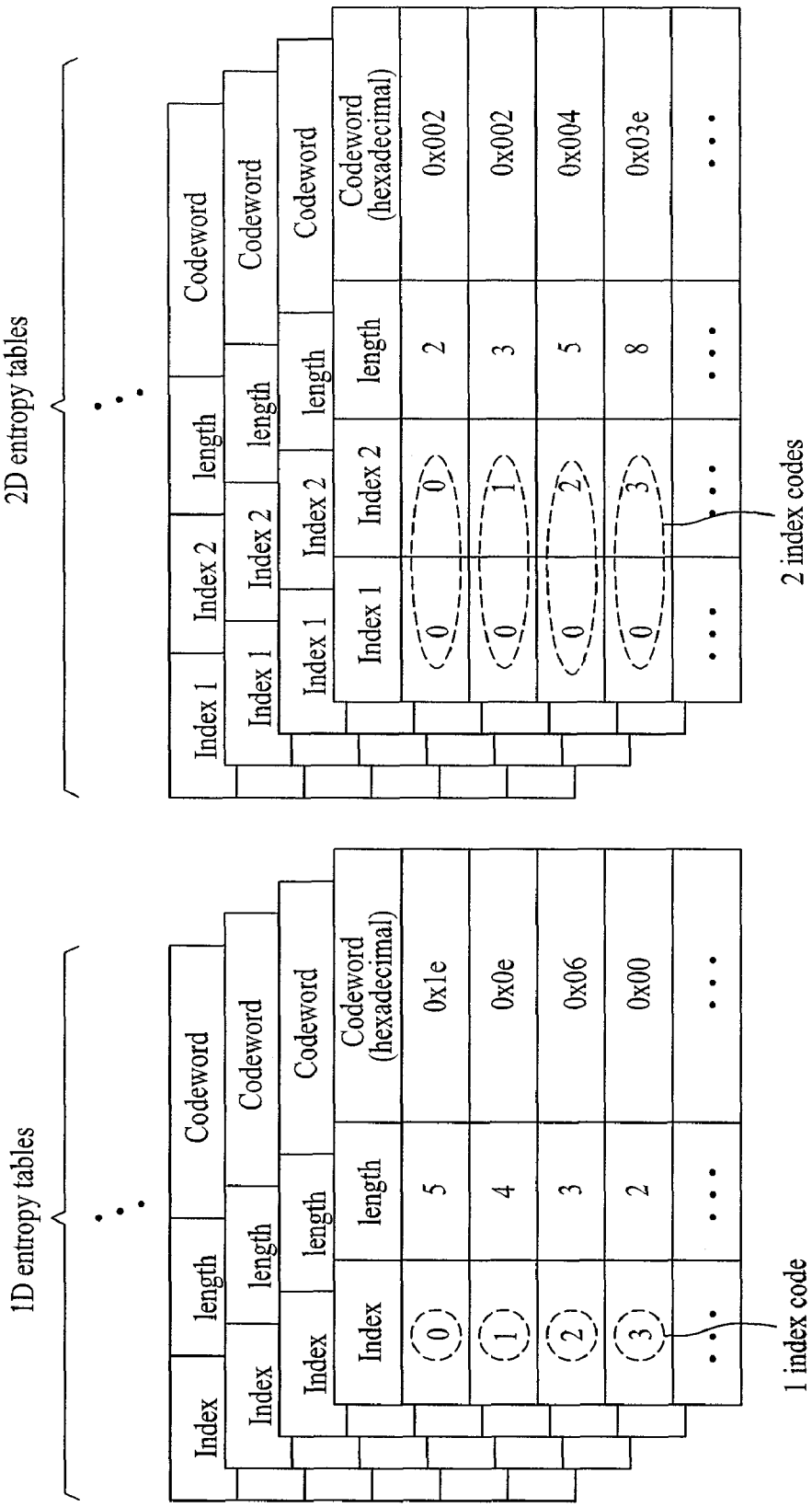
FIG. 18 is an exemplary diagram of 1D and 2D entropy table according to the present invention.

FIG. 18 is an exemplary diagram of 1D and 2D entropy table according to the present invention. Referring to FIG. 18, an entropy table of the present invention basically includes an index field, a length field and a codeword field.

For instance, if specific data (e.g., pilot reference value, difference value, etc.) is calculated through the aforesaid data coding, the corresponding data (corresponding to 'index') has a codeword designated through the entropy table. The codeword turns into a bitstream and is then transferred to a decoding part.

An entropy decoding part having received the codeword decides the entropy table having used for the corresponding data and then derives an index value using the corresponding codeword and a bit length configuring the codeword within the decided table. In this case, the present invention represents a codeword as hexadecimal.

A positive sign (+) or a negative sign (−) of an index value derived by 1D or 2D entropy coding is omitted. So, it is necessary to assign the sign after completion of the 1D or 2D entropy coding.

In the present invention, the sign is assigned differently according to 1D or 2D.

For instance, in case of 1D entropy coding, if a corresponding index is not '0', a separate 1-bit sign bit (e.g., 'bsSign') is allocated and transferred.

In case of 2D entropy coding, since two indexes are consecutively extracted, whether to allocate a sign bit is decided in a manner of programming a relation between the two extracted indexes. In this case, the program uses an added value of the two extracted indexes, a difference value between the two extracted indexes and a maximum absolute value (lav) within a corresponding entropy table. This is able to reduce a number of transmission bits, compared to a case that a sign bit is allocated to each index in case of a simple 2D.

The 1D entropy table, in which indexes are derived one by one, is usable for all data coding results. Yet, the 2D entropy table, in which two indexes are derived each, has a restricted use for a specific case.

For instance, if data coding is not a pair through the aforesaid grouping process, the 2D entropy table has a restricted use in part. And, a use of the 2D entropy table is restricted on a pilot reference value calculated as a result of PBC coding.

Therefore, as mentioned in the foregoing description, entropy coding of the present invention is characterized in utilizing a most efficient entropy coding scheme in a manner that entropy coding is interconnected with the result of data coding. This is explained in detail as follows.

1-3. 2D Method (Time Pairing/Frequency Paring)

Figure 19:
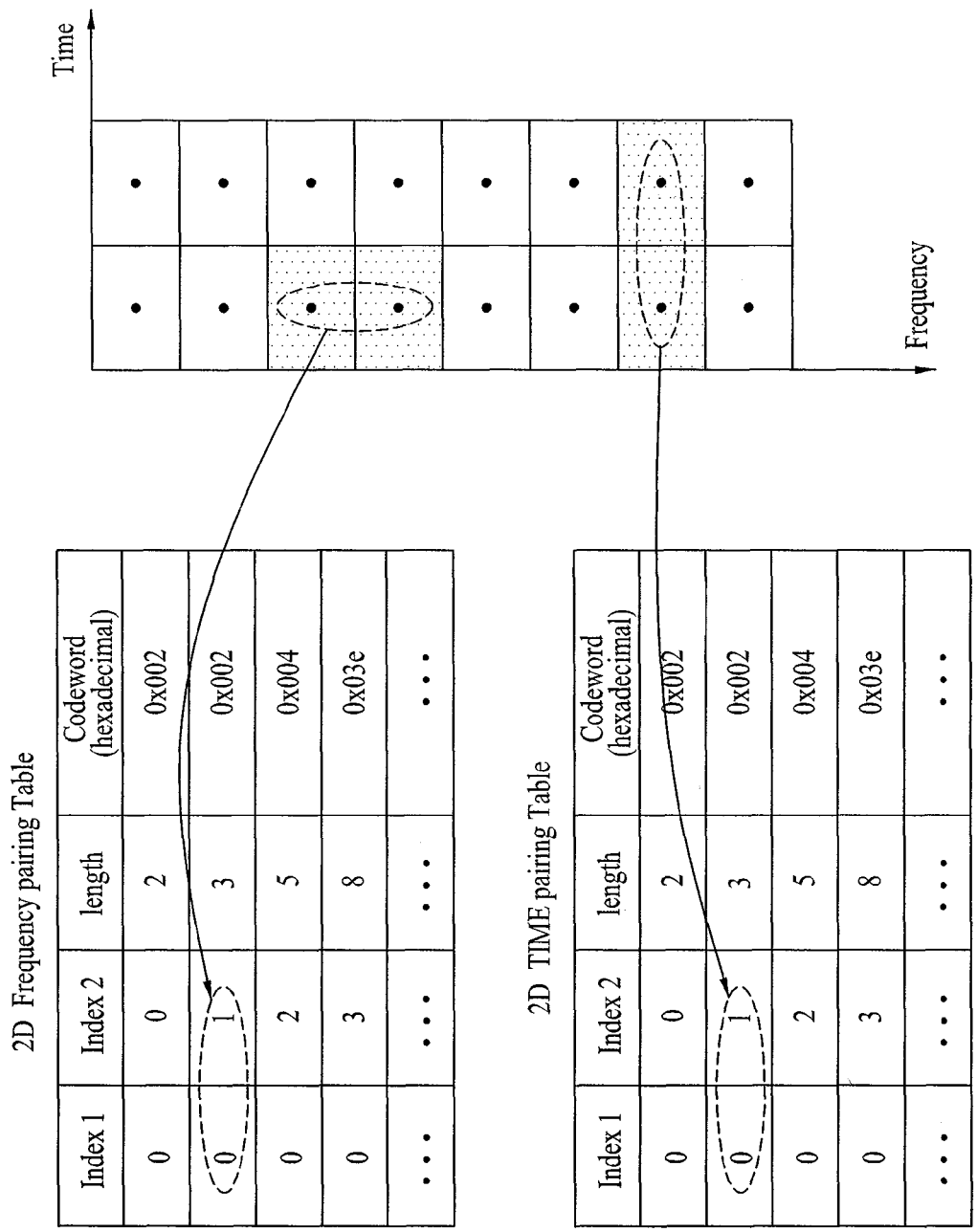
FIG. 19 is an exemplary diagram of two methods for 2D entropy coding according to the present invention.

FIG. 19 is an exemplary diagram of two methods for 2D entropy coding according to the present invention. 2D entropy coding is a process for deriving two indexes neighboring to each other. So, the 2D entropy coding can be discriminated according to a direction of the two consecutive indexes.

For instance, a case that two indexes are neighbor to each other in frequency direction is called '2D-Freqeuncy Pairing (hereinafter abbreviated 2D-FP)'. And, a case that two indexes are neighbor to each other in time direction is called '2D-Time Pairing (hereinafter abbreviated 2D-TP)'.

Referring to FIG. 19, the 2D-FP and the 2D-TP are able to configure separate index tables, respectively. An encoder has to decide a most efficient entropy coding scheme according to a result of data decoding.

A method of deciding entropy coding interconnected with data coding efficiently is explained in the following description.

1-4. Entropy Coding Signal Processing Method

A method of processing a signal using entropy coding according to the present invention is explained as follows.

In a method of processing a signal according to one embodiment of the present invention, a reference value corresponding to a plurality of data and a difference value corresponding to the reference value are obtained. Subsequently, the difference value is entropy-decoded. The data is then obtained using the reference value and the entropy-decoded difference value.

The method further includes the step of entropy-decoding the reference value. And, the method may further include the step of obtaining the data using the entropy-decoded reference value and the entropy-decoded difference value.

The method can further include the step of obtaining entropy coding identification information. And, the entropy coding is performed according to an entropy coding scheme indicated by the entropy coding identification information.

In this case, the entropy coding scheme is one of a 1D coding scheme and a multi-dimensional coding scheme (e.g., 2D coding scheme). And, the multi-dimensional coding scheme is one of a frequency pair (FP) coding scheme and a time pair (TP) coding scheme.

The reference value may include one of a pilot reference value and a difference reference value.

And, the signal processing method can further include the step of reconstructing the audio signal using the data as parameters.

An apparatus for processing a signal according to one embodiment of the present invention includes a value obtaining part obtaining a reference value corresponding to a plurality of data and a difference value corresponding to the reference value, an entropy decoding part entropy-decoding the difference value, and a data obtaining part obtaining the data using the reference value and the entropy-decoded difference value.

In this case, the value obtaining part is included in the aforesaid bitstream demultiplexing part 60 and the data obtaining part is included within the aforesaid data decoding part 91 or 92.

A method of processing a signal according to another embodiment of the present invention includes the steps of generating a difference value using a reference value corresponding to a plurality of data and the data, entropy-encoding the generated difference value, and outputting the entropy-encoded difference value.

In this case, the reference value is entropy-encoded. The entropy-encoded reference value is transferred.

The method further includes the step of generating an entropy coding scheme used for the entropy encoding. And, the generated entropy coding scheme is transferred.

An apparatus for processing a signal according to another embodiment of the present invention includes a value generating part generating a difference value using a reference value corresponding to a plurality of data and the data, an entropy encoding part entropy-encoding the generated difference value, and an outputting part outputting the entropy-encoded difference value.

In this case, the value generating part is included within the aforesaid data encoding part 31 or 32. And, the outputting part is included within the aforesaid bitstream multiplexing part 50.

A method of processing a signal according to another embodiment of the present invention includes the steps of obtaining data corresponding to a plurality of data coding schemes, deciding an entropy table for at least one of a pilot reference value and a pilot difference value included in the data using an entropy table identifier unique to the data coding scheme, and entropy-decoding at least one of the pilot reference value and the pilot difference value using the entropy table.

In this case, the entropy table identifier is unique to one of a pilot coding scheme, a frequency differential coding scheme and a time differential coding scheme.

And, the entropy table identifier is unique to each of the pilot reference value and the pilot difference value.

The entropy table is unique to the entropy table identifier and includes one of a pilot table, a frequency differential table and a time differential table.

Alternatively, the entropy table is not unique to the entropy table identifier and one of a frequency differential table and a time differential table can be shared.

The entropy table corresponding to the pilot reference value is able to use a frequency differential table. In this case, the pilot reference value is entropy-decoded by the 1D entropy coding scheme.

The entropy coding scheme includes a 1D entropy coding scheme and a 2D entropy coding scheme. In particular, the 2D entropy coding scheme includes a frequency pair (2D-FP) coding scheme and a time pair (2D-TP) coding scheme.

And, the present method is able to reconstruct the audio signal using the data as parameters.

An apparatus for processing a signal according to another embodiment of the present invention includes a value obtaining part obtaining a pilot reference value corresponding to a plurality of data and a pilot difference value corresponding to the pilot reference value and an entropy decoding part entropy-decoding the pilot difference value. And, the apparatus includes a data obtaining part obtaining the data using the pilot reference value and the entropy-decoded pilot difference value.

A method of processing a signal according to a further embodiment of the present invention includes the steps of generating a plot difference value using a pilot reference value corresponding to a plurality of data and the data, entropy-encoding the generated pilot difference value, and transferring the entropy-encoded pilot difference value.

In this case, a table used for the entropy encoding may include a pilot dedicated table.

The method further includes the step of entropy-encoding the pilot reference value. And, the entropy-encoded pilot reference value is transferred.

The method further includes the step of generating an entropy coding scheme used for the entropy encoding. And, the generated entropy coding scheme is transferred.

An apparatus for processing a signal according to a further embodiment of the present invention includes a value generating part generating a plot difference value using a pilot reference value corresponding to a plurality of data and the data, an entropy encoding part entropy-encoding the generated pilot difference value, and an outputting part transferring the entropy-encoded pilot difference value.

2. Relation to Data Coding

As mentioned in the foregoing description, the present invention has proposed three kinds of data coding schemes. Yet, entropy coding is not performed on the data according to the PCM scheme. Relations between PBC coding and entropy coding and relations between DIF coding and entropy coding are separately explained in the following description.

2-1. PBC Coding and Entropy Coding

Figure 20:
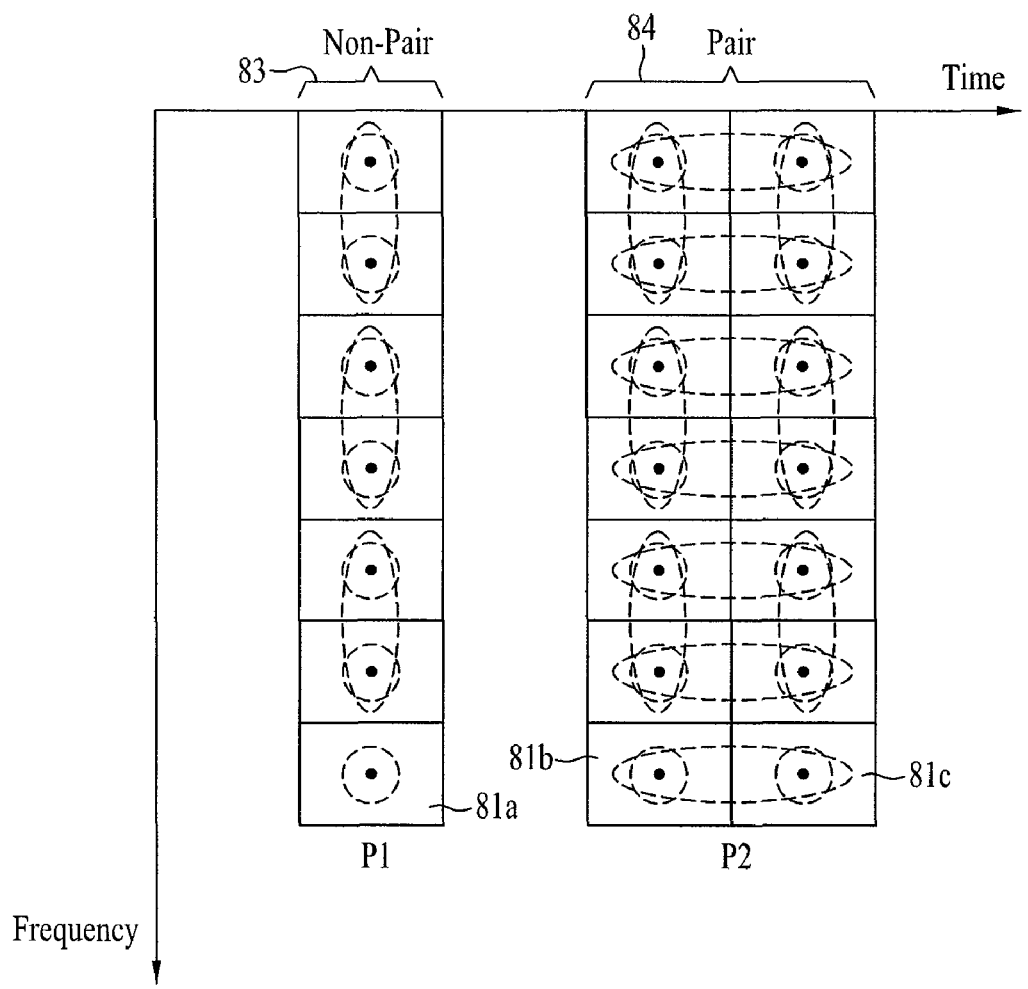
FIG. 20 is a diagram of entropy coding scheme for PBC coding result according to the present invention.
Figure 20:
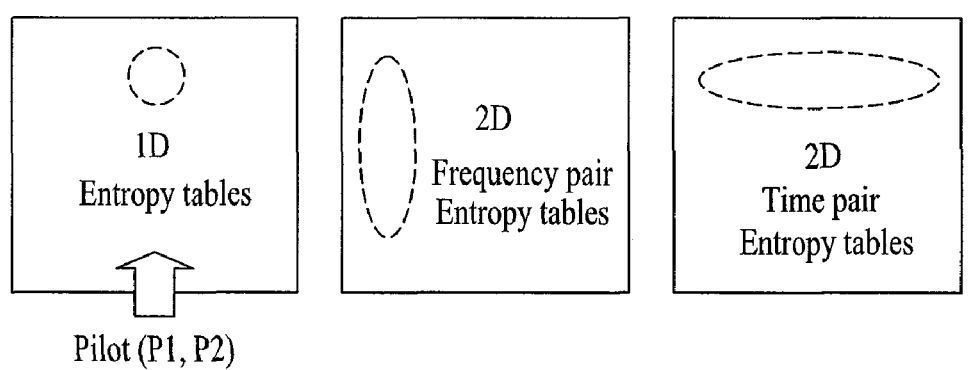

FIG. 20 is a diagram of an entropy coding scheme for PBC coding result according to the present invention.

As mentioned in the foregoing description, after completion of PBC coding, one pilot reference value and a plurality of differences values are calculated. And, all of the pilot reference value and the difference values become targets of entropy coding.

For instance, according to the aforesaid grouping method, a group to which PBC coding will be applied is decided. In FIG. 20, for convenience of explanation, a case of a pair on a time axis and a case of non-pair on a time axis are taken as examples. Entropy coding after completion of PBC coding is explained as follows.

First of all, a case 83 that PBC coding is performed on non-pairs is explained. 1D entropy coding is performed on one pilot reference value becoming an entropy coding target, and 1D entropy coding or 2D-FP entropy coding can be performed on the rest difference values.

In particular, since one group exists for one data set on a time axis in case of non-pair, it is unable to perform 2D-TP entropy coding. Even if 2D-FP is executed, 1D entropy coding should be performed on a parameter value within a last band 81a failing to configure a pair after pairs of indexes have been derived. Once a per-data entropy coding scheme is decided, a codeword is generated using a corresponding entropy table.

Since the present invention relates to a case that one pilot reference value is generated for one group for example, 1D entropy coding should be performed. Yet, in another embodiment of the present invention, if at least two pilot reference values are generated from one group, it may be possible to perform 2D entropy coding on consecutive pilot reference values.

Secondly, a case 84 of performing PBC coding on pairs is explained as follows.

1D entropy coding is performed on one pilot reference value becoming an entropy coding target, and 1D entropy coding, 2D-FP entropy coding or 2D-TP entropy coding can be performed on the rest difference values.

In particular, since one group exists for two data sets neighbor to each other on a time axis in case of pairs, it is able to perform 2D-TP entropy coding. Even if 2D-FP is executed, 1D entropy coding should be performed on a parameter value within a last band 81*b* or 81*c* failing to configure a pair after pairs of indexes have been derived. Yet, as can be confirmed in FIG. 20, in case of applying 2D-TP entropy coding, a last band failing to configure a pair does not exist.

2-2. DIFF Coding and Entropy Coding

Figure 21:
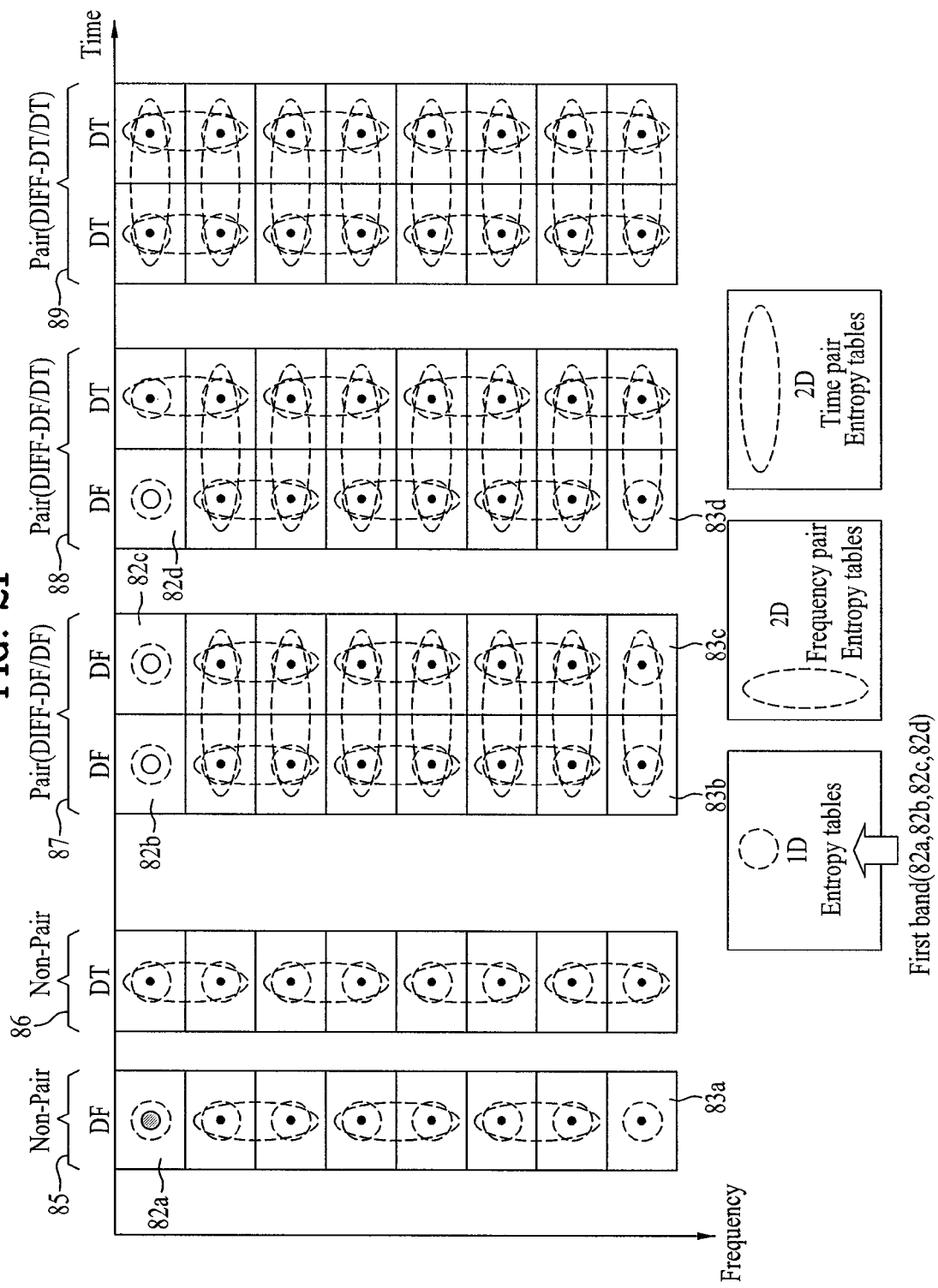
FIG. 21 is a diagram of entropy coding scheme for DIFF coding result according to the present invention.

FIG. 21 is a diagram of entropy coding scheme for DIFF coding result according to the present invention.

As mentioned in the foregoing description, after completion of DIFF coding, one pilot reference value and a plurality of differences values are calculated. And, all of the pilot reference value and the difference values become targets of entropy coding. Yet, in case of DIFF-DT, a reference value may not exist.

For instance, according to the aforesaid grouping method, a group to which DIFF coding will be applied is decided. In FIG. 21, for convenience of explanation, a case of a pair on a time axis and a case of non-pair on a time axis are taken as examples. And, FIG. 21 shows a case that a data set as a unit of data coding is discriminated into DIFF-DT in time axis direction and DIFF-DF in frequency axis direction according to DIFF coding direction.

Entropy coding after completion of DIFF coding is explained as follows.

First of all, a case that DIFF coding is performed on non-pairs is explained. In case of non-pairs, one data set exists on a time axis. And, the data set may become DIFF-DF or DIFF-DT according to DIF coding direction.

For instance, if one data set of non-pair is DIFF-DF (85), a reference value becomes a parameter value within a first band 82*a*. 1D entropy coding is performed on the reference value and 1D entropy coding or 2D-FP entropy coding can be performed on the rest difference values.

Namely, in case of DIFF-DF as well as non-pair, one group for one data set exists on a time axis. So, it is unable to perform 2D-TP entropy coding. Even if 2D-FP is executed, after pairs of indexes have been derived, 1D entropy coding should be performed on a parameter value within a last parameter band 83*a* failing to configure a pair. Once a coding scheme is decoded for each data, a codeword is generated using a corresponding entropy table.

For instance, in case that one data set of non-pair is DIFF-DT (86), since a reference value does not exist within the corresponding data set, 'first band' processing is not performed. So, 1D entropy coding or 2D-FP entropy coding can be performed on the difference values.

In case of DIFF-DT as well as non-pair, a data set to find a difference value may be a neighbor data set failing to configure a data pair or a data set within another audio frame.

Namely, in case of DIFF-DT as well as non-pair (86), there exists one group for one data set on a time axis. So, it is unable to perform 2D-TP entropy coding. Even if 2D-FP is executed, after pairs of indexes have been derived, 1D entropy coding should be performed on a parameter value within a last parameter band failing to configure a pair. Yet, FIG. 21 just shows a case that a last band failing to configure a pair does not exist, for example.

Once a coding scheme is decoded for each data, a codeword is generated using a corresponding entropy table.

Secondly, a case that DIFF coding is performed on pairs is explained. In case that data coding is performed on pairs, two data sets configure one group on a time axis. And, each of the data sets within the group can become DIFF-DF or DIFF-DT according to DIFF coding direction. So, it can be classified into a case that both two data sets configuring a pair are DIFF-DF (87), a case that both two data sets configuring a pair are DIFF-DT, and a case that two data sets configuring a pair have different coding directions (e.g., DIFF-DF/DT or DIFF-DT/DF), respectively (88).

For instance, in case that both two data sets configuring a pair are DIFF-DF (i.e., DIFF-DF/DF) (87), if each of the data sets is non-paired and DIFF-DF, if all available entropy coding schemes are executable.

For instance, each reference value within the corresponding data set becomes a parameter value within a first band 82*b* or 82*c* and 1D entropy coding is performed on the reference value. And, 1D entropy coding or 2D-FP entropy coding can be performed on the rest difference values.

Even if 2D-FP is performed within a corresponding data set, after pairs of indexes have been derived, 1D entropy coding should be performed on a parameter value within a last band 83*b* or 83*c* failing to configure a pair. Since two data sets configure a pair, 2D-TP entropy coding can be performed. In this case, 2D-TP entropy coding is sequentially performed on bands ranging from a next band excluding the first band 82*b* or 82*c* within the corresponding data set to a last band.

If the 2D-TP entropy coding is performed, a last band failing to configure a pair is not generated.

Once the entropy coding scheme per data is decided, a codeword is generated using a corresponding entropy table.

For instance, in case that both of the two data sets configuring the pair are DIFF-DT (i.e., DIFF-DT/DT) (89), since a reference value does not exist within a corresponding data set, first band processing is not performed. And, 1D entropy coding or 2D-Fp entropy coding can be performed on all the difference values within each of the data sets.

Even if 2D-FP is performed within a corresponding data set, after pairs of indexes have been derived, 1D entropy coding should be performed on a parameter value within a last band failing to configure a pair. Yet, FIG. 21 shows an example that a last band failing to configure a pair does not exist.

Since two data sets configure a pair, 2D-TP entropy coding is executable. In this case, 2D-TP entropy coding is sequentially performed on bands ranging from a first band to a last band within the corresponding data set.

If the 2D-TP entropy coding is performed, a last band failing to configure a pair is not generated.

Once the entropy coding scheme per data is decided, a codeword is generated using a corresponding entropy table.

For instance, there may exist a case that two data sets configuring a pair have different coding directions, respectively (i.e., DIFF-DF/DT or DIFF-DT/DF) (88). FIG. 21 shows an example of DIFF-DF/DT. In this case, all entropy coding schemes applicable according to corresponding coding types can be basically performed on each o the data sets.

For instance, in a data set of DIFF-DF among two data sets configuring a pair, 1D entropy coding is performed on a parameter value within a first band 82d with a reference value within the corresponding data set (DIFF-DF). And, 1D entropy coding or 2D-FP entropy coding can be performed on the rest difference values.

Even if 2D-FP is performed within a corresponding data set (DIFF-DF), after pairs of indexes have been derived, 1D entropy coding should be performed on a parameter value within a last band 83d failing to configure a pair.

For instance, in a data set of DIFF-DT among two data sets configuring a pair, since a reference value does not exist, first band processing is not performed. And, 1D entropy coding or 2D-FP entropy coding can be performed on all difference values within the corresponding data set (DIFF-DT).

Even if 2D-FP is performed within a corresponding data set (DIFF-DT), after pairs of indexes have been derived, 1D entropy coding should be performed on a parameter value within a last band failing to configure a pair. Yet, FIG. 21 shows an example that a last band failing to configure a pair does not exist.

Since the two data sets configuring the pair have the coding directions different from each other, respectively, 2D-TP entropy coding is executable. In this case, 2D-TP entropy coding is sequentially performed on bands ranging from a next band excluding a first band including the first band 82d to a last band.

If the 2D-TP entropy coding is performed, a last band failing to configure a pair is not generated.

Once the entropy coding scheme per data is decided, a codeword is generated using a corresponding entropy table.

2-3. Entropy Coding and Grouping

As mentioned in the foregoing description, in case of 2D-FP or 2D-TP entropy coding, two indexes are extracted using one codeword. So, this means that a grouping scheme is performed for entropy coding. And, this can be named 'time grouping' or 'frequency grouping'.

For instance, an encoding part groups two indexes extracted in a data coding step in frequency or time direction.

Subsequently, the encoding part selects one codeword representing the two grouped indexes using an entropy table and then transfers the selected codeword by having it included in a bitstream.

A decoding part receives one codeword resulting from grouping the two indexes included in the bitstream and the extracts two index values using the applied entropy table.

2-4. Signal Processing Method by Relation between Data Coding and Entropy Coding The features of the signal processing method according to the present invention by the relation between PBC coding and entropy coding and the relation between DIFF coding and entropy coding are explained as follows.

A method of processing a signal according to one embodiment of the present invention includes the steps of obtaining difference information, entropy-decoding the difference information according to an entropy coding scheme including time grouping and frequency grouping, and data-decoding the difference information according to a data decoding scheme including a pilot difference, a time difference and a frequency difference. And, detailed relations between data coding and entropy coding are the same as explained in the foregoing description.

A method of processing a signal according to another embodiment of the present invention includes the steps of obtaining a digital signal, entropy-decoding the digital signal according to an entropy coding scheme, and data-decoding the entropy-decoded digital signal according to one of a plurality of data coding schemes including a pilot coding scheme at least. In this case, the entropy coding scheme can be decided according to the data coding scheme.

An apparatus for processing a signal according to another embodiment of the present invention includes a signal obtaining part obtaining a digital signal, an entropy decoding part entropy-decoding the digital signal according to an entropy coding scheme, and a data decoding part data-decoding the entropy-decoded digital signal according to one of a plurality of data coding schemes including a pilot coding scheme at least.

A method of processing a signal according to a further embodiment of the present invention includes the steps of data-encoding a digital signal by a data coding scheme, entropy-encoding the data-encoded digital signal by an entropy coding scheme, and transferring the entropy-encoded digital signal. In this case, the entropy coding scheme can be decided according to the data coding scheme.

And, an apparatus for processing a signal according to a further embodiment of the present invention includes a data encoding part data-encoding a digital signal by a data coding scheme and an entropy encoding part entropy-encoding the data-encoded digital signal by an entropy coding scheme. And, the apparatus may further include an outputting part transferring the entropy-encoded digital signal.

3. Selection for Entropy Table

An entropy table for entropy coding is automatically decided according to a data coding scheme and a type of data becoming an entropy coding target.

For instance, if a data type is a CLD parameter and if an entropy coding target is a pilot reference value, 1D entropy table to which a table name 'hcodPilot_CLD' is given is used for entropy coding.

For instance, if a data type is a CPC parameter, if data coding is DIFF-DF, and if an entropy coding target is a first band value, 1D entropy table to which a table name 'hcod-Firstband_CPC' is given is used for entropy coding.

For instance, if a data type is an ICC parameter, if a data coding scheme is PBC, and if entropy coding is performed by 2D-TP, 2D-PC/TP entropy table to which a table name 'hcod2D_ICC_PC_TP_LL' is given is used for entropy coding. In this case, 'LL' within the 2D table name indicates a largest absolute value (hereinafter abbreviated 'LAV') within the table. And, the largest absolute value (LAV) will be explained later.

For instance, if a data type is an ICC parameter, if a data coding scheme is DIF-DF, and if entropy coding is performed by 2D-FP, 2D-FP entropy table to which a table name 'hcod2D_ICC_DF_FP_LL' is given is used for entropy coding.

Namely, it is very important to decide to perform entropy coding using which one of a plurality of entropy tables. And, it is preferable that an entropy table suitable for a characteristic of each data becoming each entropy target is configured independent.

Yet, entropy tables for data having attributes similar to each other can be shared to use. For representative example, if a data type is 'ADG' or 'ATD', it is able to apply the CLD entropy table. And, a 'first band' entropy table can be applied to a pilot reference value of PBC coding.

A method of selecting an entropy table using the largest absolute value (LAV) is explained in detail as follows.

3-1. Largest Absolute Vale (LAV) of Entropy Table

Figure 22:
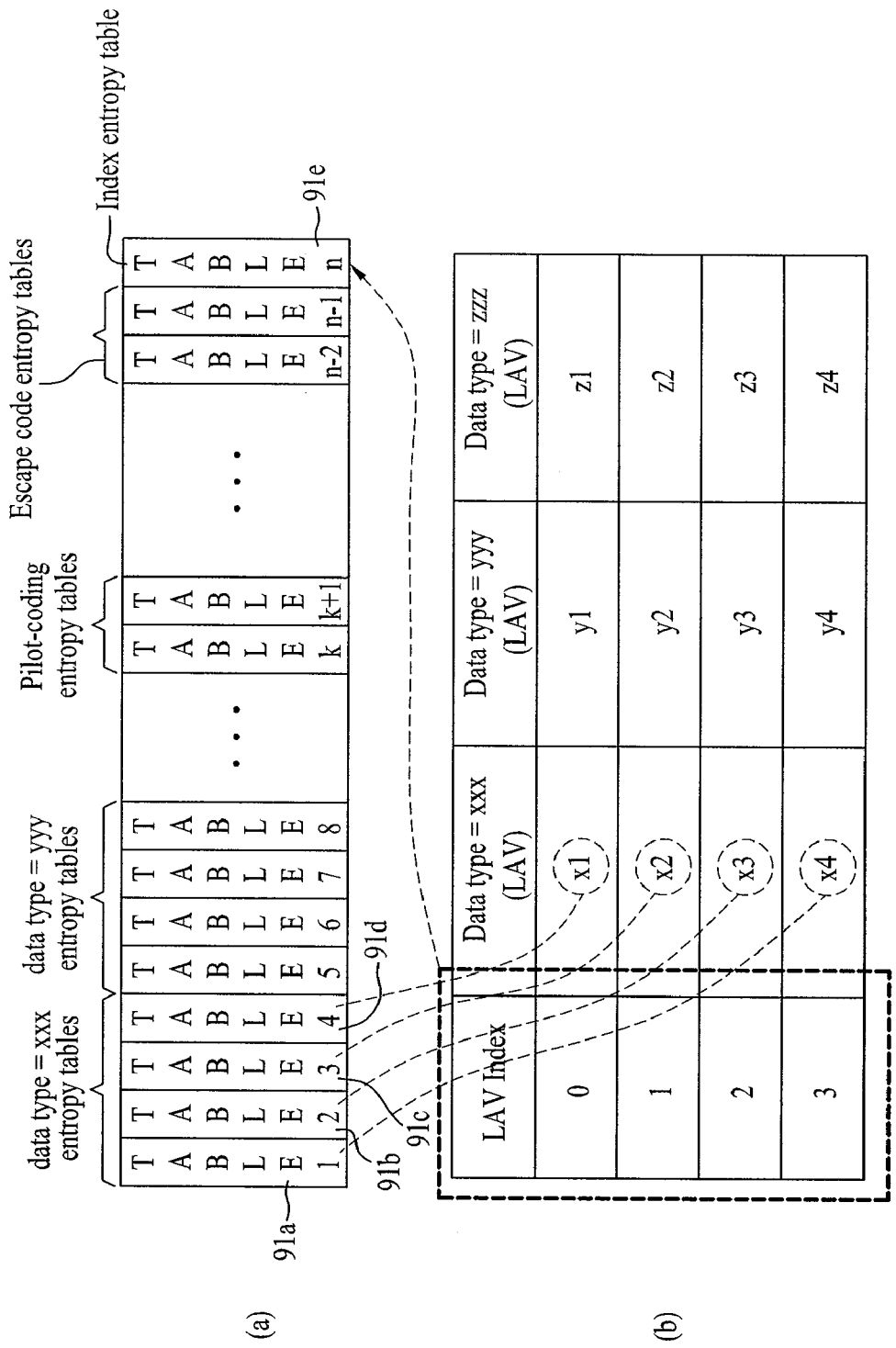
FIG. 22 is a diagram to explain a method of selecting an entropy table according to the present invention.

FIG. 22 is a diagram to explain a method of selecting an entropy table according to the present invention.

A plurality of entropy tables are shown in (a) of FIG. 22, and a table to select the entropy tables is shown in (b) of FIG. 22.

As mentioned in the foregoing description, there exist a plurality of entropy tables according to data coding and data types.

For instance, the entropy tables may include entropy tables (e.g., tables 1 to 4) applicable in case that a data type is 'xxx', entropy tables (e.g., tables 5 to 8) applicable in case that a data type is 'yyy', PBC dedicated entropy tables (e.g., tables k to k+1), escape entropy tables (e.g., tables n-2~n-1), and an LAV index entropy table (e.g., table n).

In particular, although it is preferable that a table is configured by giving a codeword to each index that can occur in corresponding data, if so, a size of the table considerably increases. And, it is inconvenient to manage indexes that are unnecessary or barely occur. In case of a 2D entropy table, those problems bring more inconvenience due to too many occurrences. To solve those problems, the largest absolute value (LAV) is used.

For instance, if a range of an index value for a specific data type (e.g., CLD) is between '-X~+X' (X=15), at least one LAV having high frequency of occurrence in probability is selected within the range and is configured into a separate table.

For instance, in configuring a CLD entropy table, it is able to provide a table of 'LAV=3', a table of 'LAV=5', a table of 'LAV=7' or a table of 'LAV=9'.

For instance, in (a) of FIG. 22, it is able to set the table-1 91a to the CLD table of 'LAV=3', the table-2 91b to the CLD table of 'LAV=5', the table-3 91c to the CLD table of 'LAV=7', and the table-4 91d to the CLD table of 'LAV=9'.

Indexes deviating from the LAV range within the LAV table are handled by escape entropy tables (e.g., tables n-2~n-1).

For instance, in performing coding using the CLD table 91c of 'LAV=7', if an index deviating from a maximum value '7' occurs (e.g., 8, 9, . . . , 15), the corresponding index is separately handled by the escape entropy table (e.g., tables n-2~n-1).

Likewise, it is able to set the LAV table for another data type (e.g., ICC, CPC, etc.) in the same manner of the CLD table. Yet, LAV for each data has a different value because a range per data type varies.

For instance, in configuring an ICC entropy table, for example, it is able to provide a table of 'LAV=1', a table of 'LAV=3', a table of 'LAV=5', and a table of 'LAV=7'. In configuring a CPC entropy table, for example, it is able to provide a table of 'LAV=3', a table of 'LAV=6', a table of 'LAV=9', and a table of 'LAV=12'.

3-2. Entropy Table for LAV Index

The present invention employs an LAV index to select an entropy table using LAV. Namely, LAV value per data type, as shown in (b) of FIG. 22, is discriminated by LAV index.

In particular, to select an entropy table to be finally used, LAV index per a corresponding data type is confirmed and LAV corresponding to the LAV index is then confirmed. The finally confirmed LAV value corresponds to 'LL' in the configuration of the aforesaid entropy table name.

For instance, if a data type is a CLD parameter, if a data coding scheme is DIFF-DF, if entropy coding is performed by 2D-FP, and if 'LAV=3', an entropy table to which a table name 'hcod2D_CLD_DF_FP_03' is used for entropy coding.

In confirming the per data type LAV index, the present invention is characterized in using an entropy table for LAV index separately. This means that LAV index itself is handled as a target of entropy coding.

For instance, the table-n in (a) of FIG. 22 is used as an LAV index entropy table 91e. This is represented as Table 1.

TABLE 1

| LavIdx | Bit length | Codeword [hexadecimal/binary] |
|---|---|---|
| 0 | 1 | 0x0 (0b) |
| 1 | 2 | 0x2 (10b) |
| 2 | 3 | 0x6 (110b) |
| 3 | 3 | 0x7 (111b) |

This table means that LAV index value itself statistically differs in frequency of use.

For instance, since 'LAV Index=0' has highest frequency of use, one bit is allocated to it. And, two bits are allocated to 'LAV Index=1' having second highest frequency of use. Finally, three bits are allocated to 'LAV=2 or 3' having low frequency of use.

In case that the LAV Index entropy table 91e is not used, 2-bit identification information should be transferred to discriminate four kinds of LAV Indexes each time an LAV entropy table is used.

Yet, if the LAV Index entropy table 91e of the present invention is used, it is enough to transfer 1-bit codeword for a case of 'LAV Index=0' having at least 60% frequency of use for example. So, the present invention is able to raise transmission efficiency higher than that of the related art method.

In this case, the LAV Index entropy table 91e in Table 1 is applied to a case of four kinds of LAV Indexes. And, it is apparent that transmission efficiency can be more enhanced if there are more LAV Indexes.

3-3. Signal Processing Method Using Entropy Table Selection

A signal processing method and apparatus using the aforesaid entropy table selection are explained as follows.

A method of processing a signal according to one embodiment of the present invention includes the steps of obtaining index information, entropy-decoding the index information, and identifying a content corresponding to the entropy-decoded index information.

In this case, the index information is information for indexes having characteristics of frequency of use with probability.

As mentioned in the foregoing description, the index information is entropy-decoded using the index dedicated entropy table 91e.

The content is classified according to a data type and is used for data decoding. And, the content may become grouping information.

The grouping information is information for grouping of a plurality of data.

And, an index of the entropy table is a largest absolute value (LAV) among indexes included in the entropy table.

Moreover, the entropy table is used in performing 2D entropy decoding on parameters.

An apparatus for processing a signal according to one embodiment of the present invention includes an information obtaining part obtaining index information, a decoding part entropy-decoding the index information, and an identifying part identifying a content corresponding to the entropy-decoded index information.

A method of processing a signal according to another embodiment of the present invention includes the steps of generating index information to identify a content, entropy-encoding the index information, and transferring the entropy-encoded index information.

An apparatus for processing a signal according to another embodiment of the present invention includes an information generating part generating index information to identify a content, an encoding part entropy-encoding the index information, and an information outputting part transferring the entropy-encoded index information.

A method of processing a signal according to another embodiment of the present invention includes the steps of obtaining a difference value and index information, entropy-decoding the index information, identifying an entropy table corresponding to the entropy-decoded index information, and entropy-decoding the difference value using the identified entropy table.

Subsequently, a reference value corresponding to a plurality of data and the decoded difference value are used to obtain the data. In this case, the reference value may include a pilot reference value or a difference reference value.

The index information is entropy-decoded using an index dedicated entropy table. And, the entropy table is classified according to a type of each of a plurality of the data.

The data are parameters, and the method further includes the step of reconstructing an audio signal using the parameters.

In case of entropy-decoding the difference value, 2D entropy decoding is performed on the difference value using the entropy table.

Moreover, the method further includes the steps of obtaining the reference value and entropy-decoding the reference value using the entropy table dedicated to the reference value.

An apparatus for processing a signal according to another embodiment of the present invention includes an inputting part obtaining a difference value and index information, an index decoding part entropy-decoding the index information, a table identifying part identifying an entropy table corresponding to the entropy-decoded index information, and a data decoding part entropy-decoding the difference value using the identified entropy table.

The apparatus further includes a data obtaining part obtaining data using a reference value corresponding to a plurality of data and the decoded difference value.

A method of processing a signal according to a further embodiment of the present invention includes the steps of generating a difference value using a reference value corresponding to a plurality of data and the data, entropy-encoding the difference value using an entropy table, and generating index information to identify the entropy table.

And, the method further includes the steps of entropy-encoding the index information and transferring the entropy-encoded index information and the difference value.

And, an apparatus for processing a signal according to a further embodiment of the present invention includes a value generating part generating a difference value using a reference value corresponding to a plurality of data and the data, a value encoding part entropy-encoding the difference value using an entropy table, an information generating part generating index information to identify the entropy table, and an index encoding part entropy-encoding the index information.

And, the apparatus further includes an information outputting part transferring the entropy-encoded index information and the difference value.

Data Structure

A data structure including various kinds of information associated with the aforesaid data coding, grouping and entropy coding according to the present invention is explained as follows.

Figure 23:
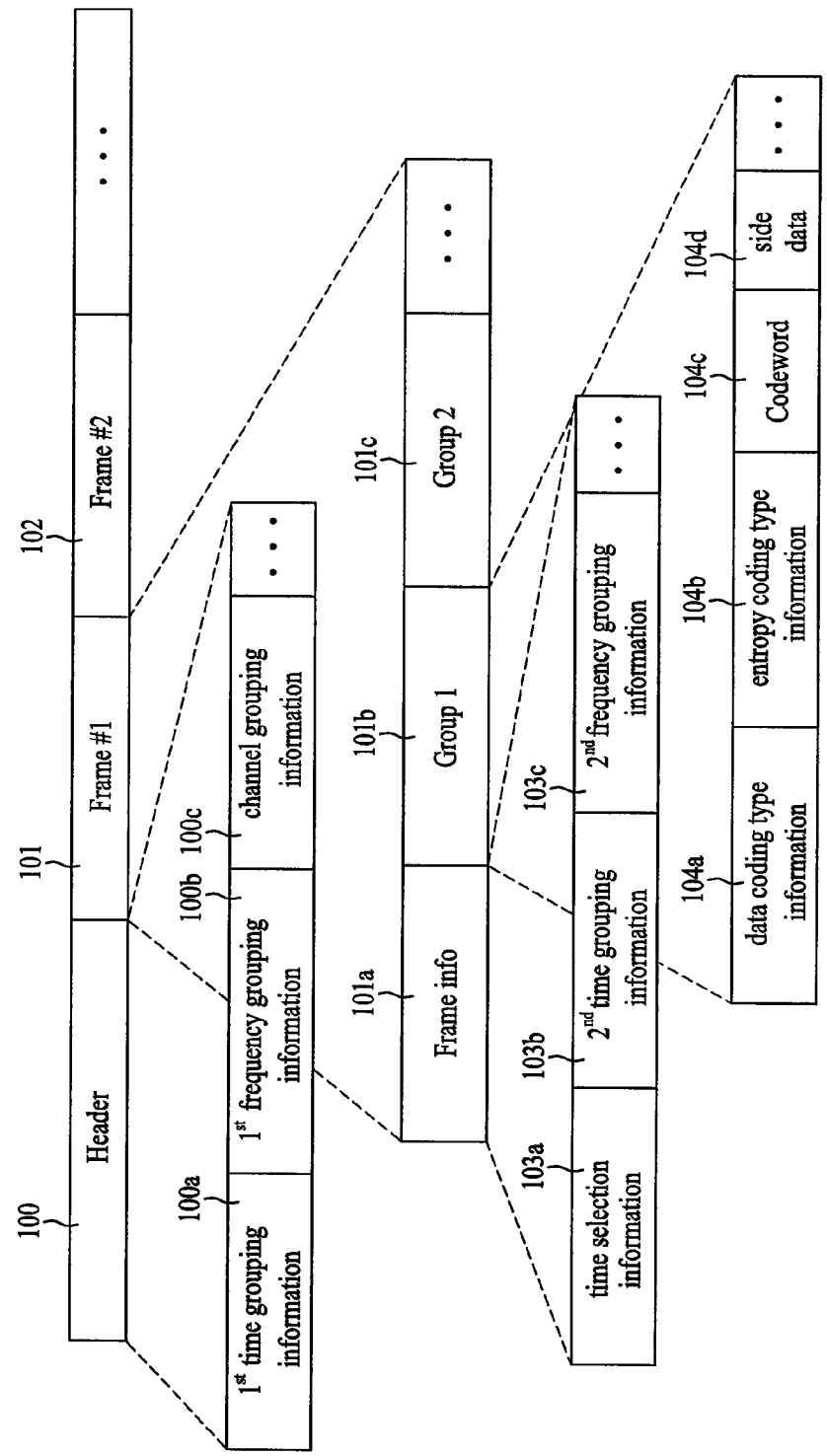
FIG. 23 is a hierarchical diagram of a data structure according to the present invention.

FIG. 23 is a hierarchical diagram of a data structure according to the present invention.

Referring to FIG. 23, a data structure according to the present invention includes a header 100 and a plurality off frames 101 and 102. Configuration information applied to the lower frames 101 and 102 in common is included in the header 100. And, the configuration information includes grouping information utilized for the aforesaid grouping.

For instance, the grouping information includes a first time grouping information 100a, a first frequency grouping information 100b and a channel grouping information 100c.

Besides, the configuration information within the header 100 is called 'main configuration information' and an information portion recorded in the frame is called 'payload'.

In particular, a case of applying the data structure of the present invention to audio spatial information is explained in the following description for example.

First of all, the first time grouping information 100a within the header 100 becomes 'bsFrameLength' field that designates a number of timeslots within a frame.

The first frequency grouping information 100b becomes 'bsFreqRes' field that designates a number of parameter bands within a frame.

The channel grouping information 100c means 'OttmodeLFE-bsOttBands' field and 'bsTttDualmode-bsTttBandsLow' field. The 'OttmodeLFE-bsOttBands' field is the information designating a number of parameter bands applied to LFE channel. And, the 'bsTttDualmode-bsTttBandsLow' field is the information designating a number of parameter bands of a low frequency band within a dual mode having both low and high frequency bands. Ye, the 'bsTttDualmode-bsTttBandsLow' field can be classified not as channel grouping information but as frequency grouping information.

Each of the frames 101 and 102 includes a frame information (Frame Info) 101a applied to all groups within a frame in common and a plurality of groups 101b and 101c.

The frame information 101a includes a time selection information 103a, a second time grouping information 103b and a second frequency grouping information 103c. Besides, the frame information 101a is called 'sub-configuration information' applied to each frame.

In detail, a case of applying the data structure of the present invention to audio spatial information is explained in the following description, for example.

The time selection information 103a within the frame information 101a includes 'bsNumParamset' field, 'bsParamslot' field and 'bsDataMode' filed.

The 'bsNumParamset' field is information indicating a number of parameter sets existing within an entire frame.

And, the 'bsParamslot' field is information designating a position of a timeslot where a parameter set exists.

Moreover, the 'bsDataMode' field is information designating an encoding and decoding processing method of each parameter set.

For instance, in case of 'bsDataMode=0' (e.g., default mode) of a specific parameter set, a decoding part replaces the corresponding parameter set by a default value.

In case of 'bsDataMode=1' (e.g., previous mode) of a specific parameter set, a decoding part maintains a decoding value of a previous parameter set.

In case of 'bsDataMode=2' (e.g., interpolation mode) of a specific parameter set, a decoding part calculates a corresponding parameter set by interpolation between parameter sets.

Finally, in case of 'bsDataMode=3' (e.g., read mode) of a specific parameter set, it means that coding data for a corresponding parameter set is transferred. So, a plurality of the groups 101b and 101c within a frame are groups configured with data transferred in case of 'bsDataMode=3' (e.g., read mode). Hence, the encoding part decodes data with reference to coding type information within each of the groups.

A signal processing method and apparatus using the 'bsDataMode' field according to one embodiment of the present invention are explained in detail as follows.

A method of processing a signal using the 'bsDataMode' field according to one embodiment of the present invention includes the steps of obtaining mode information, obtaining a pilot reference value corresponding to a plurality of data and a pilot difference value corresponding to the pilot reference value according to data attribute indicated by the mode information, and obtaining the data using the pilot reference value and the pilot difference value.

In this case, the data are parameters, and the method further includes the step of reconstructing an audio signal using the parameters.

If the mode information indicates a read mode, the pilot difference value is obtained.

The mode information further includes at least one of a default mode, a previous mode and an interpolation mode.

And, the pilot difference value is obtained per group band.

Moreover, the signal processing method uses a first parameter (e.g., dataset) to identify a number of the read modes and a second parameter (e.g., setidx) to obtain the pilot difference value based on the first variable.

An apparatus for processing a signal using the 'bsDataMode' field according to one embodiment of the present invention includes an information obtaining part obtaining mode information, a value obtaining part obtaining a pilot reference value corresponding to a plurality of data and a pilot difference value corresponding to the pilot reference value according to data attribute indicated by the mode information, and a data obtaining part obtaining the data using the pilot reference value and the pilot difference value.

And, the information obtaining part, the value obtaining part and the data obtaining part are provided within the aforesaid data decoding part 91 or 92.

A method of processing a signal using the 'bsDataMode' field according to another embodiment of the present invention includes the steps of generating mode information indicating attribute of data, generating a pilot difference value using a pilot reference value corresponding to a plurality of data and the data, and transferring the generated difference value. And, the method further includes the step of encoding the generated difference value.

An apparatus for processing a signal using the 'bsDataMode' field according to another embodiment of the present invention includes an information generating part generating mode information indicating attribute of data, a value generating part generating a pilot difference value using a pilot reference value corresponding to a plurality of data and the data, and an outputting part transferring the generated difference value. And, the value generating part is provided within the aforesaid data encoding part 31 or 32.

The second time grouping information 103b within the frame information 101a includes 'bsDatapair' field. The 'bsDatapair' field is information that designates a presence or non-presence of a pair between data sets designated by the 'bsDataMode=3'. In particular, two data sets are grouped into one group by the 'bsDatapair' field.

The second frequency grouping information within the frame information 101a includes 'bsFreqResStride' field. The 'bsFreqResStride' field is the information to second-group the first-grouped by the 'bsFreqRes' field as the first frequency grouping information 100b. Namely, a data band is generated by binding parameters amounting to a stride designated by the 'bsFreqResStride' field. So, parameter values are given per the data band.

Each of the groups 101b and 101c includes data coding type information 104a, entropy coding type information 104b, codeword 104c and side data 104d.

In detail, a case of applying the data structure of the present invention to audio spatial information is explained as follows, for example.

First of all, the data coding type information 104a within each of the groups 101b and 101c includes 'bsPCMCoding' field, 'bsPilotCoding' field, 'bsDiffType' field and 'bdDiffTimeDirection' field.

The 'bsPCMCoding' field is information to identify whether data coding of the corresponding group is PCM scheme or DIFF scheme.

Only if the 'bsPCMCoding' field designates the PCM scheme, a presence or non-presence of the PBC scheme is designated by the 'bsPilotCoding' field.

The 'bsDifftype' field is information to designate a coding direction in case that DIFF scheme is applied. And, the 'bsDiffType' field designates either 'DF: DIFF-FREQ' or 'DT: DIFF-TIME'.

And, the 'bsDiffTimeDirection' field is information to designate whether a coding direction on a time axis is 'FORWARD' or 'BACKWARD' in case that the 'bsDiffType' field is 'DT'.

The entropy coding type information 104b within each of the groups 101b and 101c includes 'bsCodingScheme' field and 'bsPairing' field.

The 'bsCodingScheme' field is the information to designate whether entropy coding is 1D or 2D.

And, the 'bsPairing' field is the information whether a direction for extracting two indexes is a frequency direction (FP: Frequency Pairing) or a time direction (TP: Time Pairing) in case that the 'bsCodingScheme' field designates '2D'.

The codeword 104c within each of the groups 101b and 101c includes 'bsCodeW' field. And, the 'bsCodeW' field designates a codeword on a table applied for entropy coding. So, most of the aforesaid data become targets of entropy coding. In this case, they are transferred by the 'bsCodeW' field. For instance, a pilot reference value and LAV Index value of PBC coding, which become targets of entropy coding, are transferred by the 'bsCodeW' field.

The side data 104d within each of the groups 101b and 101c includes 'bsLsb' field and 'bsSign' field. In particular, the side data 104d includes other data, which are entropy-coded not to be transferred by the 'bsCodeW' field, as well as the 'bsLsb' field and the 'bsSign' field.

The 'bsLsb' field is a field applied to the aforesaid partial parameter and is the side information transferred only if a data type is 'CPC' and in case of non-coarse quantization.

And, the 'bsSign' field is the information to designate a sign of an index extracted in case of applying 1D entropy coding.

Moreover, data transferred by PCM scheme are included in the side data 104*d*.

Features of the signal processing data structure according to the present invention are explained as follows.

First of all, a signal processing data structure according to the present invention includes a payload part having at least one of data coding information including pilot coding information at least per a frame and entropy coding information and a header part having main configuration information for the payload part.

The main configuration information includes a first time information part having time information for entire frames and a first frequency information part having frequency information for the entire frames.

And, the main configuration information further includes a first internal grouping information part having information for internal-grouping a random group including a plurality of data per frame.

The frame includes a first data part having at least one of the data coding information and the entropy coding information and a frame information part having sub-configuration information for the first data part.

The sub-configuration information includes a second time information part having time information for entire groups. And, the sub-configuration information further includes an external grouping information part having information for external grouping for a random group including a plurality of data per the group. Moreover, the sub-configuration information further includes a second internal grouping information part having information for internal-grouping the random group including a plurality of the data.

Finally, the group includes the data coding information having information for a data coding scheme, the entropy coding information having information for an entropy coding scheme, a reference value corresponding to a plurality of data, and a second data part having a difference value generated using the reference value and the data.

Application to Audio Coding (MPEG Surround)

An example of unifying the aforesaid concepts and features of the present invention is explained as follows.

Figure 24:
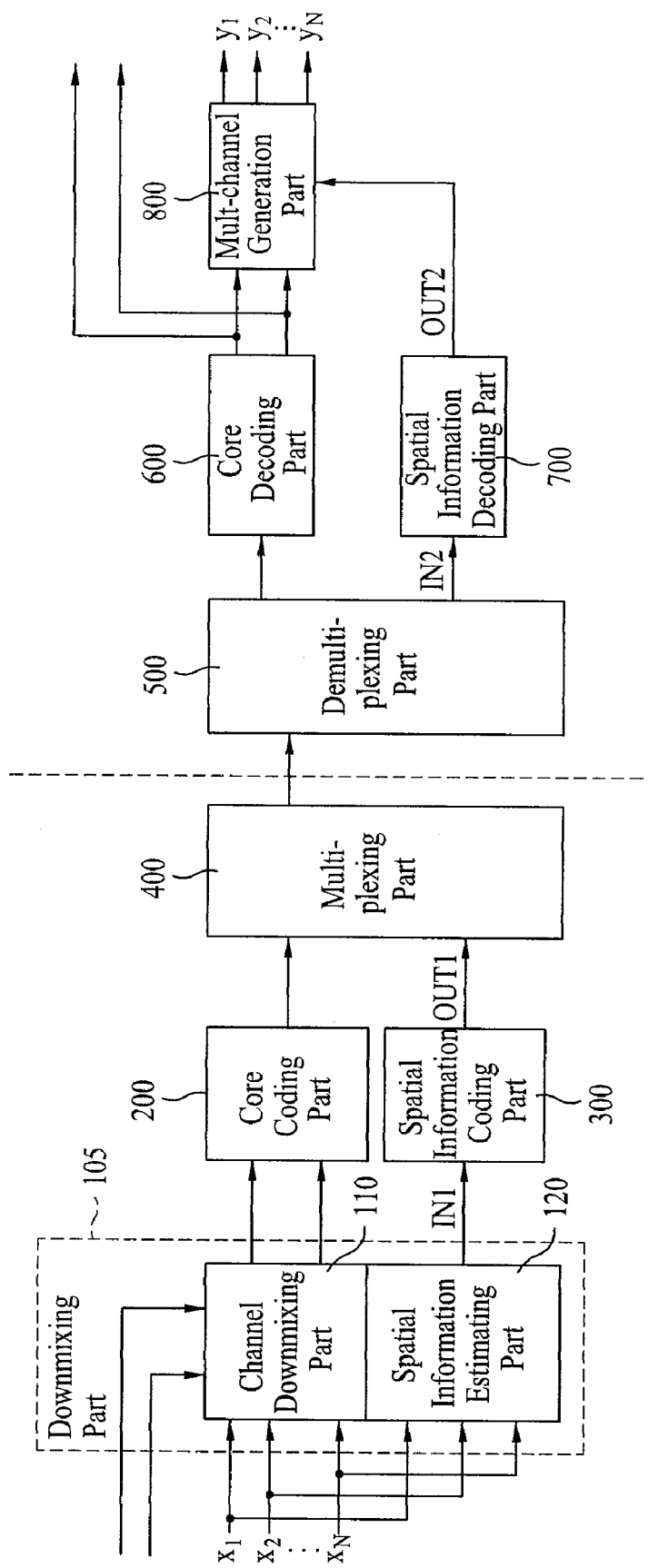
FIG. 24 is a block diagram of an apparatus for audio compression and recovery according to one embodiment of the present invention.

FIG. 24 is a block diagram of an apparatus for audio compression and recovery according to one embodiment of the present invention.

Referring to FIG. 24, an apparatus for audio compression and recovery according to one embodiment of the present invention includes an audio compression part 105~400 and an audio recovery part 500~800.

The audio compression part 105~400 includes a downmixing part 105, a core coding part 200, a spatial information coding part 300 and a multiplexing part 400.

And, the downmixing part 105 includes a channel downmixing part 110 and a spatial information generating part 120.

In the downmixing part 105, inputs of the channel downmixing part 110 are an audio signal of N multi-channels $X_1$, $X_2, \ldots, X_N$) and the audio signal.

The channel downmixing part 110 outputs a signal downmixed into channels of which number is smaller than that of channels of the inputs.

An output of the downmixing part 105 is downmixed into one or two channels, a specific number of channels according to a separate downmixing command, or a specific number of channels preset according to system implementation.

The core coding part 200 performs core coding on the output of the channel downmixing part 110, i.e., the downmixed audio signal. In this case, the core coding is carried out in a manner of compressing an input using various transform schemes such as a discrete transform scheme and the like.

The spatial information generating part 120 extracts spatial information from the multi-channel audio signal. The spatial information generating part 120 then transfers the extracted spatial information to the spatial information coding part 300.

The spatial information coding part 300 performs data coding and entropy coding on the inputted spatial information. The spatial information coding part 300 performs at least one of PCM, PBC and DIFF. In some cases, the spatial information coding part 300 further performs entropy coding. A decoding scheme by a spatial information decoding part 700 can be decided according to which data coding scheme is used by the spatial information coding part 300. And, the spatial information coding part 300 will be explained in detail with reference to FIG. 25 later.

An output of the core coding part 200 and an output of the spatial information coding part 300 are inputted to the multiplexing part 400.

The multiplexing part 400 multiplexes the two inputs into a bitstream and then transfers the bitstream to the audio recovery part 500 to 800.

The audio recovery part 500 to 800 includes a demultiplexing part 500, a core decoding part 600, a spatial information decoding part 700 and a multi-channel generating part 800.

The demultiplexing part 500 demultiplexes the received bitstream into an audio part and a spatial information part. In this case, the audio part is a compressed audio signal and the spatial information part is a compressed spatial information.

The core decoding part 600 receives the compressed audio signal from the demultiplexing part 500. The core decoding part 600 generates a downmixed audio signal by decoding the compressed audio signal.

The spatial information decoding part 700 receives the compressed spatial information from the demultiplexing part 500. The spatial information decoding part 700 generates the spatial information by decoding the compressed spatial information.

In doing so, identification information indicating various grouping information and coding information included in the data structure shown in FIG. 23 is extracted from the received bitstream. A specific decoding scheme is selected from at least one or more decoding schemes according to the identification information. And, the spatial information is generated by decoding the spatial information according to the selected decoding scheme. In this case, the decoding scheme by the spatial information decoding part 700 can be decided according to what data coding scheme is used by the spatial information coding part 300. And, the spatial information decoding part 700 is will be explained in detail with reference to FIG. 26 later.

The multi-channel generating part 800 receives an output of the core coding part 600 and an output of the spatial information decoding part 160. The multi-channel generating part 800 generates an audio signal of N multi-channels $Y_1$, $Y_2, \ldots, Y_N$ from the two received outputs.

Meanwhile, the audio compression part 105~400 provides an identifier indicating what data coding scheme is used by the spatial information coding part 300 to the audio recovery part 500~800. To prepare for the above-explained case, the audio recovery part 500~800 includes a means for parsing the identification information.

So, the spatial information decoding part 700 decides a decoding scheme with reference to the identification information provided by the audio compression part 105~400. Preferably, the means for parsing the identification information indicating the coding scheme is provided to the spatial information decoding part 700.

Figure 25:
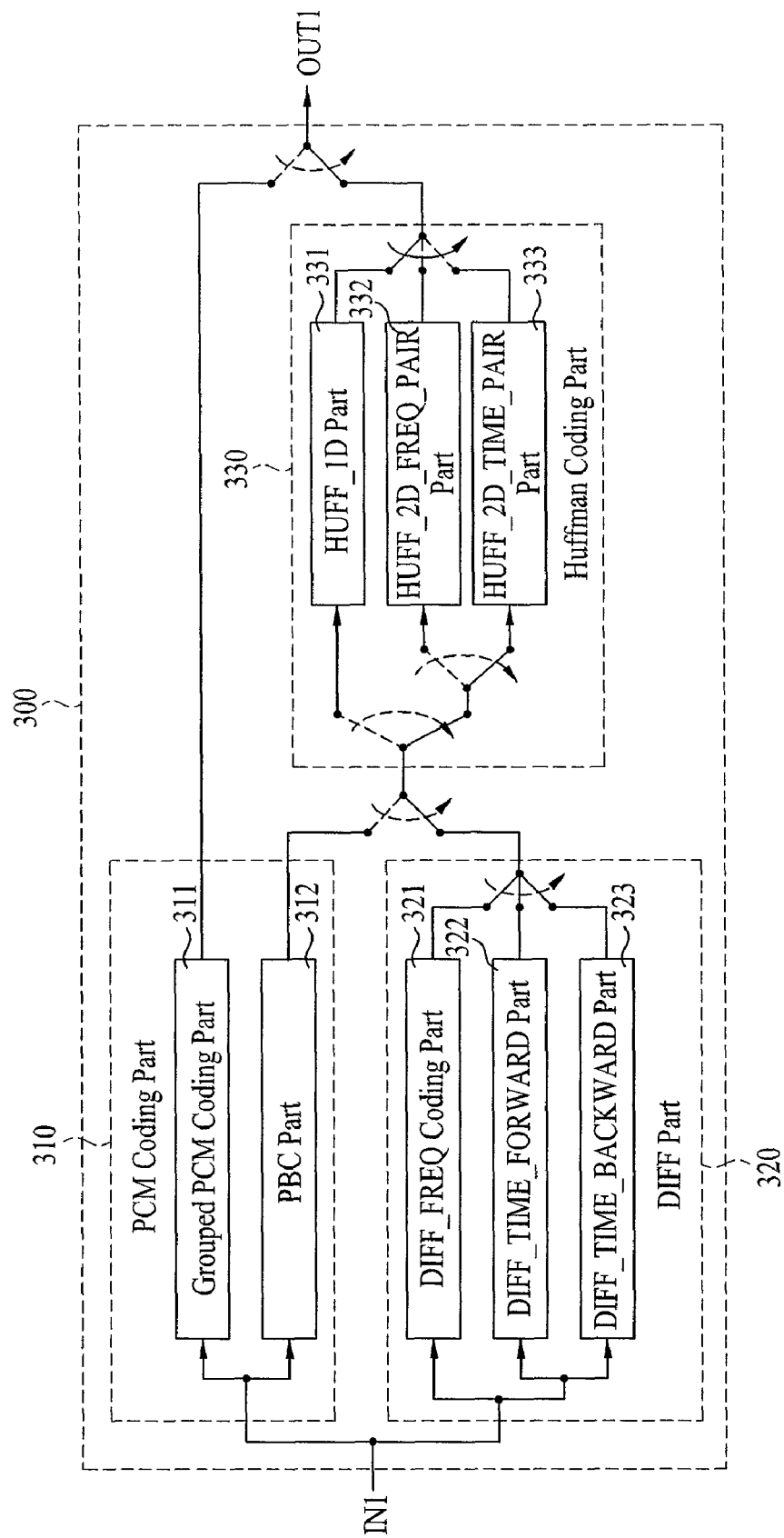
FIG. 25 is a detailed block diagram of a spatial information encoding part according to one embodiment of the present invention.

FIG. 25 is a detailed block diagram of a spatial information encoding part according to one embodiment of the present invention, in which spatial information is named a spatial parameter.

Referring to FIG. 25, a coding part according to one embodiment of the present invention includes a PCM coding part 310, a DIFF (differential coding) part 320 and a Huffman coding part 330. The Huffman coding part 330 corresponds to one embodiment of performing the aforesaid entropy coding.

The PCM coding part 310 includes a grouped PCM coding part 311 and a PCB part 312. The grouped PCM coding part 311 PCM-codes spatial parameters. In some cases, the grouped PCM coding part 311 is able to PCM-codes spatial parameters by a group part. And, the PBC part 312 performs the aforesaid PBC on spatial parameters.

The DIFF part 320 performs the aforesaid DIFF on spatial parameters.

In particular, in the present invention, one of the grouped PCM coding part 311, the PBC part 312 and the DIFF part 320 selectively operates for coding of spatial parameters. And, its control means is not separately shown in the drawing.

The PBC executed by the PBC part 312 has been explained in detail in the foregoing description, of which explanation will be omitted in the following description.

For another example of PBC, PBC is once performed on spatial parameters. And, the PBC can be further performed N-times (N>1) on a result of the first PBC. In particular, the PBC is at least once carried out on a pilot value or difference values as a result of performing the first PBC. In some cases, it is preferable that the PBC is carried out on the difference values only except the pilot value since the second PBC.

The DIFF part 320 includes a DIFF_FREQ coding part 321 performing DIFF_FREQ on a spatial parameter and DIFF_TIME coding parts 322 and 323 performing DIFF_TIME on spatial parameters.

In the DIFF part 320, one selected from the group consisting of the DIFF_FREQ coding part 321 and the DIFF_TIME coding parts 322 and 323 carries out the processing for an inputted spatial parameter.

In this case, the DIFF_TIME coding parts are classified into a DIFF_TIME_FORWARD part 322 performing DIFF_TIME_FORWARD on a spatial parameter and a DIFF_TIME_BACKWARD part 323 performing DIFF_TIME_BACKWARD on a spatial parameter.

In the DIFF_TIME coding parts 322 and 323, a selected one of the DIFF_TIME_FORWARD part 322 and the DIFF_TIME_BACKWARD 323 carries out a data coding process on an inputted spatial parameter. Besides, the DIFF coding performed by each of the internal elements 321, 322 and 323 of the DIFF part 320 has been explained in detail in the foregoing description, of which explanation will be omitted in the following description.

The Huffman coding part 330 performs Huffman coding on at least one of an output of the PBC part 312 and an output of the DIF part 320.

The Huffman coding part 330 includes a 1-dimension Huffman coding part (hereinafter abbreviated HUFF_1D part) 331 processing data to be coded and transmitted one by one and a 2-dimension Huffman coding part (hereinafter abbreviated HUFF_2D parts 332 and 333 processing data to be coded and transmitted by a unit of two combined data.

A selected one of the HUFF_1D part 331 and the HUFF_2D parts 332 and 333 in the Huffman coding part 330 performs a Huffman coding processing on an input.

In this case, the HUFF_2D parts 332 and 333 are classified into a frequency pair 2-Dimension Huffman coding part (hereinafter abbreviated HUFF_2D_FREQ_PAIR part) 332 performing Huffman coding on a data pair bound together based on a frequency and a time pair 2-Dimension Huffman coding part (hereinafter abbreviated HUFF_2D_TIME_PAIR part) 333 performing Huffman coding on a data pair bound together based on a time.

In the HUFF_2D parts 332 and 333, a selected one of the HUFF_2D_FREQ_PAIR part 332 and the HUFF_2D_TIME_PAIR part 333 performs a Huffman coding processing on an input.

Huffman coding performed by each of the internal elements 331, 332 and 333 of the Huffman coding part 330 will explained in detail in the following description.

Thereafter, an output of the Huffman coding part 330 is multiplexed with an output of the grouped PCM coding part 311 to be transferred.

In a spatial information coding part according to the present invention, various kinds of identification information generated from data coding and entropy coding are inserted into a transport bitstream. And, the transport bitstream is transferred to a spatial information decoding part shown in FIG. 26.

Figure 26:
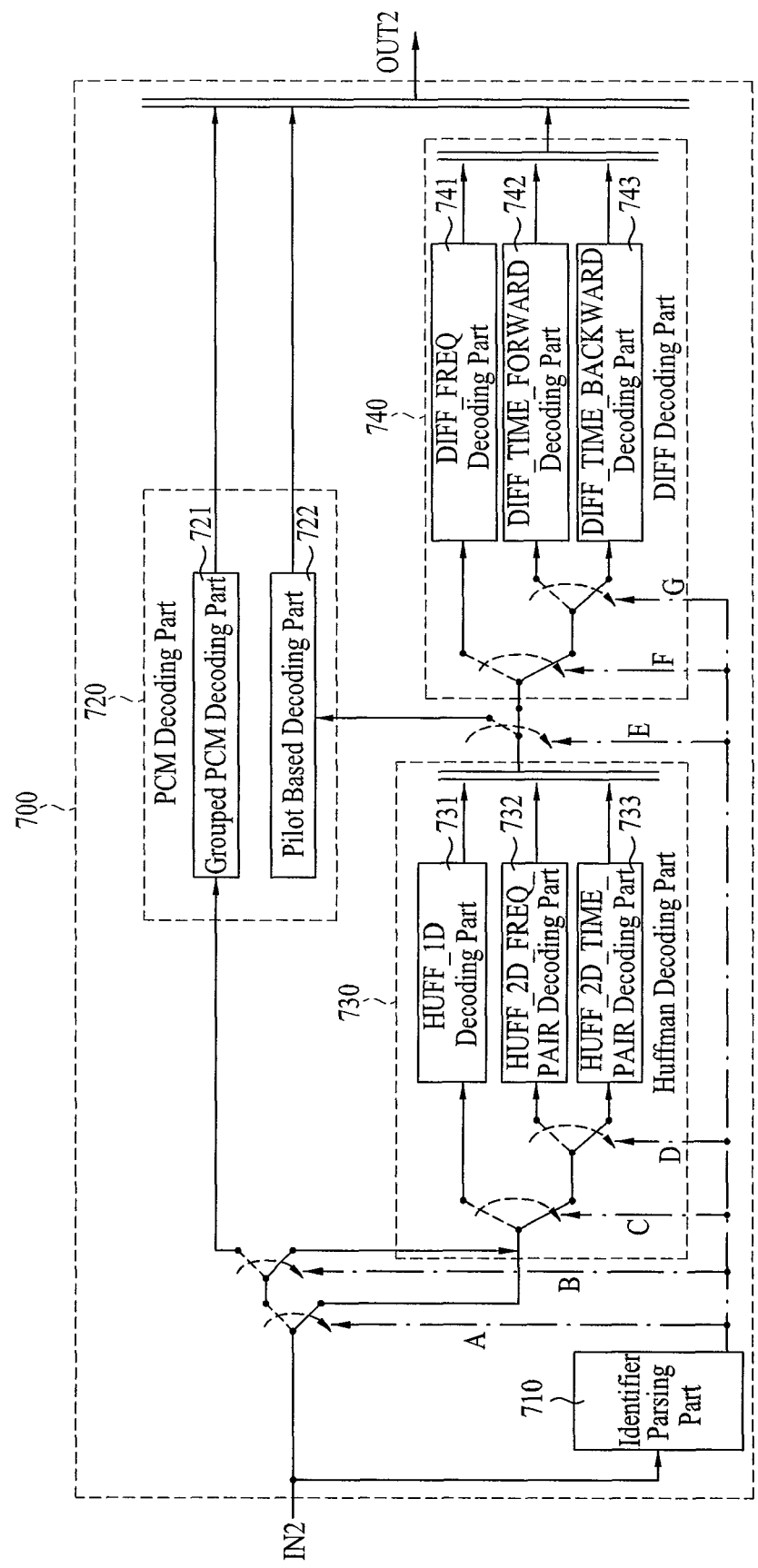
FIG. 26 is a detailed block diagram of a spatial information decoding part according to one embodiment of the present invention.

FIG. 26 is a detailed block diagram of a spatial information decoding part according to one embodiment of the present invention.

Referring to FIG. 26, a spatial information decoding part receives a transport bitstream including spatial information and then generates the spatial information by decoding the received transport bitstream.

A spatial information decoding part 700 includes an identifier extracting (flags parsing part) 710, a PCM decoding part 720, a Huffman decoding part 730 and a differential decoding part 740.

The identifier parsing part 710 of the spatial information decoding part extracts various identifiers from a transport bitstream and then parses the extracted identifiers. This means that various kinds of the informations mentioned in the foregoing description of FIG. 23 are extracted.

The spatial information decoding part is able to know what kind of coding scheme is used for a spatial parameter using an output of the identifier parsing part 710 and then decides a decoding scheme corresponding to the recognized coding scheme. Besides, the execution of the identifier parsing part 710 can be performed by the aforesaid demultiplexing part 500 as well.

The PCM decoding part 720 includes a grouped PCM decoding part 721 and a pilot based decoding part 722.

The grouped PCM decoding part 721 generates spatial parameters by performing PCM decoding on a transport bitstream. In some cases, the grouped PCM decoding part 721 generates spatial parameters of a group part by decoding a transport bitstream.

The pilot based decoding part 722 generates spatial parameter values by performing pilot based decoding on an output of the Huffman decoding part 730. This corresponds to a case that a pilot value is included in an output of the Huffman decoding part 730. For separate example, the pilot based decoding part 722 is able to include a pilot extracting part (not shown in the drawing) to directly extract a pilot value from a transport bitstream. So, spatial parameter values are generated using the pilot value extracted by the pilot extracting part and difference values that are the outputs of the Huffman decoding part 730.

The Huffman decoding part 730 performs Huffman decoding on a transport bitstream. The Huffman decoding part 730 includes a 1-Dimension Huffman decoding part (hereinafter abbreviated HUFF_1D decoding part) 731 outputting a data value one by one by performing 1-Dimension Huffman decoding on a transport bitstream and 2-Dimension Huffman decoding parts (hereinafter abbreviated HUFF_2D decoding parts) 732 and 733 outputting a pair of data values each by performing 2-Dimension Huffman decoding on a transport bitstream.

The identifier parsing part 710 extracts an identifier (e.g., 'bsCodingScheme') indicating whether a Huffman decoding scheme indicates HUFF_1D or HUFF_2D from a transport bitstream and then recognizes the used Huffman coding scheme by parsing the extracted identifier. So, either HUFF_1D or HUFF_2D decoding corresponding to each case is decided as a Huffman decoding scheme.

The HUFF_1D decoding part 731 performs HUFF_1D decoding and each of the HUFF_2D decoding parts 732 and 733 performs HUF_2D decoding.

In case that the Huffman coding scheme is HUFF_2D in a transport bit stream, the identifier parsing part 710 further extracts an identifier (e.g., 'bsParsing') indicating whether the HUFF_2D scheme is HUFF_2D_FREQ_PAIR or HUFF_2D_TIME_PAIR and then parses the extracted identifier. So, the identifier parsing part 710 is able to recognize whether two data configuring one pair are bound together based on frequency or time. And, one of frequency pair 2-Dimension Huffman decoding (hereinafter abbreviated HUFF_2D_FREQ_PAIR decoding) and time pair 2-Dimension Huffman decoding (hereinafter abbreviated HUFF_2D_TIME_PAIR decoding) corresponding to the respective cases is decided as the Huffman decoding scheme.

In the HUFF_2D decoding parts 732 and 733, the HUFF_2D_FREQ_PAIR part 732 performs HUFF_2D_FREQ_PAIR decoding and the HUFF_2D_TIME_PAIR part 733 performs HUFF_2D_FREQ_TIME decoding.

An output of the Huffman decoding part 730 is transferred to the pilot based decoding part 722 or the differential decoding part 740 based on an output of the identifier parsing part 710.

The differential decoding part 740 generates spatial parameter values by performing differential decoding on an output of the Huffman decoding part 730.

The identifier parsing part 710 extracts an identifier (e.g., 'bsDiffType') indicating whether a DIFF scheme is DIF_FREQ or DIF_TIME from a transport bit stream from a transport bitstream and then recognizes the used DIFF scheme by parsing the extracted identifier. So, one of the DIFF_FREQ decoding and DIFF_TIME decoding corresponding to the respective cases is decided as a differential decoding scheme.

The DIFF_FREQ decoding part 741 performs DIFF_FREQ decoding and each of the DIFF_TIME decoding parts 742 and 743 performs DIF_TIME decoding.

In case that the DIFF scheme is DIFF_TIME, the identifier parsing part 710 further extracts an identifier (e.g., 'bsDiffTimeDirection') indicating whether the DIFF_TIME is DIFF_TIME_FORWARD or DIFF_TIME_BACKWARD from a transport bitstream and then parses the extracted identifier.

So, it is able to recognize whether an output of the Huffman decoding part 730 is a difference value between current data and former data or a difference value between the current data and next data. One of DIFF_TIME_FORWARD decoding and DIFF_TIME_BACKWARD decoding corresponding to the respective cases is decided as a DIFF_TIME scheme.

In the DIFF_TIME decoding parts 742 and 743, the DIFF_TIME_FORWARD part 742 performs DIFF_TIME_FORWARD decoding and the DIFF_TIME BACKWARD part 743 performs DIFF_TIME_BACKWARD decoding.

A procedure for deciding a Huffman decoding scheme and a data decoding scheme based on an output of the identifier parsing part 710 in the spatial information decoding part is explained as follows.

For instance, the identifier parsing part 710 reads a first identifier (e.g., 'bsPCMCoding') indicating which one of PCM and DIFF is used in coding a spatial parameter.

If the first identifier corresponds to a value indicating PCM, the identifier parsing part 710 further reads a second identifier (e.g., 'bsPilotCoding') indicating which one of PCM and PBC is used for coding of a spatial parameter.

If the second identifier corresponds to a value indicating PBC, the spatial information decoding part performs decoding corresponding to the PBC.

If the second identifier corresponds to a value indicating PCM, the spatial information decoding part performs decoding corresponding to the PCM.

On the other hand, if the first identifier corresponds to a value indicating DIFF, the spatial information decoding part performs a decoding processing that corresponds to the DIFF.

MODE FOR INVENTION

Accordingly, various embodiments of the present invention are explained together with the aforesaid embodiments of the best mode.

INDUSTRIAL APPLICABILITY

Accordingly, the grouping, data coding and entropy coding of the present invention are applicable to various fields and products.

And, the present invention is applicable to a medium that stores data to which at least one feature of the present invention is applied.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

What is claimed is:

1. A method for processing a signal using pilot based coding (PBC), the method comprising:

generating, by an audio coding apparatus, one or more pilot difference values using data elements and a pilot reference value;

entropy-encoding the pilot difference values using a particular entropy table among multiple entropy tables used for decoding the pilot difference values;

generating entropy table index identifying the particular entropy table;

obtaining a codeword corresponding to an entropy-encoded entropy table index by entropy-encoding the entropy table index, wherein variable bits are allocated to the codeword based on frequency for use; and transferring the codeword and the entropy-encoded pilot difference value, wherein:
the entropy table index comprises a largest absolute value (LAV) among multiple indexes included in the particular entropy table,
a quantity of the pilot difference values is equal to a quantity of the data elements,
the pilot reference value is a single value which applies to all of the data elements, and
each pilot difference value corresponds to each data element.

2. An apparatus for processing a signal using pilot based coding (PBC), the apparatus comprising:
a value generating part generating one or more difference values using a pilot reference value and data elements;
a encoding part entropy-encoding the pilot difference values using a particular entropy table among multiple entropy tables used for decoding the pilot difference values;
an information generating part generating entropy table index identifying the particular entropy table;
an index encoding part obtaining a codeword corresponding to an entropy-encoded entropy table index by entropy-encoding the entropy table index, wherein variable bits are allocated to the codeword based on frequency for use; and
an outputting part transferring the codeword and the entropy-encoded pilot difference values,
wherein:
the entropy table index comprises a largest absolute value (LAV) among multiple indexes included in the particular entropy table,
a quantity of the pilot difference values is equal to a quantity of the data elements,
the pilot reference value is a single value which applies to all of the data elements, and
each pilot difference value corresponds to each data element.

3. An apparatus for processing a signal using pilot based coding (PBC), the apparatus comprising:
an inputting part receiving one or more difference values and a codeword corresponding to an entropy-encoded entropy table index, wherein variable bits are allocated to the codeword based on frequency for use;
an index decoding part obtaining an entropy-decoded entropy table index by entropy-decoding the codeword;
a identifying part identifying, from among multiple table used for decoding the pilot difference values, a particular entropy table the entropy-decoded entropy table index;
a data decoding part entropy-decoding the pilot difference values using the particular entropy table; and
a obtaining part obtaining data elements using a pilot reference value and the decoded pilot difference values,
wherein:
the entropy-decoded entropy table index indicates at least one value which corresponds to a largest absolute value (LAV) among multiple indexes included in the particular entropy table,
a quantity of the pilot difference values is equal to a quantity of the data elements,
the pilot reference value is a single value which applies to all of the data elements, and
each pilot difference value corresponds to each data element.

4. The apparatus of claim 3, wherein the entropy-encoded entropy table index is entropy-decoded using an entropy table which is reserved exclusively for entropy table indexes.

5. The apparatus of claim 3, wherein the particular entropy table is classified according to data type.

6. The apparatus of claim 3, wherein the data elements are parameters and the apparatus further comprises a plural-channel generation part reconstructing audio signal using the parameters.

7. The apparatus of claim 3, wherein the particular entropy table is used to perform two-dimensional entropy decoding of a parameter.

8. The apparatus of claim 3,
wherein the inputting part receives the pilot reference value, and
wherein the data decoding part entropy-decodes the pilot reference value using an entropy table which is reserved exclusively for pilot reference values.

9. A method for processing a signal using pilot based coding (PBC), the method comprising:
receiving, by an audio coding apparatus, one or more pilot difference values and a codeword corresponding to an entropy-encoded entropy table index, wherein variable bits are allocated to the codeword based on frequency for use;
obtaining an entropy-decoded entropy table index by entropy-decoding the codeword;
identifying, from among multiple entropy tables used for decoding the pilot difference values, a particular entropy table using the entropy-decoded entropy table index;
entropy-decoding the pilot difference values using the particular entropy table; and
obtaining data elements using a pilot reference value and the decoded pilot difference values,
wherein:
the entropy-decoded entropy table index indicates at least one value which corresponds to a largest absolute value (LAV) among multiple indexes included in the particular entropy table,
a quantity of the pilot difference values is equal to a quantity of the data elements,
the pilot reference value is a single value which applies to all of the data elements, and
each pilot difference value corresponds to each data element.

10. The method of claim 9, wherein the codeword is entropy-decoded using an entropy table which is reserved exclusively for entropy table indexes.

11. The method of claim 9, wherein the particular entropy table is classified according to data type.

12. The method of claim 9, wherein the data elements are parameters and the method further comprises reconstructing audio signal using the parameters.

13. The method of claim 9, wherein the particular entropy table is used to perform two-dimensional entropy decoding of a parameter.

14. The method of claim 9, further comprising:
receiving the pilot reference value; and,
entropy-decoding pilot reference value using an entropy table which is reserved exclusively for pilot reference values.

* * * * *